US007869296B2

(12) United States Patent
Fujioka et al.

(10) Patent No.: US 7,869,296 B2
(45) Date of Patent: *Jan. 11, 2011

(54) SEMICONDUCTOR MEMORY DEVICE, AND METHOD OF CONTROLLING THE SAME

(75) Inventors: Shinya Fujioka, Kawasaki (JP); Tomohiro Kawakubo, Kawasaki (JP); Koichi Nishimura, Kawasaki (JP); Kotoku Sato, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/515,852

(22) Filed: Sep. 6, 2006

(65) Prior Publication Data

US 2007/0002664 A1    Jan. 4, 2007

Related U.S. Application Data

(60) Division of application No. 11/189,858, filed on Jul. 27, 2005, which is a division of application No. 10/623,544, filed on Jul. 22, 2003, now Pat. No. 6,947,347, which is a division of application No. 10/365,456, filed on Feb. 13, 2003, now Pat. No. 6,868,026, which is a division of application No. 09/820,795, filed on Mar. 30, 2001, now Pat. No. 6,563,746, which is a continuation-in-part of application No. 09/675,198, filed on Sep. 29, 2000, now abandoned.

(30) Foreign Application Priority Data

| Nov. 9, 1999 | (JP) | ................................. 11-318458 |
| Aug. 9, 2000 | (JP) | ............................ 2000-241019 |
| Oct. 27, 2000 | (JP) | ............................ 2000-329493 |

(51) Int. Cl.
*G11C 7/00* (2006.01)
*G11C 5/14* (2006.01)

(52) U.S. Cl. ........................ 365/222; 365/226; 365/227; 365/228; 365/229; 365/203

(58) Field of Classification Search ................. 365/222, 365/226, 227, 228, 229, 185.04, 185.08, 365/185.33, 203; 438/257; 345/507; 327/108
See application file for complete search history.

(56) References Cited

U.S. PATENT DOCUMENTS 4,688,196 A    8/1987    Inagaki et al.

(Continued)

FOREIGN PATENT DOCUMENTS

| EP | 0 566 306 A2 | 10/1993 |
| JP | 11-213658 | 8/1999 |

OTHER PUBLICATIONS

Patent Abstracts of Japan, vol. 17, No. 819 (P-1644) & JP 05 189961 A (Nov. 15, 1993).

*Primary Examiner*—Trong Phan
(74) *Attorney, Agent, or Firm*—Arent Fox LLP

(57) ABSTRACT

An internal voltage generator when activated, generates an internal voltage to be supplied to an internal circuit. Operating the internal voltage generator consumes a predetermined amount of the power. In response to a control signal from the exterior, an entry circuit inactivates the internal voltage generator. When the internal voltage generator is inactivated, the internal voltage is not generated, thereby reducing the power consumption. By the control signal from the exterior, therefore, a chip can easily enter a low power consumption mode. The internal voltage generator is exemplified by a booster for generating the boost voltage of a word line connected with memory cells, a substrate voltage generator for generating a substrate voltage, or a precharging voltage generator for generating the precharging voltage of bit lines to be connected with the memory cells.

13 Claims, 35 Drawing Sheets

U.S. PATENT DOCUMENTS

| | | | |
|---|---|---|---|
| 4,979,143 A | 12/1990 | Takano et al. | |
| 5,197,026 A | 3/1993 | Butler | |
| 5,241,680 A | 8/1993 | Cole et al. | |
| 5,262,998 A | 11/1993 | Mnich et al. | |
| 5,365,487 A | 11/1994 | Patel et al. | |
| 5,461,338 A | 10/1995 | Hirayama et al. | |
| 5,465,367 A | 11/1995 | Reddy et al. | |
| 5,500,827 A | 3/1996 | Yazdy et al. | |
| 5,544,096 A | 8/1996 | Takasugi | |
| 5,557,777 A | 9/1996 | Culbert | |
| 5,561,384 A | 10/1996 | Reents et al. | |
| 5,570,005 A | 10/1996 | Hardee et al. | |
| 5,602,975 A | 2/1997 | Kataoka et al. | |
| 5,799,200 A | 8/1998 | Brant et al. | |
| 5,835,102 A * | 11/1998 | Monroe et al. | 345/545 |
| 5,875,143 A | 2/1999 | Ben-Zvi | |
| 5,881,006 A | 3/1999 | Yabe et al. | |
| 5,970,009 A | 10/1999 | Hoenigschmid et al. | |
| 5,986,959 A | 11/1999 | Itou | |
| 5,987,589 A | 11/1999 | Kawasaki et al. | |
| 6,025,707 A | 2/2000 | Joo | |
| 6,058,061 A | 5/2000 | Ooishi | |
| 6,134,167 A | 10/2000 | Atkinson | |
| 6,136,647 A * | 10/2000 | Sung | 438/257 |
| 6,150,860 A | 11/2000 | Chun | |
| 6,198,663 B1 | 3/2001 | Takizawa | |
| 6,205,079 B1 | 3/2001 | Namekawa | |
| 6,208,577 B1 | 3/2001 | Mullarkey | |
| 6,330,639 B1 | 12/2001 | Fanning et al. | |
| 6,370,073 B2 | 4/2002 | Leung | |
| 6,407,949 B1 | 6/2002 | Jha et al. | |
| 6,445,932 B1 | 9/2002 | Soini et al. | |
| 6,515,928 B2 | 2/2003 | Sato et al. | |
| 6,529,433 B2 | 3/2003 | Choi | |
| 6,556,477 B2 | 4/2003 | Hsu et al. | |
| 6,584,032 B2 | 6/2003 | Fujioka et al. | |
| 6,614,684 B1 | 9/2003 | Shukuri et al. | |
| 6,670,234 B2 | 12/2003 | Hsu et al. | |
| 6,795,362 B2 | 9/2004 | Nakai et al. | |
| 6,826,106 B2 | 11/2004 | Chen | |
| 7,020,040 B2 | 3/2006 | Lin | |
| 7,088,632 B2 | 8/2006 | Pelley | |
| 7,158,434 B2 | 1/2007 | Hokenmaier | |
| 7,184,351 B2 | 2/2007 | Ito et al. | |

* cited by examiner

SEMICONDUCTOR MEMORY DEVICE, AND METHOD OF CONTROLLING THE SAME

CROSS-REFERENCE TO RELATED APPLICATIONS

This is a Division of application Ser. No. 11/189,858 filed Jul. 27, 2005, which is a Division of application Ser. No. 10/623,544 filed Jul. 22, 2003, now U.S. Pat. No. 6,947,347, which is a Division of application Ser. No. 10/365,456, filed Feb. 13, 2003, now U.S. Pat. No. 6,868,026, which is a Division of application Ser. No. 09/820,795, filed Mar. 30, 2001, now U.S. Pat. No. 6,563,746 B2, which is a Continuation-in-Part of application Ser. No. 09/675,198 filed Sep. 29, 2000, now abandoned. The disclosure of the prior applications is hereby incorporated by reference herein in its entirety.

BACKGROUND OF THE INVENTION

1. Field of the Invention

The present invention relates to a semiconductor memory device having a low power consumption mode.

2. Description of the Related Art

In recent years, the cellular phone has been given not only a function to have a vocal communication but also a function to transmit character-string data or image data. Moreover, the cellular phone has been expected in the future to become a kind of information terminal (for example, a portable type personal computer) as the internet services are diversified. Thus, the information volume of data to be handled by the cellular phone has been drastically increasing. Conventionally, the cellular phone has employed as its work memory SRAMs having a memory capacity of about 4 Mbit. The work memory is a memory for retaining the necessary data during the operation of the cellular phone. It is obvious that the memory capacity of the work memory will be short in the future.

On the other hand, the transmission speed of the cellular phone has been heightening. The smaller the cellular phone becomes, the smaller the battery to be mounted becomes. Therefore, the work memory to be employed in the cellular phone is required to have a high speed, low power consumption and a large capacity. In the cellular phone serious price competitions, it is necessary to make the costs for parts as low as possible. Therefore, the work memory has to be at low price.

The conventional SRAMs as employed in the work memory are higher per bit in cost than DRAMs. The production number of SRAMs is smaller than that of the DRAMs so that it is difficult to lower its price. Moreover, there have never been developed SRAMs having a large memory capacity (for example, 64 Mbit).

In this situation, it has been considered to replace the SRAMs by flash memories and DRAMs in the work memory of the cellular phone.

The flash memory has a power consumption as low as several μW during a standby state but requires several μs to several tens μs for writing data. When the flash memory is employed as the work memory of the cellular phone, therefore, it is difficult to transmit/receive massive data at high speed. The flash memory performs the write operation at the unit of a sector so that it is not suitable for rewriting bit by bit image data such as the data of a moving image.

On the contrary, the DRAMs can execute both the read operation and the write operation within several tens ns and can process the data of the moving image easily. The power consumption during the standby state is higher than that of the flash memories. In the present DRAMs, the power consumption in the standby state is about 1 mW during a self-refresh mode for retaining written data and about 300 μW during a standby mode not required for retaining written data.

If the power consumption during the standby mode could be reduced to that of the flash memories, the DRAMs could be employed as the work memory of the cellular phone, but such circuit technology has never been proposed.

The power consumption of the DRAMs can be reduced to zero by stopping the power supply to the DRAMs. However, since the address terminals, the data terminals and the like of the DRAMs are connected with the terminals of other electronic parts through the wiring patterns on a circuit board, it is required to drastically change the system of the cellular phone (the pattern change of the circuit board, re-layout and so on) for the termination of the power supply to the DRAMs.

Besides, there has not been proposed a technology which realizes exit from the standby mode without the malfunction of an internal circuit after the power supply is terminated to stop the operation of the internal circuit during the standby mode.

Where the internal voltage to be used in the internal circuit is generated inside of the device, it has to be quickly returned to a predetermined voltage when a release is made from a standby mode (a low power consumption mode). However, this technique has never been proposed.

SUMMARY OF THE INVENTION

An object of the present invention is to enter the device into a low power consumption mode and exit the device from a low power consumption mode with reliability.

Another object of the present invention is to provide a semiconductor memory device capable of drastically reducing current consumption during standby mode as compared with the conventional devices and a method of controlling the semiconductor memory device.

Still another object of the present invention is to provide a semiconductor memory device capable of drastically reducing current consumption during a standby period as compared with the conventional devices and a method of controlling the semiconductor memory device.

Another object of the present invention is to easily enter a device into a low power consumption mode by a control signal from the exterior.

Another object of the present invention is to prevent the feedthrough current (or leak path) of an internal circuit during a low power consumption mode.

Still another object of the present invention is to easily enter the device into the low power consumption mode by employing an existing control signal.

Another object of the present invention is to easily enter the device into the low power consumption mode by a command input.

Another object of the present invention is to easily enter the device into the low power consumption mode by a dedicated control signal.

Another object of the invention is to quickly return from the low power consumption mode.

According to one aspect of the semiconductor memory device in the present invention, an internal voltage generator when activated, generates an internal voltage to be supplied to an internal circuit. When the internal voltage generator is operated, a predetermined amount of electric power is consumed. In response to a control signal from the exterior, an entry circuit inactivates the internal voltage generator. The internal voltage is not to be generated due to the inactivation of the internal voltage generator so that the power consumption may be reduced. In response to the control signal from the exterior, therefore, it is possible to easily enter the device into the low power consumption mode.

According to another aspect of the semiconductor memory device in the present invention, in response to the control signal from the exterior, the entry circuit stops the operation of a booster and the generation of a boost voltage to be supplied to a word line. During the low power consumption mode the booster steadily consuming the electric power stops so that the power consumption is drastically reduced.

According to another aspect of the semiconductor memory device in the present invention, in response to the control signal from the exterior, the entry circuit stops the operation of a substrate voltage generator to stop the generation of a substrate voltage to be supplied to a substrate. During the low power consumption mode, the substrate voltage generator steadily consuming the electric power stops so that the power consumption is drastically reduced.

According to another aspect of the semiconductor memory device in the present invention, in response to the control signal from the exterior, the entry circuit stops the operation of an internal supply voltage generator to stop the generation of an internal supply voltage to be supplied to a memory core. During the low power consumption mode, the internal supply voltage generator steadily consuming the electric power stops so that the power consumption is drastically reduced.

According to another aspect of the semiconductor memory device in the present invention, in response to the control signal from the exterior, the entry circuit stops the operation of a precharging voltage generator to stop the generation of a precharging voltage to be supplied to bit lines. During the low power consumption mode, the precharging voltage generator steadily consuming the electric power stops so that the power consumption is drastically reduced.

According to another aspect of the semiconductor memory device in the present invention, an external voltage supplying circuit supplies the power supply voltage as the internal voltage to the internal circuit during the low power consumption mode. When the internal voltage generating circuit is inactive, therefore, the power supply terminal of each internal circuit is supplied with a predetermined power supply voltage. As a result, each element of the internal circuit is fixed in a predetermined state to prevent a leak path. In other words, the flow of a feedthrough current is prevented.

According to another aspect of the semiconductor memory device in the present invention, a predetermined internal circuit is inactivated when a reset signal is supplied from the exterior. In response to this reset signal, the entry circuit enters the device into the low power consumption mode. During the resetting, the device need not be operated. Therefore, it can enter the low power consumption mode by utilizing the existing signal. The type and number of external terminals are identical to those of the conventional terminals so that adding the low power consumption mode does not lower the usability.

According to another aspect of the semiconductor memory device in the present invention, the entry circuit receives a plurality of control signals from the exterior. The entry circuit enters the device into the low power consumption mode when it recognizes the states of the control signals as low power consumption commands. Therefore, the device can enter the low power consumption mode by the command input.

According to another aspect of the semiconductor memory device in the present invention, the entry circuit receives a reset signal and a chip enable signal from the exterior. The entry circuit enters the device into the low power consumption mode when it recognizes the states of those control signals as low power consumption commands. Therefore, the device can enter the low power consumption mode by the command input.

According to another aspect of the semiconductor memory device in the present invention, when the reset signal is inactivated during a predetermined period and in this state the chip enable signal is activated during a predetermined period, the device enters the low power consumption mode. Even when a glitch occurs in the reset signal or the chip enable signal due to power supply noises or the like, it is able to prevent the device from erroneously entering the low power consumption mode.

According to another aspect of the semiconductor memory device in the present invention, the entry circuit receives a plurality of control signals from the exterior during the low power consumption mode. The entry circuit exits the device from the low power consumption mode when the levels of the control signals indicate exit of the low power consumption mode. Therefore, the device can be exited from the low power consumption mode by the command input.

The entry circuit enters the device into the low power consumption mode when it receives the predetermined level or the transition edge of a low power consumption mode signal. Therefore, the device can reliably enter the low power consumption mode by employing a dedicated signal.

According to another aspect of the semiconductor memory device in the present invention and controlling the semiconductor memory device, when the state of a control signal received during the low power consumption mode indicates exit of the low power consumption mode, the low power consumption mode is exited. This allows the device to be easily exited from the low power consumption mode by a control signal from the exterior. The exist from the low power consumption mode is, for example, executed by controlling the entry circuit.

According to another aspect of the semiconductor memory device in the present invention and controlling the semiconductor memory device, after the low power consumption mode is exited, a reset signal for initializing an internal circuit is activated during a period where the internal voltage is lower than a predetermined voltage. For instance, the reset signal is activated during a period where the internal voltage is lower than a reference voltage generated by stepping down the power supply voltage. Therefore, when the low power consumption mode shifts to a normal operating mode, the internal circuit can be reliably reset, which prevents malfunction of the internal circuit.

According to another aspect of the semiconductor memory device in the present invention, after the low power consumption mode is exited, a reset signal for initializing an internal circuit is activated during a period where a boost voltage internally generated is lower than a predetermined voltage. For example, the reset signal is activated during a period where the boost voltage is lower than the power supply voltage. In addition, the reset signal can be activated during a period where the boost voltage is lower than a reference voltage generated by stepping down the power supply voltage.

According to another aspect of the semiconductor memory device in the present invention, after the low power consumption mode is exited, a reset signal for initializing an internal circuit is activated during a period where at least one of the internal voltage and a boost voltage internally generated is/are lower than respective predetermined voltages. Therefore, when the low power consumption mode shifts to the normal operating mode, the internal circuit can be reliably reset, which prevents malfunction of the internal circuit.

According to another aspect of the semiconductor memory device in the present invention, at the time of the exit from the low power consumption mode, while a timer is measuring a predetermined length of time, a reset signal for initializing an internal circuit is activated. This allows reliable reset of the internal circuit, leading to preventing malfunction of the internal circuit when the low power consumption mode shifts to a normal operating mode.

According to another aspect of the semiconductor memory device in the present invention, a timer includes a CR time constant circuit. The timer measures the length of a time based on the propagation delay time of a signal propagated to the CR time constant circuit so that the activation period of a reset signal can be set by a simple circuit.

According to another aspect of the semiconductor memory device in the present invention, at the time of the exit from the low power consumption mode, a reset signal for initializing an internal circuit is activated while a counter operating in the normal operation counts a predetermined number. This allows reliable reset of the internal circuit, leading to preventing malfunction of the internal circuit when the low power consumption mode shifts to a normal operating mode. For example, a refresh counter for indicating the refresh address of memory cells or the like is employed as a counter.

According to another aspect of the semiconductor memory device and the method of controlling the semiconductor memory device in the present invention, a self-refresh control circuit automatically refreshes memory cells at a predetermined cycle. An internal voltage generator generates an internal voltage to be supplied to a predetermined internal circuit upon receipt of a power supply voltage from the exterior. The semiconductor memory device when receiving a control signal from the exterior, inactivates the self-refresh control circuit and lowers the supply capability of the internal voltage generator, thereby entering into a low power consumption mode. When the data of the memory cells need not be retained during the low power consumption mode, the operations of the self-refresh control circuit are unnecessary. Owing to not executing refresh, the internal voltage generator may operate with a power enough to compensate an electric power (leakage current) to be consumed by the internal circuit. As a result, the power consumption during the low power consumption mode can be reduced.

The internal voltage is supplied to the internal circuit even during the low power consumption mode. Therefore, the internal circuit can operate immediately after a release from the low power consumption mode.

According to another aspect of the semiconductor memory device in the present invention, the internal voltage generator includes a plurality of units for generating the internal voltage. During the low power consumption mode, a part of the units suspend(s) so that the power consumption during the low power consumption mode can be further reduced.

According to another aspect of the semiconductor memory device and the method of controlling the semiconductor memory device in the present invention, a stabilized capacitor connected with a power supply line stores a portion of electric charge to be supplied to the power supply line. The semiconductor memory device when receiving a control signal from the exterior, keeps a connection between the power supply line and the stabilized capacitor but disconnects the power supply line and the internal circuit, thereby entering into the low power consumption mode. Therefore, the power consumption of the internal circuit can be reduced to zero during the low power consumption mode. After the release from the low power consumption mode, the voltage corresponding to the electric charge stored in the stabilized capacitor is applied to the internal circuit through the power supply line when the power supply line and the internal circuit are connected. As a result, the semiconductor memory device can operate immediately after the release from the low power consumption mode.

According to another aspect of the semiconductor memory device in the present invention, an internal voltage generator generates an internal voltage upon receipt of a power supply voltage from the exterior. The internal voltage is supplied to the internal circuit through the power supply line. After the release from the low power consumption mode, therefore, the voltage corresponding to the electric charge stored in the stabilized capacitor can be supplied to the internal circuit.

According to another aspect of the semiconductor memory device and the method of controlling the semiconductor memory device in the present invention, an internal voltage generator generates an internal voltage to be supplied to a predetermined internal circuit, upon receipt of a power supply voltage from the exterior. An internal voltage detector detects the level of the internal voltage and controls the internal voltage generator according to its detection result. The semiconductor memory device receiving a control signal from the exterior, weakens the response of the internal voltage detector, thereby entering to a low power consumption mode. Weakening the response of the internal voltage detector results in lowering the operation frequency of the internal voltage generator to be operated under the control of the internal voltage detector. As a result, the power consumption during the low power consumption mode can be reduced.

According to another mode of the semiconductor memory device of the invention, the internal voltage generator includes a plurality of units for detecting the level of the internal voltage. During the low power consumption mode, a part of the units suspend(s) their operations so that the power consumption during the power consumption mode can be further reduced.

According to another aspect of the semiconductor memory device and the method of controlling the semiconductor memory device in the present invention, an internal voltage generator generates an internal voltage to be supplied to a predetermined internal circuit, upon receipt of a power supply voltage from the exterior. An internal voltage detector detects the level of the internal voltage and controls the internal voltage generator according to its detection result. The semiconductor memory device receiving a control signal from the exterior, lowers the detection level of the internal voltage in the internal voltage detector and reduces the absolute value of the internal voltage generated by the internal voltage generator, thereby entering into a low power consumption mode. Therefore, the drivability of the internal voltage generator can be lowered, which reduces the power consumption.

According to another aspect of the semiconductor memory device in the present invention, a reference voltage generator generates a reference voltage. The internal voltage detector detects the level of the internal voltage by comparing the internal voltage with the reference voltage. The semiconductor memory device receiving a control signal from the exterior, lowers the level of the reference voltage generated by the reference voltage generator, thereby decreasing the absolute value of the detection level of the internal voltage in the internal voltage detector. This results in reducing the absolute value of the level of the internal voltage and the off current of transistors and so on in the internal circuit, thereby reducing the power consumption.

According to another aspect of the semiconductor memory device and the method of controlling the semiconductor memory device in the present invention, a self-refresh control circuit automatically refreshes memory cells at a predetermined cycle. When the semiconductor memory device receives a control signal from the exterior, it inactivates the self-refresh control circuit and enters into a low power consumption mode. Owing to not executing refresh during the low power consumption mode, a current amount consumed for the refresh can be reduced.

According to another aspect of the semiconductor memory device in the present invention, the self-refresh control circuit includes a timer for determining a length of refresh cycle. The timer suspends during the low power consumption mode so that the power consumption can be reduced.

According to one aspect of a method of controlling the semiconductor memory device in the present invention, the internal voltage generator when activated, generates the internal voltage to be supplied to a predetermined internal circuit. When the internal voltage generator is operated, a predetermined amount of electric power is consumed. In response to the control signal from the exterior, the internal voltage generator is inactivated. The internal voltage is not to be generated due to the inactivation of the internal voltage, which results in reducing the power consumption. In response to the control signal from the exterior, therefore, the device can easily enter the low power consumption mode.

According to another aspect of the method of controlling the semiconductor memory device in the present invention, a plurality of control signals is received from the exterior. The device enters the low power consumption mode when it recognizes the states of the control signals as the low power consumption commands. Therefore, the device can enter the low power consumption mode by the command input.

According to another aspect of the method of controlling the semiconductor memory device in the present invention, when the power supply is switched on, the chip enable signal remains inactivated until the power supply voltage reaches a predetermined voltage. This makes it possible to prevent an erroneous entry to the low power consumption mode when the power supply is switched on.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Embodiments of the present invention will be described with reference to the accompanying drawings.

Figure 1:
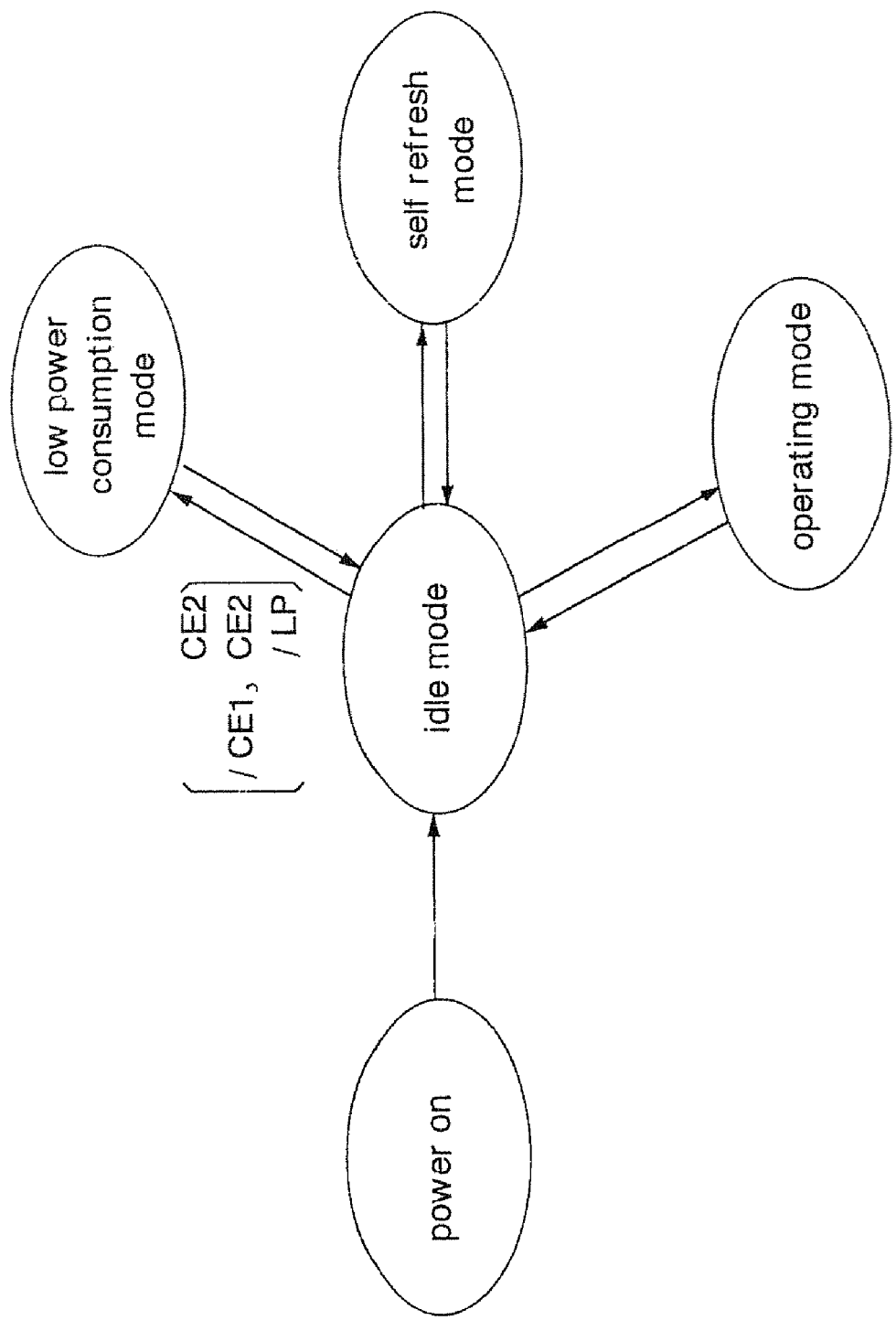
FIG. 1 is a state transition diagram of a semiconductor memory device of the present invention.

FIG. 1 shows a state transition diagram of a semiconductor memory device of the present invention.

First of all, the semiconductor memory device comes into an idle mode when the power supply is switched on. When a read command or a write command is received in the idle mode, the mode shifts to an operating mode to execute a read operation or a write operation. After the execution of the read operation or the write operation, the idle mode is automatically restored. When a self-refreshing command is received in the idle mode, the device enters the self-refreshing mode to execute self-refresh. Herein the self-refreshing mode, a refresh address is automatically generated to sequentially execute refreshing operations in memory cells.

The semiconductor memory device enters the low power consumption mode by detecting a predetermined state of a signal in the idle mode. In a first embodiment described below, in response to a chip enable signal CE2, the device enters the low power consumption mode. Specifically, by the chip enable signal CE2 a predetermined internal circuit is inactivated and the device enters the low power consumption mode. In a second embodiment described below, in response to a command input by chip enable signals /CE1 and CE2, the device enters the low power consumption mode. In a third embodiment described below, in response to a dedicated low power consumption mode signal /LP, the device enters the low power consumption mode.

The semiconductor memory device detects a predetermined state of a signal during the low power consumption mode and exits the mode.

Figure 2:
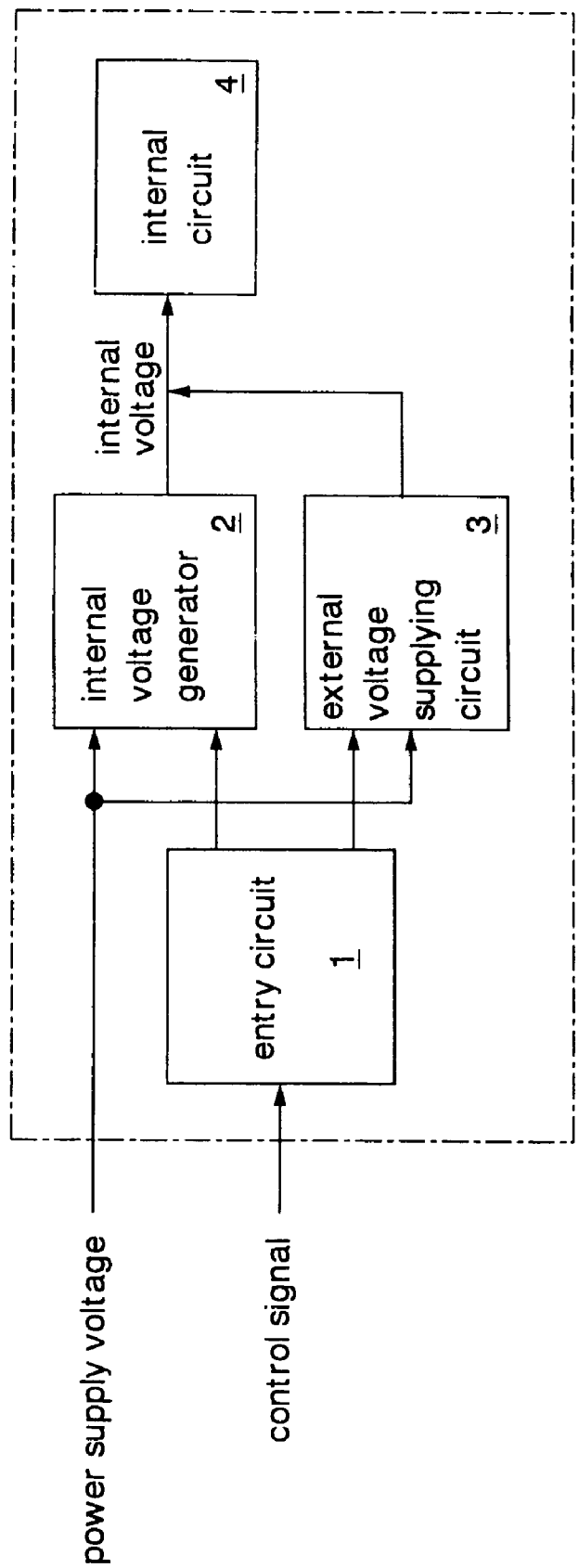
FIG. 2 is a block diagram showing a basic principle of a first embodiment.

FIG. 2 shows the basic principle of the semiconductor memory device of the present invention.

The semiconductor memory device includes an entry circuit 1, an internal voltage generator 2, an external voltage supplying circuit 3, and an internal circuit 4.

The internal voltage generator 2 generates an internal voltage in each mode after the power supply is switched on, and supplies the internal voltage to the internal circuit 4. The entry circuit 1 receives a control signal and inactivates the internal voltage generator 2 when it detects a predetermined state of the control signal. When the internal voltage generator 2 is inactivated, the generation of the internal voltage is stopped. At the same time, the entry circuit 1 activates the external voltage supplying circuit 3. This external voltage supplying circuit 3 supplies the power supply voltage as the internal voltage to the internal circuit 4. And, the semiconductor memory device enters the low power consumption mode.

Figure 3:
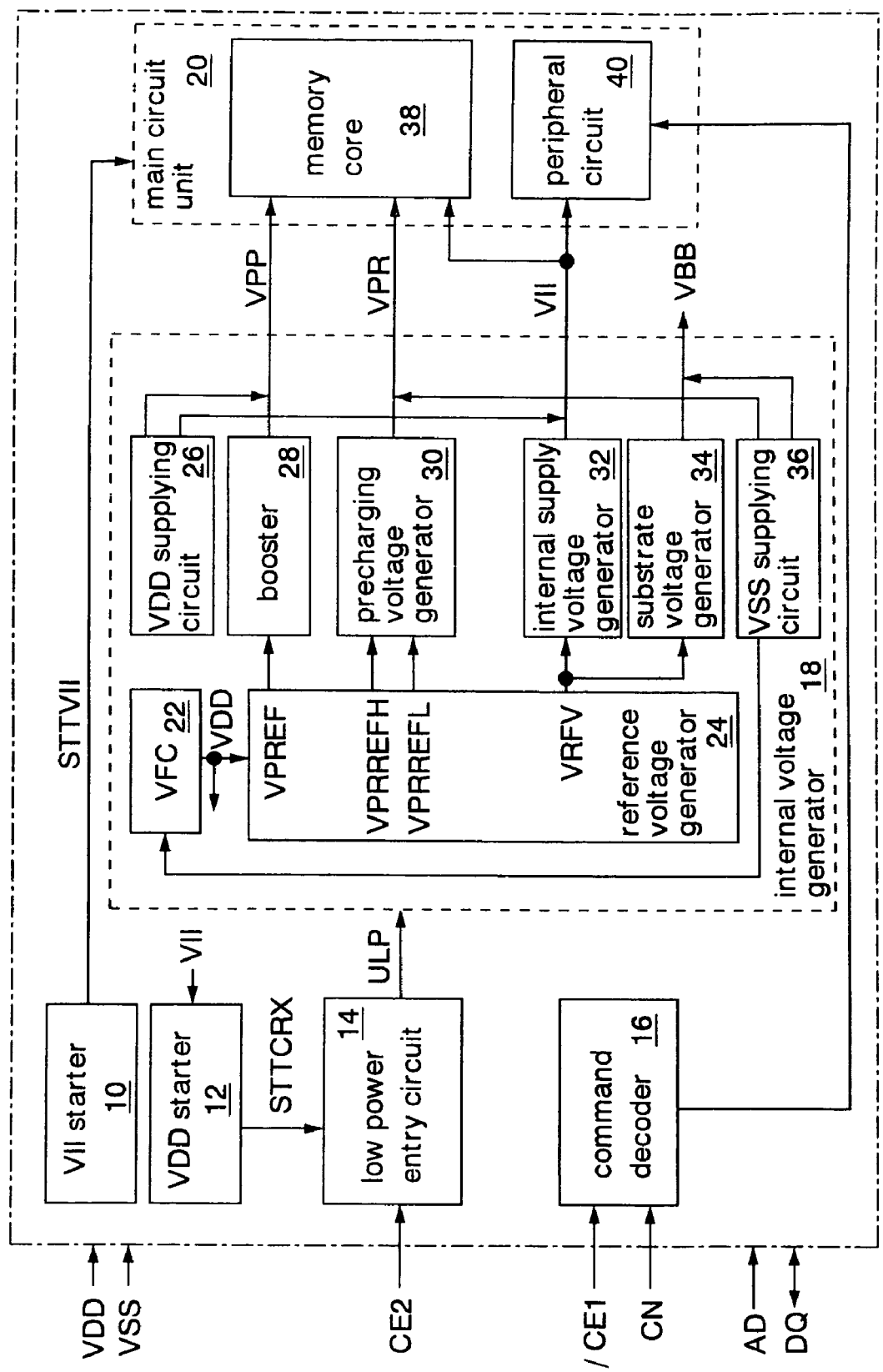
FIG. 3 is a block diagram showing the first embodiment.

FIG. 3 shows a first embodiment of the semiconductor memory device and its control method in the present invention. The semiconductor memory device of this embodiment is formed as a DRAM on a p-type silicon substrate by employing the CMOS process technology.

The DRAM is provided with a VII starter 10, a VDD starter 12, a low power entry circuit 14, a command decoder 16, an internal voltage generator 18 and a main circuit unit 20. The internal voltage generator 18 has a low-pass filter 22, a reference voltage generator 24, a VDD supplying circuit 26, a booster 28, a precharging voltage generator 30, an internal supply voltage generator 32, a substrate voltage generator 34 and a VSS supplying circuit 36. The main circuit unit 20 has a memory core 38 and a peripheral circuit 40. Here, the low power entry circuit 14 corresponds to the entry circuit 1 shown in FIG. 2, and the VDD supplying circuit 26 and the VSS supplying circuit 36 correspond to the external voltage supplying circuit 3 shown in FIG. 2.

The DRAM is supplied with a power supply voltage VDD (e.g., 2.5 V) from the exterior, a ground voltage VSS, chip enable signals /CE1 and CE2 as the control signals, a plurality of address signal AD, a plurality of data input/output signals DQ, and another control signal CN. This DRAM does not adopt the address multiplex method. Therefore, the address signals AD is supplied once at each read operation and at each write operation. The power supply voltage VDD and the ground voltage VSS are supplied to almost all the circuits excepting a partial circuit of the memory core 38. Here, the signals headed by the letter "/" are those of negative logic. The "address signals AD" may be abbreviated into the "AD signals" in the following description by omitting its signal name.

The /CE1 signal is turned to a low level when the read operation and the write operation are executed to activate the DRAM. The CE2 signal functions as a reset signal to inactivate a predetermined internal circuit in the main circuit unit 20 when at the low level.

The VII starter 10 receives the internal supply voltage VII and the ground voltage VSS and outputs a start signal STTVII to the main circuit unit 20. The VII starter 10 is resets the main circuit unit 20 after the power supply is switched on until the internal supply voltage VII reaches a predetermined voltage, and it prevents the malfunction of the main circuit unit 20. The VDD starter 12 receives the power supply voltage VDD and the ground voltage VSS and outputs a start signal STTCRX. The VDD starter 12 inactivates the low power entry circuit 14 after the power supply is switched on until the power supply voltage VDD reaches a predetermined voltage and it prevents the malfunction of the circuit 14.

The low power entry circuit 14 receives the start signal STTCRX and the CE2 signal and activates a low power signal ULP.

In response to the /CE1 signal and another control signal CN, the command decoder 16 decodes a command and outputs the decoded command as an internal command signal to the peripheral circuit 40.

The low-pass filter 22 has a function to filter out the noise contained in the power supply voltage VDD. The power supply voltage VDD thus cleared of the noise is fed to the reference voltage generator 24 or the like. In the low power consumption mode, the switch in the low-pass filter 22 is switched off and the power supply voltage VDD is not supplied to the reference voltage generator 24 so that the current is not consumed.

The reference voltage generator 24 receives the power supply voltage VDD and generates reference voltages VPREF (e.g., 1.5 V), VPRREFL (e.g., 0.8 V), VPRREFH (e.g., 1.2 V) and VRFV (e.g., 2.0 V).

The VDD supplying circuit 26 turns a boost voltage VPP and an internal supply voltage VII to the power supply voltage VDD during the low power consumption mode.

The booster 28 receives the reference voltage VPREF and generates the boost voltage VPP (e.g., 3.7 V) and supplies the boost voltage VPP to the memory core 38.

The precharging voltage generator 30 receives the reference voltage VPRREFL and the reference voltage VPRREFH and generates a precharging voltage VPR (e.g., 1.0 V) to be supplied to the memory core 38.

The internal supply voltage generator 32 receives the reference voltage VRFV and generates the internal supply voltage VII (e.g., 2.0 V) to be supplied to the memory core 38 and the peripheral circuit 40.

The substrate voltage generator 34 receives the reference voltage VRFV and generates a substrate voltage VBB (e.g., −1.0 V) to be fed to the substrate and the p-wells of the memory cells.

The VSS supplying circuit 36 turns the precharging voltage VPR and the substrate voltage VBB to the ground voltage VSS during the low power consumption mode.

Figure 4:
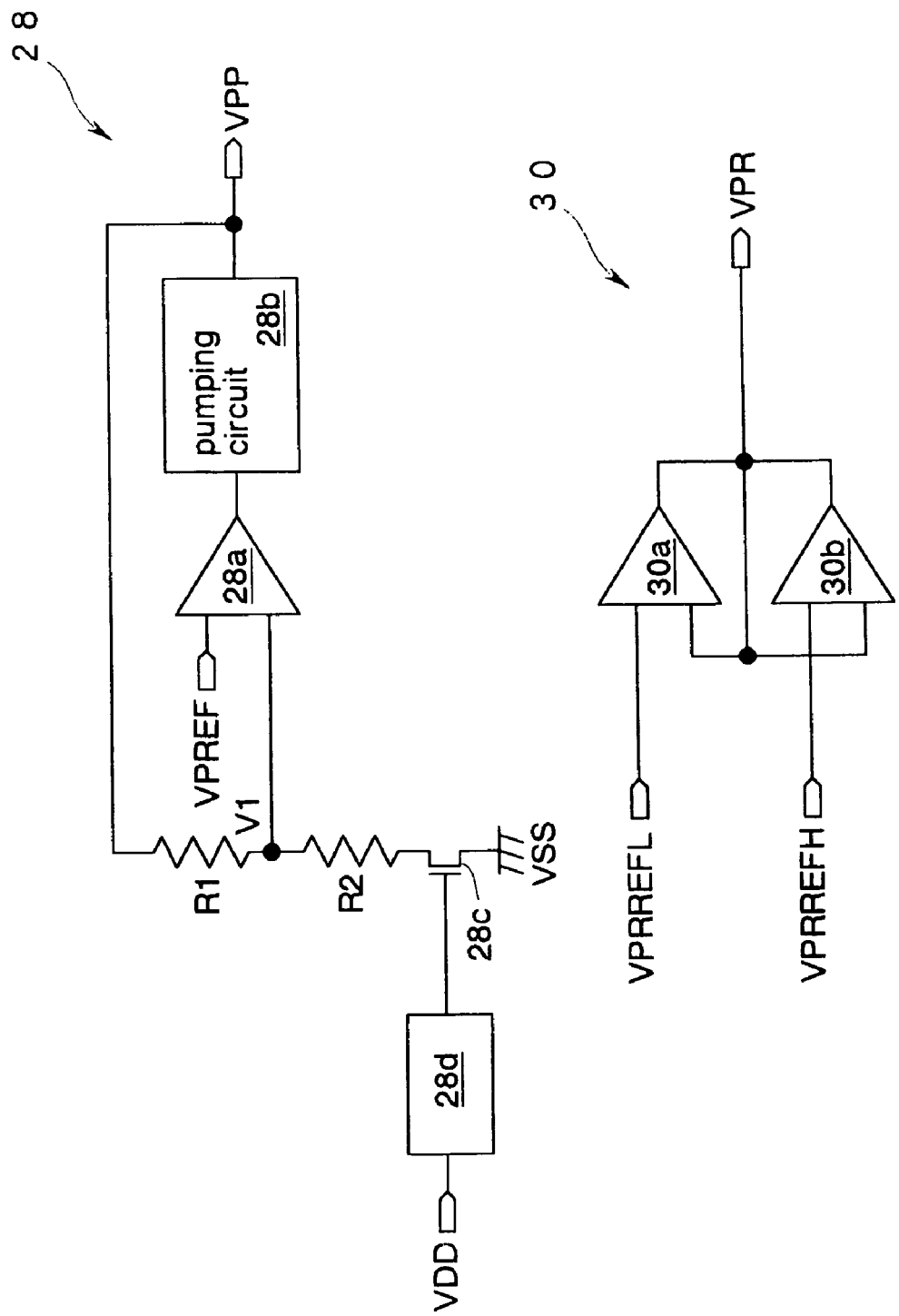
FIG. 4 is a circuit diagram showing the details of a booster and a precharging voltage generator of FIG. 3.

FIG. 4 shows the details of the booster 28 and the precharging voltage generator 30.

The booster 28 is composed of resistors R1 and R2 connected in series, a differential amplifier 28a, a pumping circuit 28*b*, an nMOS 28*c*, and a switching circuit 28*d* for controlling the gate of the nMOS 28*c*. The resistor R1 is supplied at its one end with the boost voltage VPP, and the resistor R2 is supplied at its one end with the ground voltage VSS through the nMOS 28*c*. A divided voltage V1 is generated from the connection node of the resistors R1 and R2. The nMOS 28*c* receives the power supply voltage VDD from the switching circuit 28*d* during the low power consumption mode. The differential amplifier 28*a* is formed of a MOS differential amplifier using a current mirror circuit, for example, as the current source. The differential amplifier 28*a* outputs a high level when the voltage V1 is lower than the reference voltage VPREF. The pumping circuit 28*b* receives the high level from the differential amplifier 28*a* and starts a pumping operation. By this pumping operation, the voltage VPP is raised, and the voltage V1 is raised. When this voltage V1 coincides with the reference voltage VPREF (i.e., 1.5 V), the output of the differential amplifier 28*a* reaches the low level so that the pumping operation stops. By repeating these operations, the boost voltage VPP is retained at a constant voltage.

The precharging voltage generator 30 is composed of two differential amplifiers 30*a* and 30*b* connected at their outputs with each other. The differential amplifier 30*a* is supplied with the reference potential VPRREFL and the precharging voltage VPR. The differential amplifier 30*b* is supplied with the reference potential VPRREFL and the precharging voltage VPR. Moreover, these differential amplifiers 30*a* and 30*b* generate the precharging voltage VPR at an intermediate value between the reference voltages VPRREFL and VPRREFH.

Figure 5:
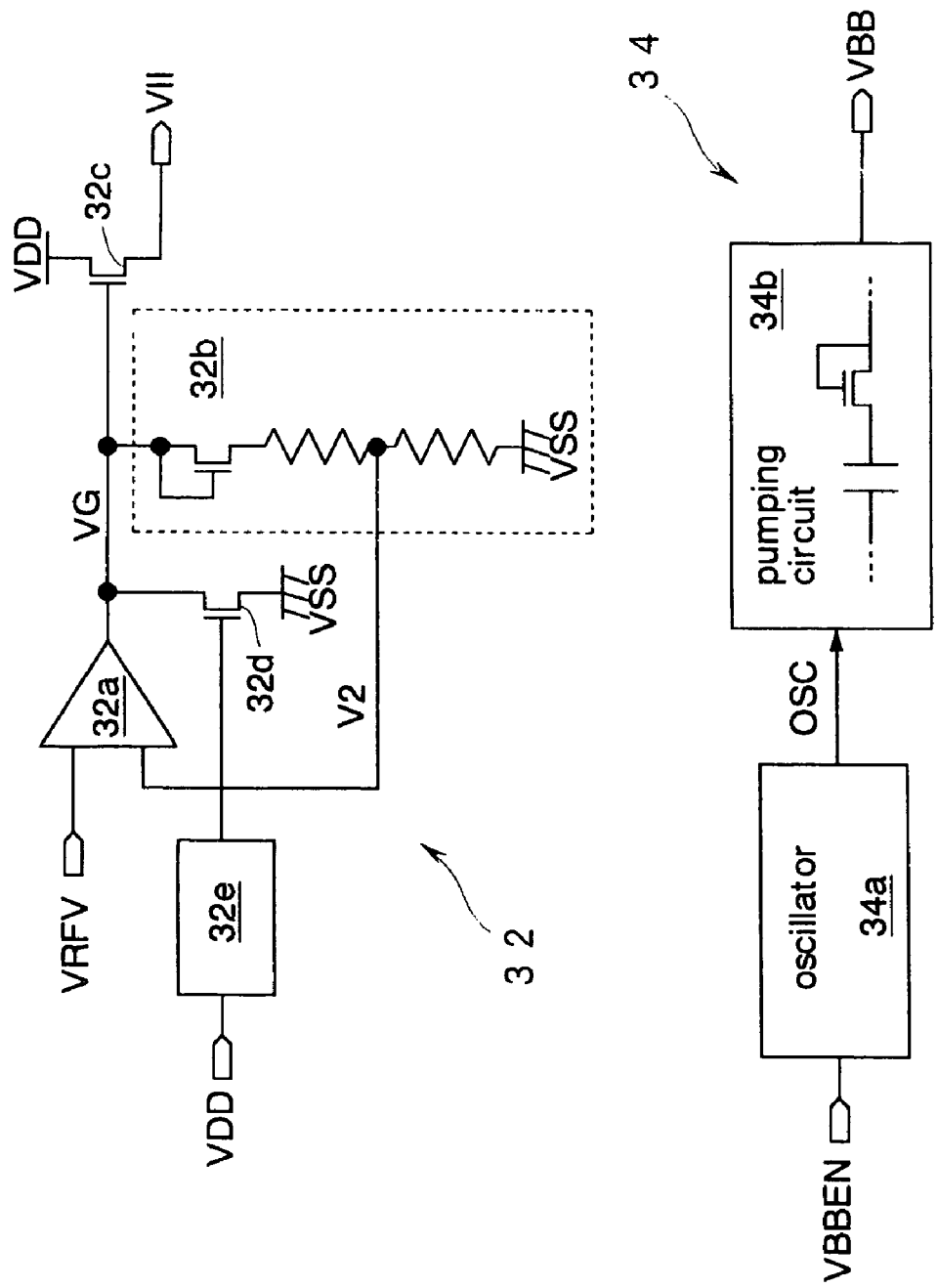
FIG. 5 is a circuit diagram showing the details of an internal supply voltage generator and a substrate voltage generator of FIG. 3.

FIG. 5 shows the details of the internal supply voltage generator 32 and the substrate voltage generator 34. The internal supply voltage generator 32 is composed of a negative feedback type differential amplifier 32*a*, a compensating circuit 32*b*, a regulator 32*c* made of an nMOS, an nMOS 32*d*, and a switching circuit 32*e* for controlling the gate of the nMOS. The differential amplifier 32*a* receives the reference voltage VRFV and a voltage V2 generated by the compensating circuit 32*b*, and supplies a predetermined voltage to a node VG. In the compensating circuit 32*b*, an nMOS and resistors R3 and R4 in a diode connection are arranged in series between the node VG and the ground line VSS. The voltage V2 is generated at the connection node between the resistors R3 and R4. The regulator 32*c* is connected at its gate with the node VG, receives the power supply voltage VDD at its drain and generates the internal supply voltage VII at its source.

The nMOS 32*d* is grounded at its source and connected at its drain with the node VG. The switching circuit 32*e* supplies the power supply voltage VDD to a gate of the nMOS 32*d* during the lower power consumption mode. The nMOS 32*d* receives the power supply voltage VDD from the switching circuit 32*e* during the low power consumption mode, and fixes the node VG at the ground level.

In this internal supply voltage generator 32, when the threshold voltage of the regulator 32*c* is lowered due to the rise in the ambient temperature, for example, the threshold voltage of the nMOS of the compensating circuit 32*b* also drops, so that the voltage V2 rises. In response to the rise in the voltage V2, the differential amplifier 32*a* lowers the voltage of the node VG. Moreover, the source-to-drain current of the nMOS 32*c* is made constant so that the internal supply voltage VII is made constant.

The substrate voltage generator 34 is composed of an oscillator 34*a* and a pumping circuit 34*b*. In response to the high level of a control signal VBBEN, the oscillator 34*a* starts the oscillating operation to output an oscillating signal OSC. The pumping circuit 34*b* has a capacitor for repeating charge and discharge in response to the oscillating signal OSC from the oscillator 34*a*, and a diode-connected nMOS transistor connected with one end of the capacitor. The charges of a p-type substrate connected with the anode are discharged by the pumping operation, which lowers the substrate voltage VBB. Making the substrate voltage VBB negative leads to gaining some effects such as reducing the influences of a shift in the threshold voltage of the memory cells due to the substrate effect so that the characteristics of the memory cells may be improved.

Figure 6:
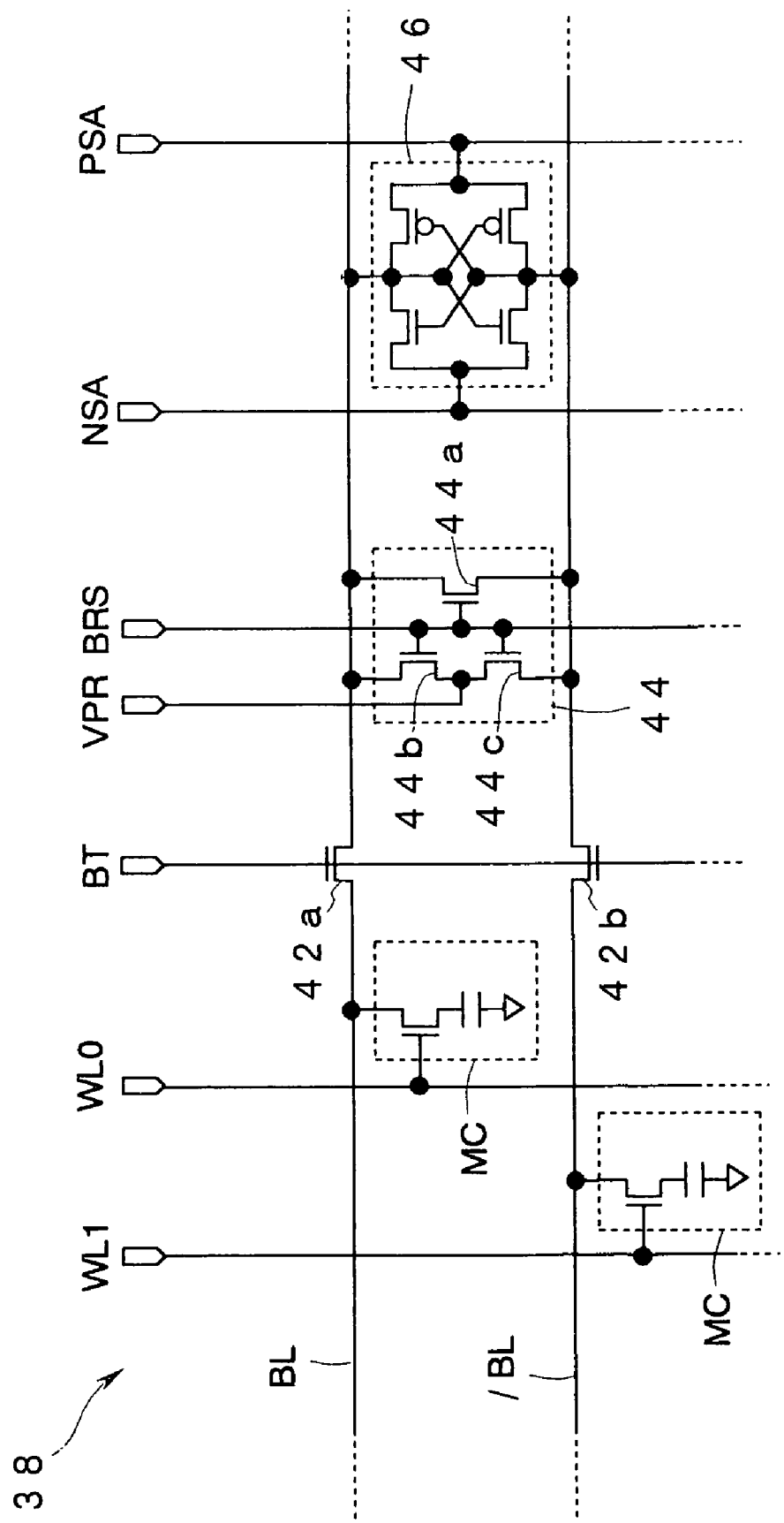
FIG. 6 is a circuit diagram showing the detail of an essential portion of a memory core of FIG. 3.

FIG. 6 shows the detail of an essential portion of the memory core 38.

The memory core 38 has a memory cell MC, nMOS switches 42*a* and 42*b*, a precharging circuit 44 and a sense amplifier 46.

The memory cell MC is composed of a data transferring nMOS and a capacitor. The gate of the nMOS is connected with a word line WL0 (or WL1).

The nMOS switches 42*a* and 42*b* control the connection between a bit line BL (or /BL) on the side of the memory cell MC and a bit line BL (or /BL) on the side of a sense amplifier SA. The nMOS switches 42*a* and 42*b* receive a control signal BT at their gates.

The precharging circuit 44 is composed of three nMOSes 44*a*, 44*b* and 44*c*. The nMOS 44*a* is connected at its source and drain, respectively, with the bit lines BL and /BL. The nMOSes 44*b* and 44*c* are connected at one of their sources and drains, respectively, with the bit lines BL and /BL, and are supplied at their others with the precharging voltage VPR. The nMOSes 44*a* and 44*b* and 44*c* receive a bit line control signal BRS at their gates.

The sense amplifier 46 is constructed by connecting the inputs and outputs of two CMOS inverters with each other. Each of these CMOS inverters is connected at its outputs individually with the bit lines /BL and BL. The source of the pMOS and the source of the nMOS of each CMOS inverter are connected with power supply lines PSA and NSA, respectively. The voltages of these power supply lines PSA and NSA individually reach the VPR level during a standby state and during the inactivation of the sense amplifiers, and respectively change to the internal supply voltage VII and the ground voltage VSS when the bit lines are amplified.

Figure 7:
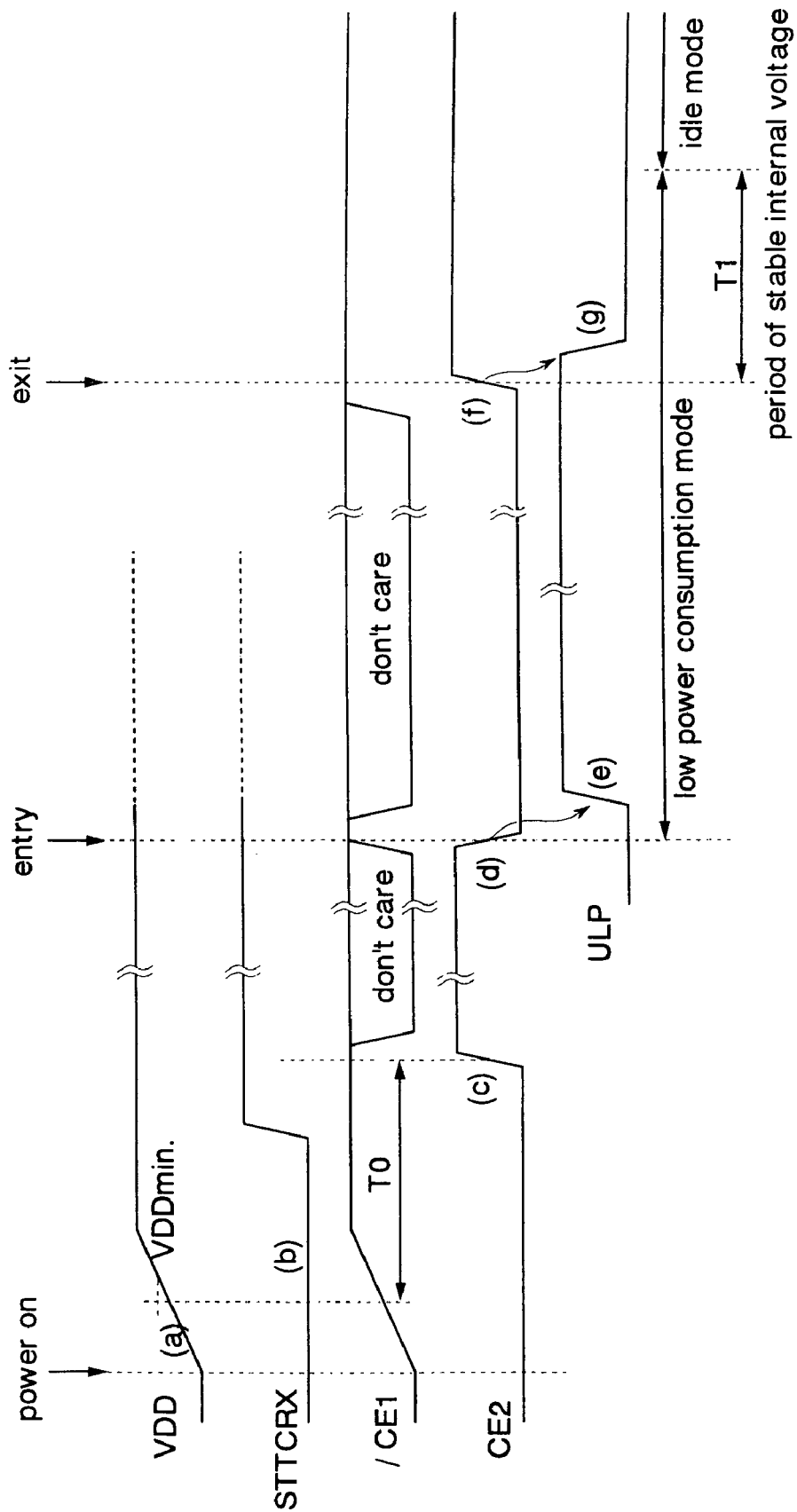
FIG. 7 is a timing chart showing the operations of the first embodiment at the switch-on of a power supply and at the times of entry into and exit from a low power consumption mode.

FIG. 7 shows the operations of the switch-on of the power supply, the shifting (entry) to the low power consumption mode, and the release (exit) from the low power consumption mode with regard to the aforementioned semiconductor memory device.

First of all, when the power supply is switched on, the power supply voltage VDD rises gradually (FIG. 7(*a*)). The VDD starter 12 shown in FIG. 3 inactivates the start signal STTCRX (to the low level) till the power supply voltage VDD reaches a predetermined voltage (FIG. 7(*b*)). By this control, it is possible to prevent the ULP signal from being activated due to the malfunctioning of the low power entry circuit 14 when the power supply is switched on. An exterior controller (e.g., a CPU or a memory controller) for controlling the DRAM turns the CE2 signal at the high level a predetermined time TO after the power supply voltage VDD reaches the minimum operable voltage VDDmin (FIG. 7(*c*)).

After this, the DRAM becomes the standby state or executes an ordinary operation. The exterior controller turns the CE2 signal to the low level when the DRAM enters the low power consumption mode (FIG. 7(*d*)). The low power entry circuit 14 activates the ULP signal (to the high level) in response to the fall of the CE2 signal when the STTCRX signal is at the high level (FIG. 7(e)).

In response to the high level of the ULP signal, the low-pass filter 22 of the internal voltage generator 18 stops the supply of the power supply voltage to the reference voltage generator 24 and instead supplies the ground voltage VSS from the VSS supplying circuit 36. In response to the ground voltage VSS, the reference voltage generator 24 turns the reference voltages VPREF, VPRREFL, VPRREFH and VRFV to the ground level. The nMOS 28b of the booster 28 shown in FIG. 4 and the nMOS 32d of the internal supply voltage generator 32 shown in FIG. 5 are switched off. As a result, the booster 28, the precharging voltage generator 30, the internal supply voltage generator 32 and the substrate voltage generator 34 are inactivated to stop their operations. Thus, all the conventional circuits remaining operative during the low power consumption mode are stopped. Therefore, the power consumption in the low power consumption mode is drastically reduced as compared with the conventional.

When these circuits are inactivated, the generations of the boost voltage VPP, the precharging voltage VPR, the internal supply voltage VII and the substrate voltage VBB are stopped. However, the boost voltage VPP and the internal supply voltage VII are changed into the power supply voltage VDD by the VSS supplying circuit 36, and the substrate voltage VBB and the precharging circuit VPR are changed into the ground voltage VSS by the VSS supplying circuit 36. Therefore, the internal circuit of the main circuit unit 20 is prevented from having a leak path.

The exterior controller turns the CE2 signal to the high level when the low power consumption mode is released (FIG. 7(f)). In response to the high level of the CE2 signal, the low power entry circuit 14 inactivates the ULP signal (to the low level) (FIG. 7(g)). In response to the inactivation of the ULP signal, the low-pass filter 22 supplies the power supply voltage VDD to the reference voltage generator 24. In response to the inactivation of the ULP signal, the VDD supplying circuit 26 and the VSS supplying circuit 36 stop the supplies of the power supply voltage VDD and the ground voltage VSS. Then, the booster 28, the precharging voltage generator 30, the internal supply voltage generator 32 and the substrate voltage generator 34 are activated again to start their operations.

Here, the DRAM enters the idle mode a time T1 after the high level of the CE2 signal. This time T1 is a time required for the individual internal voltages VPP, VPR, VII and VBB to become stable.

Figure 8:
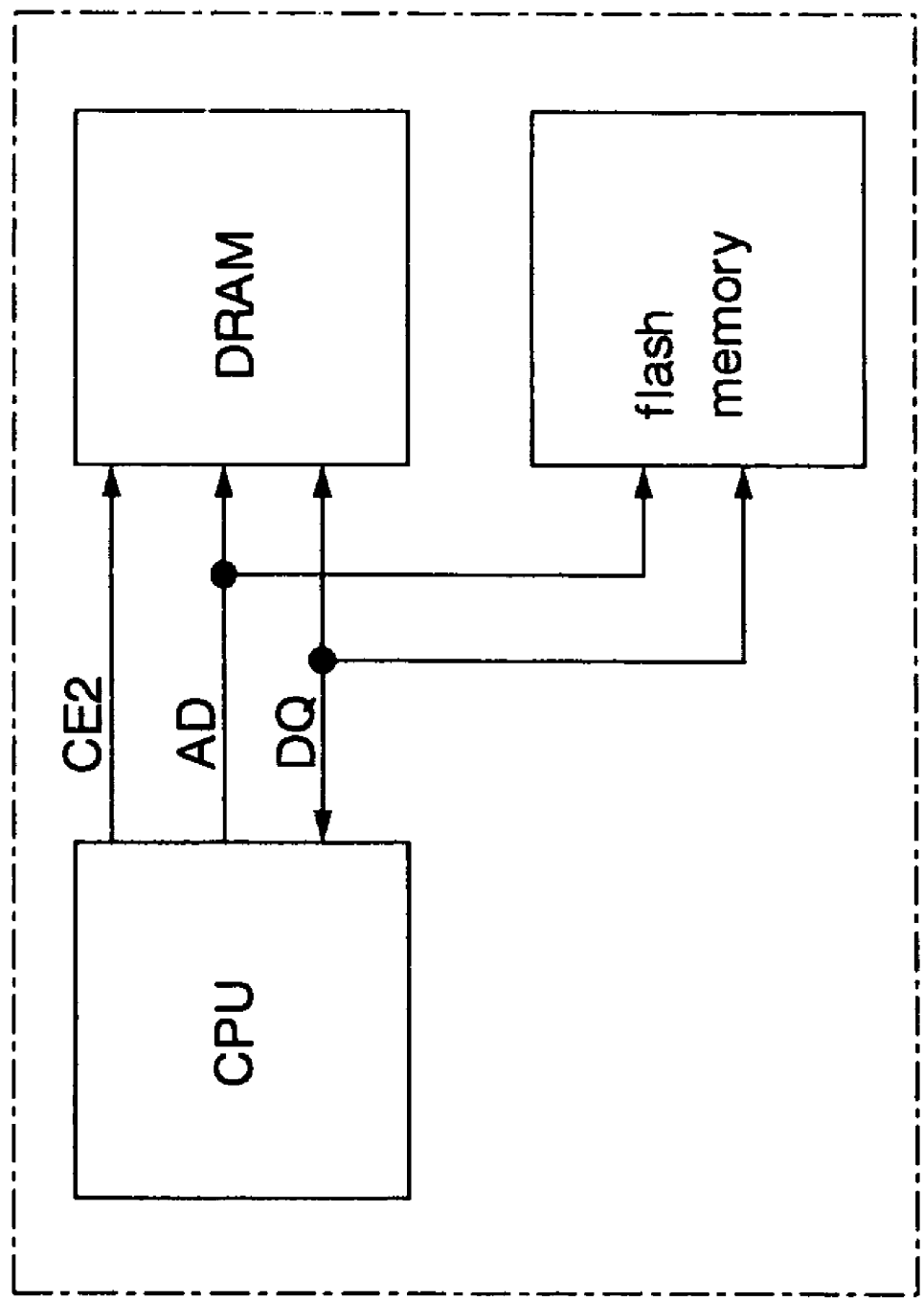
FIG. 8 is a block diagram showing an example in which the semiconductor memory device of the first embodiment is used in a cellular phone.

FIG. 8 shows an example in which the semiconductor memory device of the first embodiment is employed in a cellular phone.

This cellular phone has the DRAM of this embodiment, the CPU and the flash memory mounted on the circuit board.

The CPU controls the read/write operation of the data from/in the DRAM and the flash memory. The DRAM is employed as the work memory, and the flash memory is employed as the backup memory when the cellular phone is switched off or in the waiting state.

Figure 9:
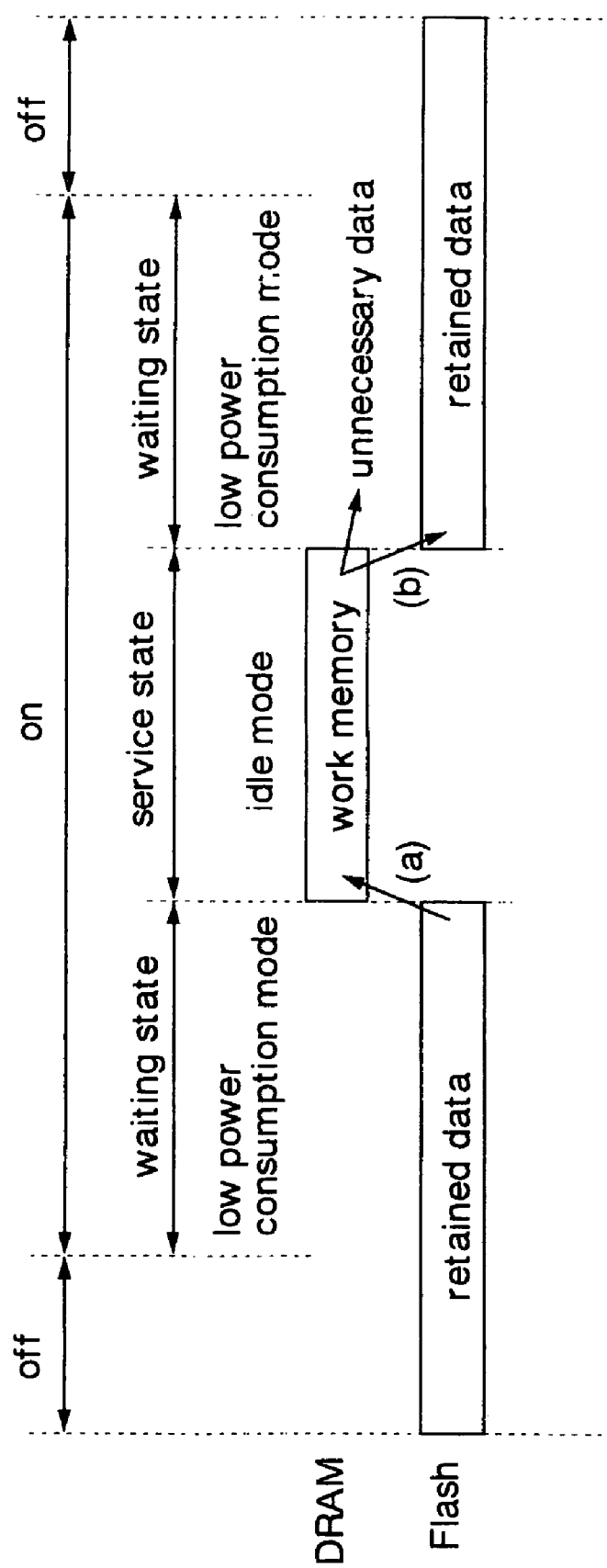
FIG. 9 is an explanatory diagram showing the state of using the cellular phone shown in FIG. 8.

FIG. 9 shows the state of using the cellular phone shown in FIG. 8.

In this example, the DRAM is in the low power consumption mode by the control of the CPU when the cellular phone is in the waiting state. At this time, the power consumption of the DRAM is as much as that of the flash memory in the standby state.

When the cellular phone then enters the service state from the waiting state, the CPU raises the CE2 signal shown in FIG. 8 to the high level. After the DRAM entered the idle mode, the data retained in the flash memory are transferred to the DRAM (FIG. 9(a)). During the service state, the DRAM is used as the work memory. Here, the service state includes not only the state of exchanging vocal communications but also the state of transferring data.

When the service state shifts to the waiting state, those, of the data of the DRAM, necessary to be retained are saved in the flash memory (FIG. 9(b)). After this, the CPU lowers the CE2 signal to the low level and enters the DRAM to the low power consumption mode. The DRAM does not perform refresh operation in the low power consumption mode so that the unnecessary data is lost.

When the power supply is switched off, the necessary data are retained in the flash memory. By applying the DRAM of the first embodiment to the work memory of the cellular phone, the power consumption when the cellular phone is in the waiting state is drastically reduced.

Here, the DRAM and the flash memory may be controlled not by the CPU but by a dedicated memory controller or the like. The data transfer may also be done during the service state if necessary not only when the switching over the waiting state and the service state. Moreover, the memory for backing up the data should not be limited to the flash memory but may be an SRAM. The data may be saved in a server such as the base station of the cellular phone.

Figure 10:
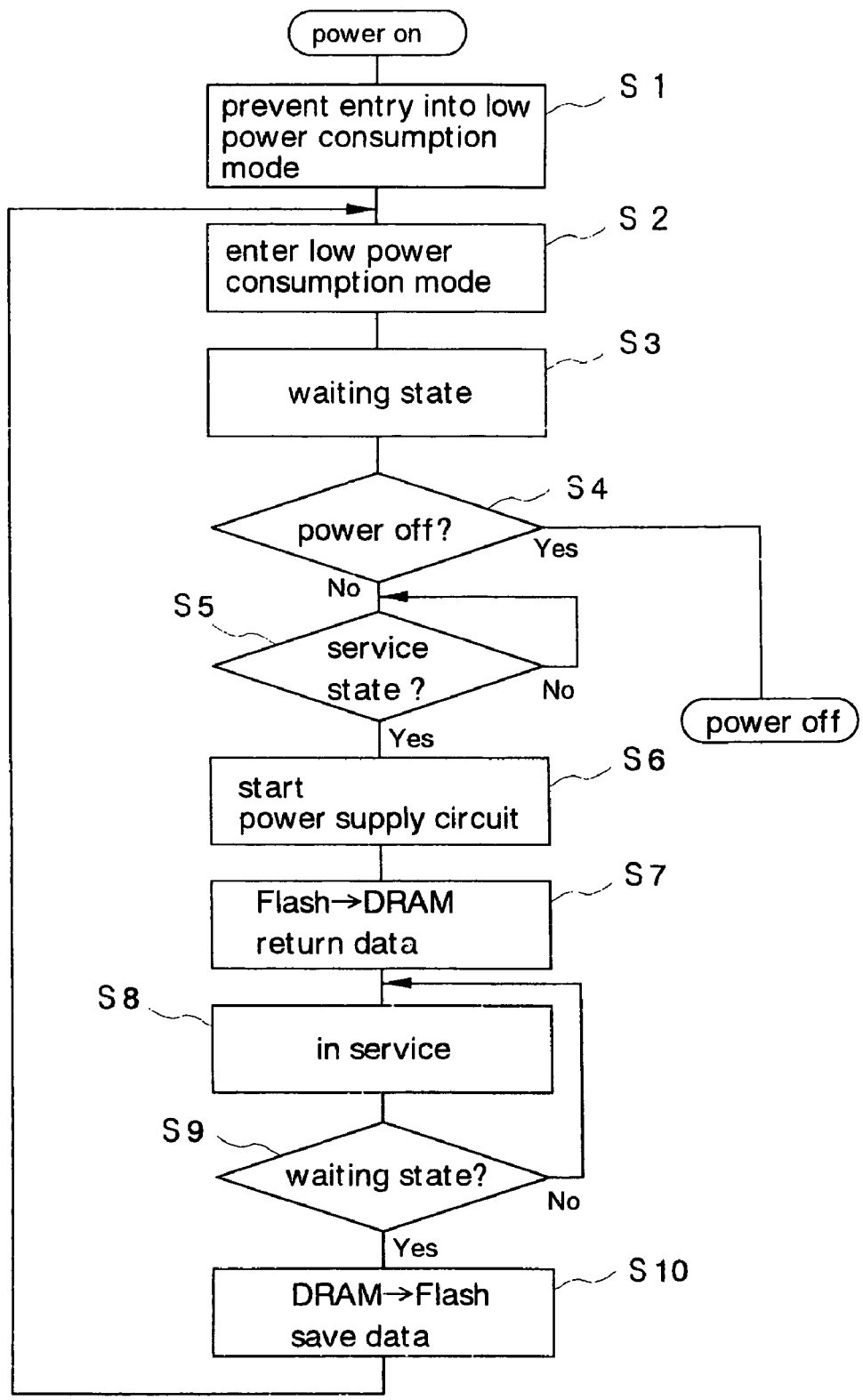
FIG. 10 is a flow chart showing the state of controlling the cellular phone shown in FIG. 8.

FIG. 10 is a flow chart showing a control of the cellular phone shown in FIG. 8.

At first Step S1, an entry to the low power consumption mode is prevented when the power supply is switched on. As shown in FIG. 7, specifically, the malfunction is prevented during the activation period of the STTCRX signal of the VDD starting circuit 12.

Next, at Step S2, the CPU turns the CE2 signal to the low level to enter the DRAM into the low power consumption mode. At Step S3, the cellular phone is in the waiting state.

Next, at Step S4, the CPU detects whether or not the power supply is switched off. When the power supply is switched off, the procedure is complete. When the power supply is not switched off, the procedure advances to Step S5.

At Step S5, the CPU repeats the waiting state until it becomes the service state. When it becomes the service state, the procedure advances to Step 56.

At Step S6, the CPU raises the CE2 signal to the high level to shift the DRAM from the low power consumption mode to the idle mode. Then, the individual power supply circuits 28, 30, 32 and 34 shown in FIG. 3 are started again.

Next, at Step S7, the CPU transfers the data retained in the flash memory to the DRAM (return the data).

Next, at Step S8, the service or the data transfer is performed.

At Step S9, the CPU detects whether or not the DRAM becomes the waiting state. When it does not, the procedure returns to Step S7. When it does, the procedure advances to Step S10.

At Step S10, the CPU transfers those of the data of the DRAM necessary to be retained, to the flash memory (save the data).

Then, the procedure returns to Step S2, at which the cellular phone enters again the waiting state. The DRAM enters the low power consumption mode.

In the semiconductor memory device and its control method of the present invention, the operations of the booster 28, the precharging voltage generator 30, the internal supply voltage generator 32 and the substrate voltage generator 34 are stopped during the low power consumption mode. Therefore, the power consumption in the low power consumption mode can be drastically reduced, as compared with the conventional.

In the low power consumption mode, the boost voltage VPP and the internal supply voltage VII, and the substrate voltage VBB and the precharging voltage VPR are set at the power supply voltage VDD and the ground voltage VSS, respectively. Therefore, the internal circuit of the main circuit unit 20 can be prevented from having the leak path thereby to reduce the power consumption.

By utilizing the CE2 signal existing in the conventional, the DRAM is entered to the low power consumption mode. Therefore, the kind and the number of the external terminals can be identical to those of the conventional terminals. As a result, the user of the DRAM is not required to drastically change the circuit due to adding the low power consumption mode.

When the power supply is switched on, the VDD starter 12 inactivates the start signal STTCRX (to the low level) until the power supply voltage VDD reaches the predetermined voltage. As a result, the low power entry circuit 14 can be prevented from any malfunction when the power supply is switched on, to prevent the ULP signal from being activated and the DRAM from entering the low power consumption mode.

When the power supply is switched on, the CE2 signal is raised to the high level the predetermined time T0 after the power supply voltage VDD reaches the minimum operating voltage VDDmin. This makes it possible to prevent the erroneous entry into the low power consumption mode when the power supply is switched on.

By applying the DRAM of the present invention to the work memory of the cellular phone, therefore, the power consumption of the cellular phone during the waiting state can be drastically reduced. Moreover, the malfunction can be prevented.

Figure 11:
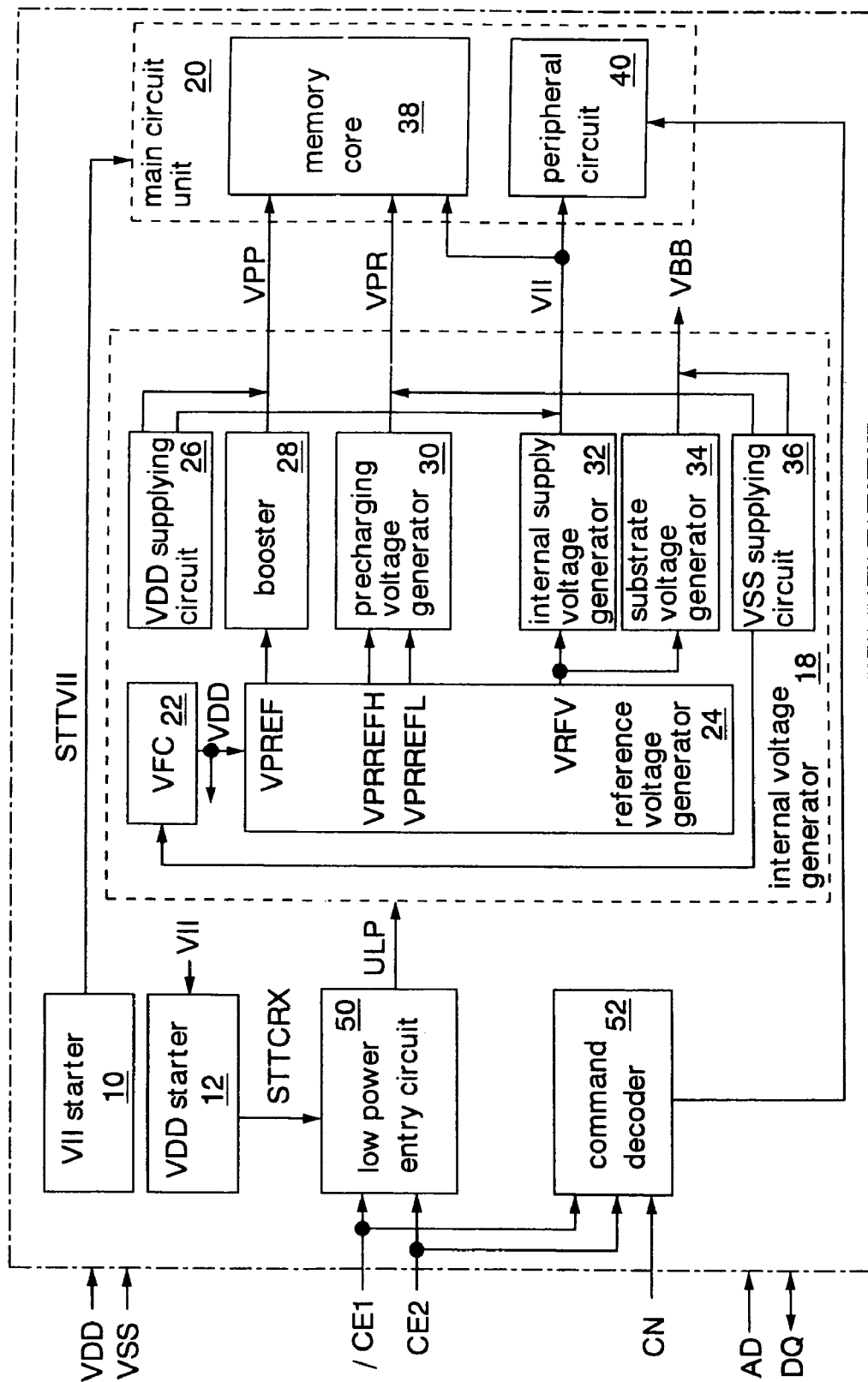
FIG. 11 is a block diagram showing a second embodiment.

FIG. 11 shows a second embodiment of the semiconductor memory device and its control method of the present invention. The same circuits as those described in the first embodiment are designated by the common reference numerals, and their detailed description will be omitted.

In this embodiment, a low power entry circuit 50 is supplied with the /CE1 signal and the CE2 signal. A command decoder 52 is supplied with the /CE1 signal, the CE2 signal and another control signal CN. The remaining construction is identical to that of foregoing first embodiment.

Figure 12:
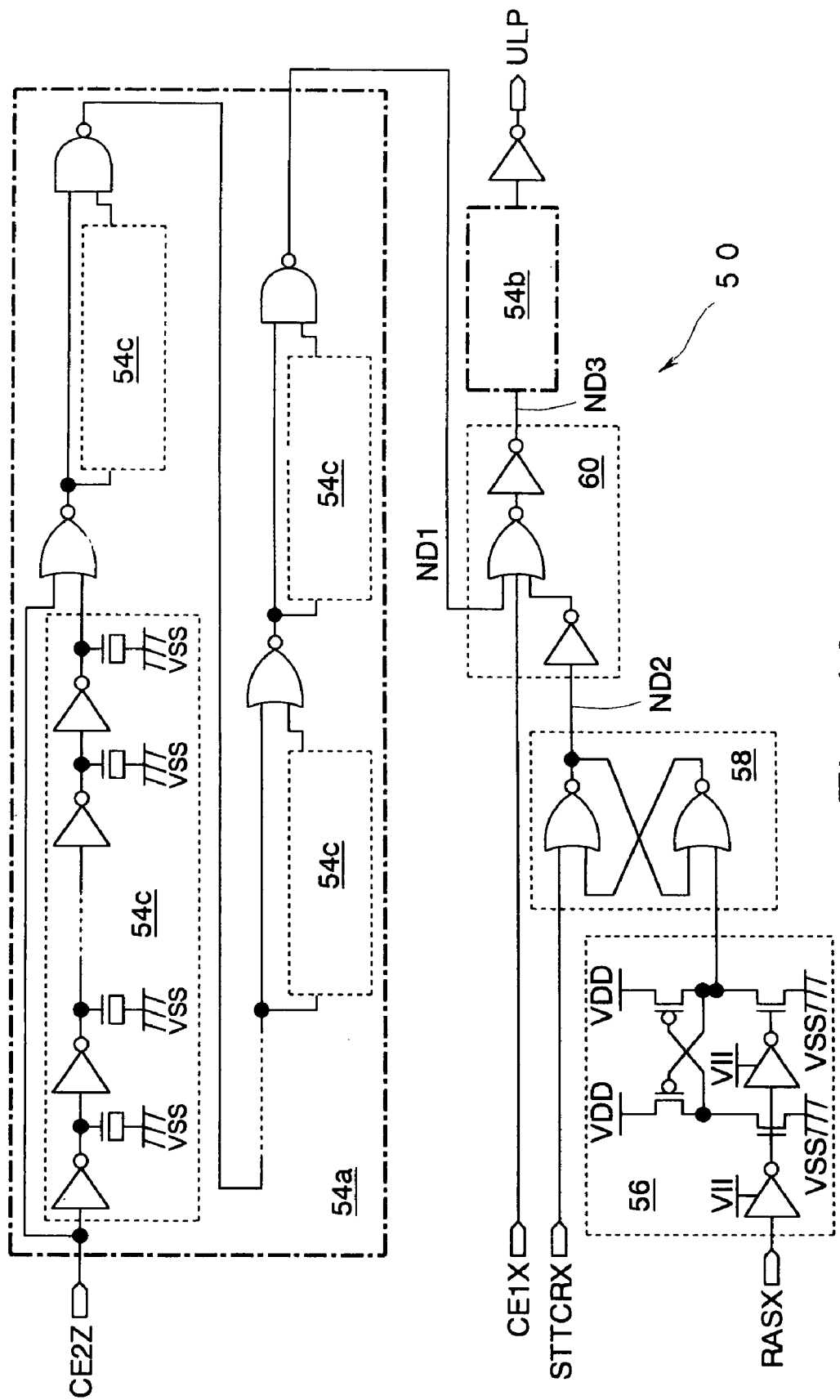
FIG. 12 is a circuit diagram showing the detail of a low power entry circuit of FIG. 11.

FIG. 12 shows the detail of the low power entry circuit 50.

The low powder entry circuit 50 has timing adjusting circuits 54a and 54b, a level shifter 56, an RS flip-flop 58 and a combinational circuit 60.

The timing adjusting circuit 54a is formed by connecting a two-input NOR gate connected at its one input with a delay circuit 54c and a two-input NAND gate connected at its one input with the delay circuit 54c, in plurality in cascade. Each delay circuit 54c has an MOS capacity arranged between a plurality of inverters connected in cascade. The timing adjusting circuit 54a delays the falling edge of a chip enable signal CE2Z by about 100 ns and outputs it to a node ND1. The CE2Z signal is the CE2 signal which is supplied from the exterior and received at the input buffer (not shown).

The timing adjusting circuit 54b is identical to the timing adjusting circuit 54a. The timing adjusting circuit 54b delays the falling edge of the signal transmitted to a node ND3, by about 100 ns.

The level shifter 56 has two sets of pMOSes and nMOSes connected in series. Each nMOS receives at its gate the signals in phase and in inverted phase of a row address strobe signal RASX. The inverter for generating these inverted and uninverted signals of the RASX signal receives the internal supply voltage VII and the ground voltage VSS. The RASX signal is a control signal which turns to a low level when the word line is activated. The gates of the pMOSes are individually connected with the drains of the adjacent pMOSes, and the drains (or output nodes) of the nMOSes for receiving the positive logic of the RASX signal are connected with the RS flip-flop 58. Each pMOS receives the power supply voltage VDD at its source, and each nMOS receives the ground voltage VSS at its source.

The RS flip-flop 58 is composed of two two-input NOR gates. One input corresponding to an output node ND2 receives the start signal STTCRX, and the other input receives the output signal of the level shifter 56.

The combinational circuit 60 receives the low level of the nodes ND1, ND2 and the chip enable signal CE1X and it turns the output node ND3 at the low level. The CE1X signal is generated at the input buffer (not shown) receiving the /CE1 signal supplied from the exterior and is also the negative logic signal.

The timing adjusting circuit 54b activates the ULP signal (to the high level) through the inverter about 100 ns after receiving the low level of the node ND3.

Figure 13:
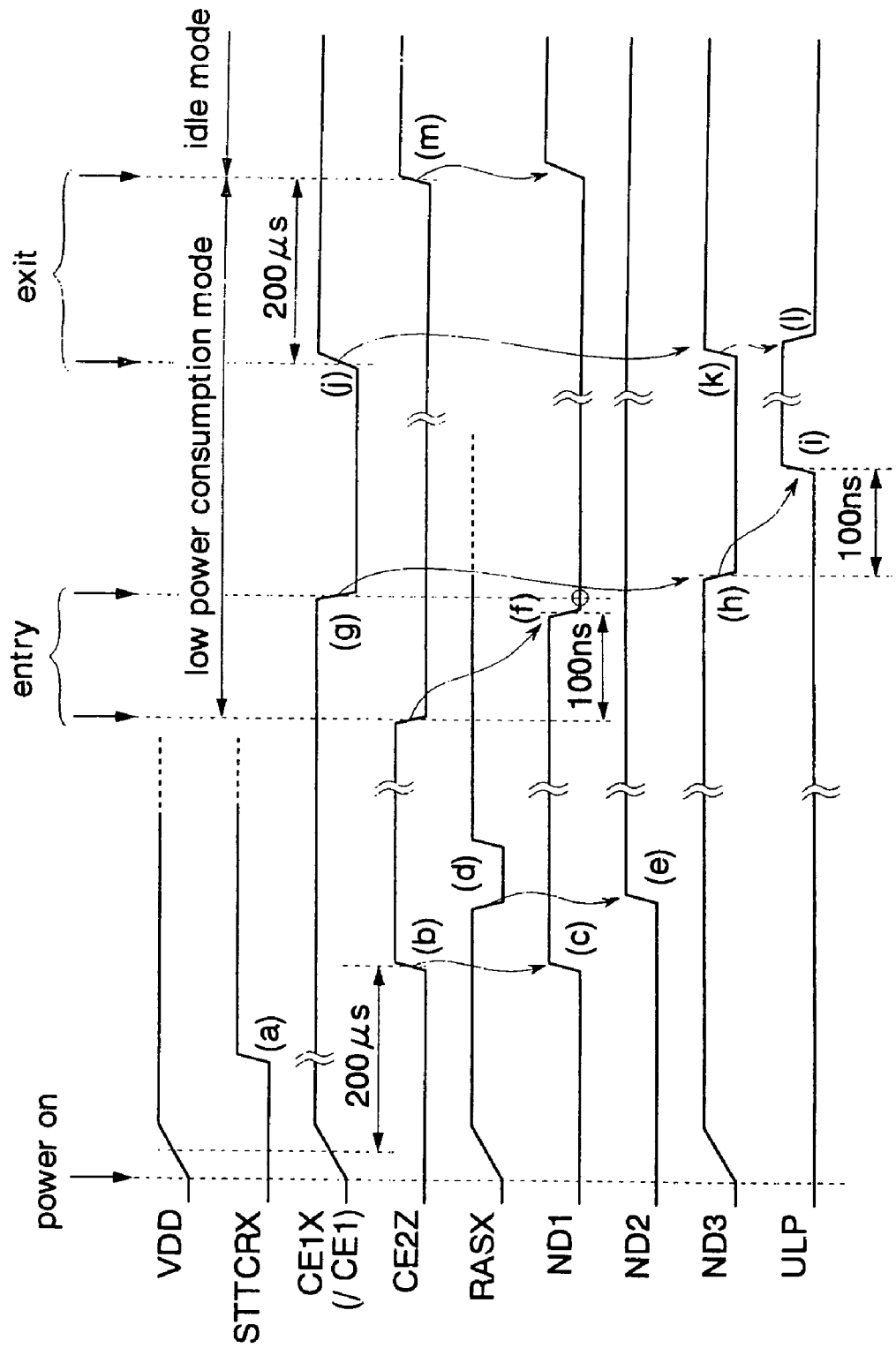
FIG. 13 is a timing chart showing the operations of the low power entry circuit of FIG. 12.

FIG. 13 shows the operations of the low power entry circuit 50.

First, when the power supply is switched on, the STTCRX signal turns to the low level so that the voltage of the /CE1 signal rises following the power supply voltage VDD. Thus, the malfunction is prevented.

A predetermined time after the power supply was switched on, the STTCRX signal turns to the high level (FIG. 13(a)). After this, the exterior controller for controlling the DRAM raises the CE2 signal to the high level (FIG. 13(b)). The timings above are identical to those of the first embodiment. In response to the high level of the CE2Z signal, the node ND1 shown in FIG. 12 turns to the high level (FIG. 13(c)).

The initial cycle is executed to turn the RASX signal to the low level (FIG. 13(d)). In response to the low level of the RASX signal, the RS flip-flop 58 raises the node ND2 to the high level (FIG. 13(e)). After this, there are started the operations of the internal voltage generator 18 shown in FIG. 11.

Next, there is supplied an entry command for the entry into the low power consumption mode. In this embodiment, the DRAM enters the low power consumption mode by turning the /CE1 signal to the low level a predetermined time after turning the CE2 signal to the low level.

The timing adjusting circuit 54a turns the node ND1 to the low level about 100 ns after receiving the low level of the CE2Z signal (FIG. 13(f)). 100 ns or more after the falling edge of the CE2Z signal, the CE1X signal is turned to the low level (FIG. 13(g)). In response to the low level of the CE1Z signal and the low level of the node ND1, the combinational circuit 60 shown in FIG. 12 turns the node ND3 to the low level (FIG. 13(h)). The timing adjusting circuit 54b raises the ULP signal to the high level (FIG. 13(i)) about 100 ns after receiving the low level of the node ND3. The DRAM enters the low power consumption mode.

Thus, the DRAM enters the low power consumption mode by the command input.

At this time, the inverter of the level shifter 56 shown in FIG. 12 receives the power supply voltage VDD in place of the internal supply voltage VII. As a result, the level shifter 56 is prevented to have the leak path because the gate of the nMOS is reliably switched off.

When the low power consumption mode is released, the CE1X signal is first turned to the high level (FIG. 13(j)). The combinational circuit 60 receives the high level of the CE1X signal to turn the node ND3 to the high level (FIG. 13(k)) and the ULP signal to the low level (FIG. 13(l)). 200 μs after the rising edge of the CE1X signal, the CE2Z signal is turned to the high level (FIG. 13(m)). In response to the high level of the CE2Z signal, a level of the node ND1 turns to the high level. During this period of 200 μs, the internal voltage generator 18 is activated to stabilize the individual internal voltages VPP, VPR, VII and VBB at predetermined levels.

Here, the activations and inactivations of the internal voltage generator 18 are performed as in the first embodiment. Specifically, the controls of the individual circuits in this embodiment are identical to those of the first embodiment excepting that the entry to and exit from the low power consumption mode are executed by the command inputs.

This embodiment can achieve effects similar to those of the foregoing first embodiment. In this embodiment, moreover, the DRAM can enter the low power consumption mode and can be released from the low power consumption mode by the command inputs using the /CE1 signal and the CE2 signal.

Figure 14:
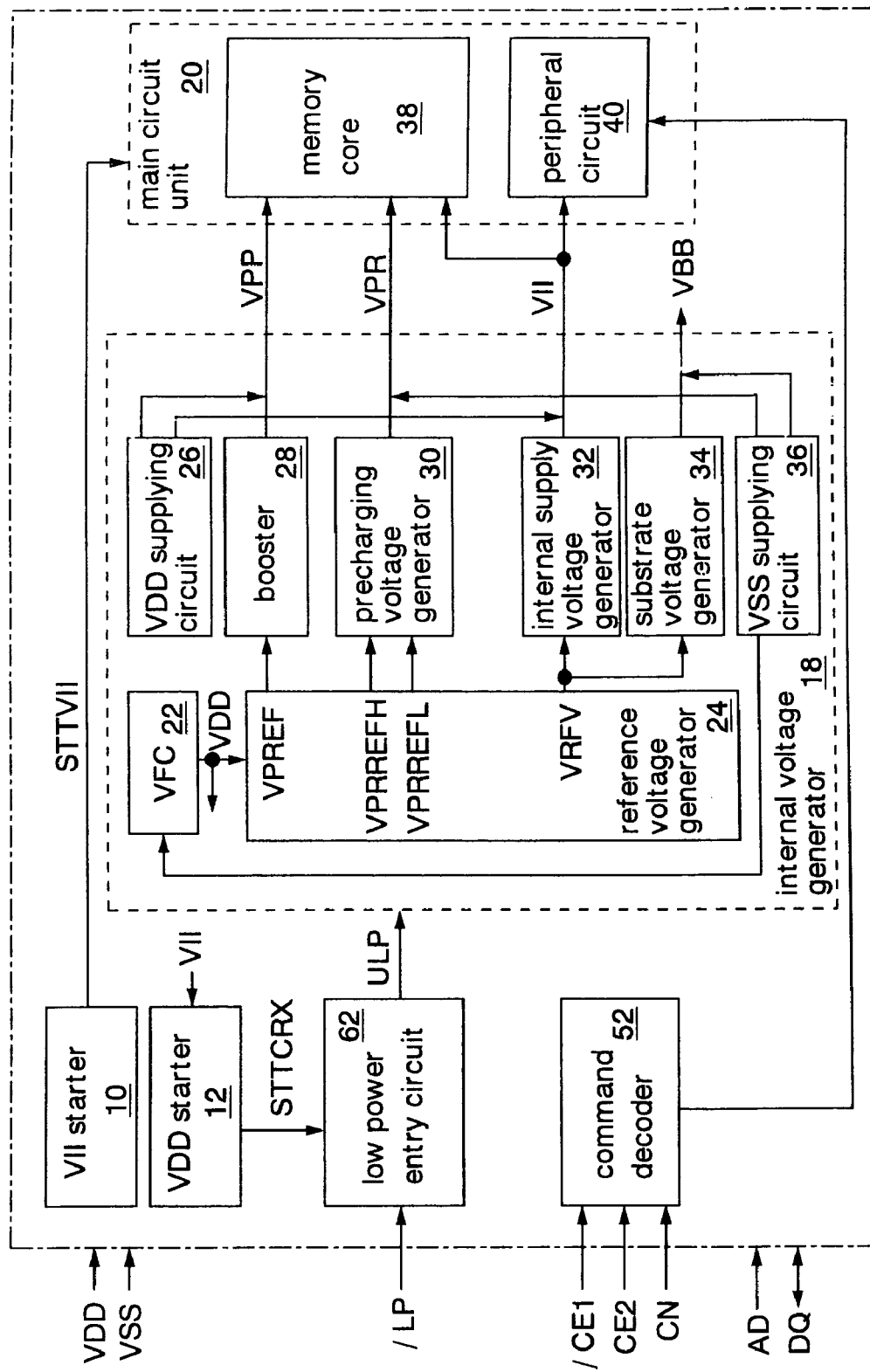
FIG. 14 is a block diagram showing a third embodiment.

FIG. 14 shows a third embodiment of the semiconductor memory device of the present invention. The same circuits as those described in the first and second embodiments are designated by the common reference numerals, and their detailed description will be omitted.

In this embodiment, a low power entry circuit 62 receives the low power consumption mode signal /LP. This low power consumption mode signal /LP is a signal dedicated for the DRAM to enter the low power consumption mode. The low power entry circuit 62 detects the falling edge of the /LP signal to bring the DRAM into the low power consumption mode. The command decoder 52 is supplied with the /CE1 signal, the CE2 signal and another control signal CN. The remaining constructions are similar to those of the foregoing first embodiment.

The operation timings of the DRAM at the switch-on of the power supply and at the entry into and the exit from the low power consumption mode according to this embodiment are identical to those of the case in which the CE2 signal is replaced by the /LP signal in the timing chart shown in FIG. 7.

This embodiment can also achieve effects similar to those of the foregoing first embodiment. In this embodiment, moreover, the DRAM can reliably enter the low power consumption mode and be released from the mode by the dedicated low power consumption mode signal /LP.

Figure 15:
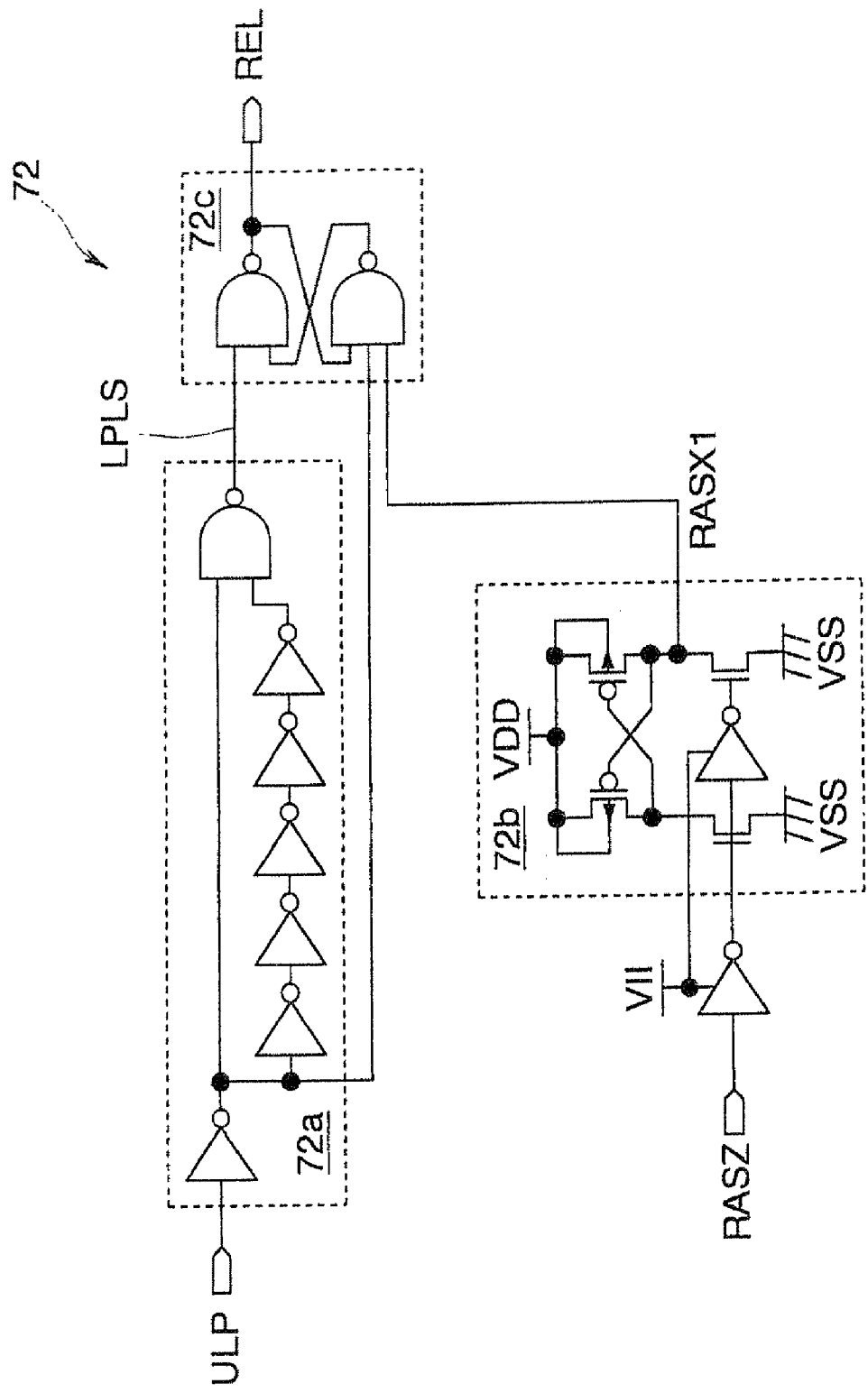
FIG. 15 is a circuit diagram showing a VII starter in a fourth embodiment.
Figure 16:
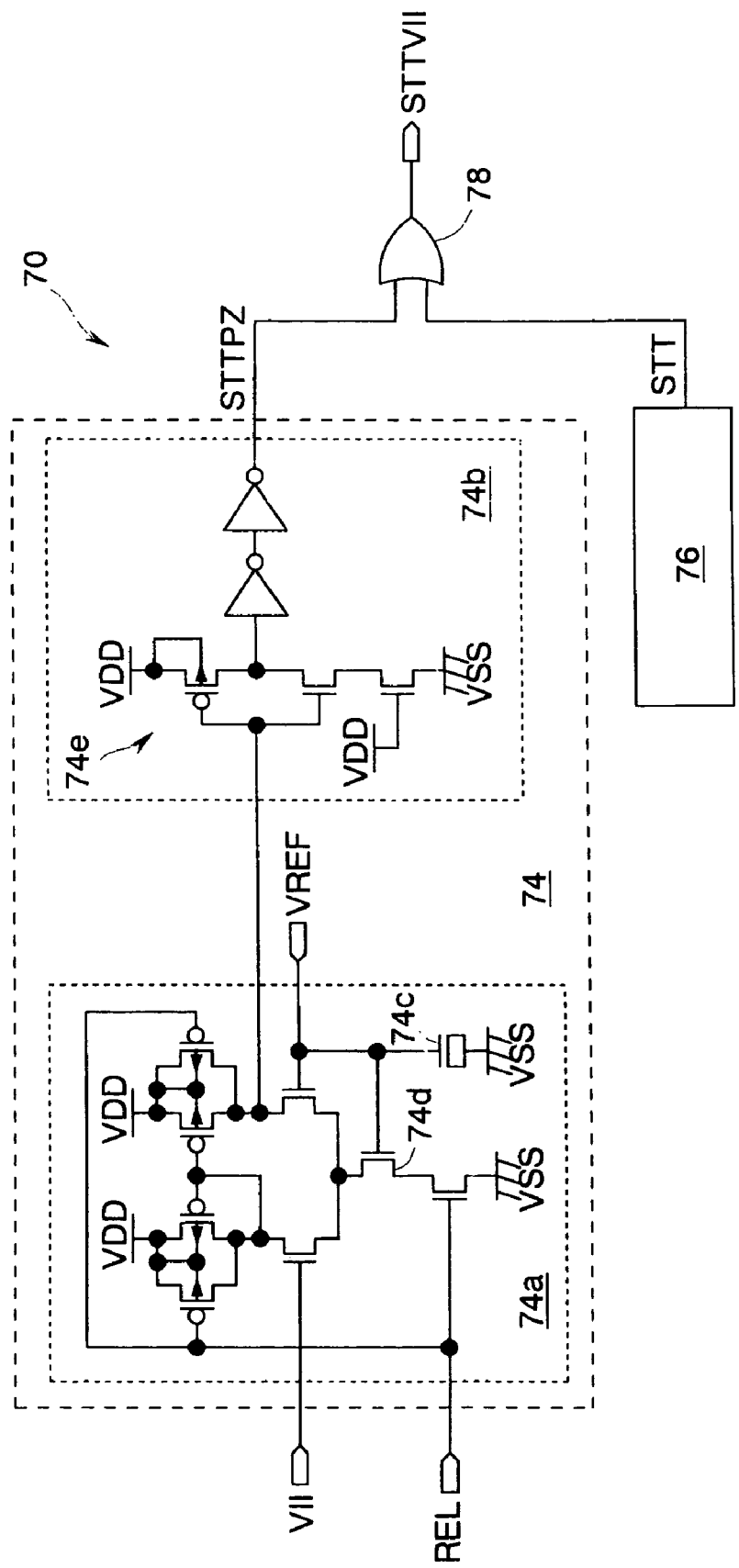
FIG. 16 is a circuit diagram showing a VII starter in the fourth embodiment.

FIGS. 15 and 16 show a VII starter in a fourth embodiment of the semiconductor memory device and a third embodiment of its control method of the present invention. The same circuits as those described in the first embodiment are designated by the common reference numerals, and their detailed description will be omitted.

In this embodiment, a VII starter 70 is formed in replace of the VII starter 10 in FIG. 3 (the first embodiment). The other configuration is identical to that in FIG. 3. In other words, the DRAM of this embodiment similar to that of FIG. 7 enters the low power consumption mode by turning the CE2 signal to low level during a high-level period of the /CE1 signal and it is released from the low power consumption mode by turning the CE2 signal to high level.

The VII starter 70 comprises a release detecting circuit 72 shown in FIG. 15, a level detecting circuit 74, and a power-on circuit 76 shown in FIG. 16. In FIGS. 15 and 16, a logic circuit is supplied with a power supply voltage VDD except the circuit with a power supply voltage indicated.

A release detecting circuit 72 comprises a detecting circuit 72a, a level shifter 72b, and a flip-flop 72c. The detecting circuit 72a receives a low power signal ULP shown in FIG. 3 and outputs the low level of a pulse LPLS in synchronization with the falling edge of the ULP signal. The level shifter 72b converts the high level voltage (internal power supply voltage VII) of a row address strobe signal RASZ to the external power supply voltage VDD and outputs a row address strobe signal RASX1 having inverted logic. The level shifter 72b is identical to the level shifter 56 shown in FIG. 12. Receiving a low pulse from the detecting circuit 72a, the flip-flop 72c turns a release signal REL to high level, and receiving a low level (RASZ=high level) from the level shifter 72b, it turns the release signal REL to low level.

In FIG. 16, a level detecting circuit 74 comprises a differential amplifier 74a including a current mirror circuit and an inverter row 74b which includes an odd number of inverters and receives the output of the differential amplifier 74a. The differential amplifier 74a is activated during the high level of the release signal REL, compares an internal power supply voltage VII with a reference voltage VREF, and outputs the comparison result to an inverter row 74b. A generator for the internal power supply voltage VII generates a constant value of the internal power supply voltage VII independent of the fluctuation of the power supply voltage VDD supplied from the exterior. On the other hand, the reference voltage VREF varies depending on the fluctuation of the power supply voltage VDD.

The output voltage of the differential amplifier 74a goes low when the internal power supply voltage VII is lower than the reference voltage VREF. The differential amplifier 74a comprises a MOS capacitor 74c for receiving the reference voltage VREF in order to prevent its response to insignificant fluctuation of the reference voltage VREF. In addition, an nMOS 74d for receiving the reference voltage VREF is disposed on a path to a ground line VSS in order to limit the amount of current flow to the ground line VSS and reduce the power consumption during the operation of the differential amplifier 74a. The nMOS 74d operates as high-resistance. An inverter 74e in the initial stage of the inverter row 74b has an nMOS connected in serial so as to have the logic threshold of an input signal in conformity with the output of the differential amplifier 74a.

A power-on circuit 76 turns a start signal STT to high level during a predetermined period since the power supply voltage is supplied to the DRAM. An OR circuit 78, upon receiving the high level of a start signal STTPZ or the high level of the start signal STT, outputs the high level of a start signal STTVII (reset signal). The start signal STTVII, similarly to that of FIG. 3, is supplied to the main circuit unit 20 and initializes a predetermined internal circuit.

Figure 17:
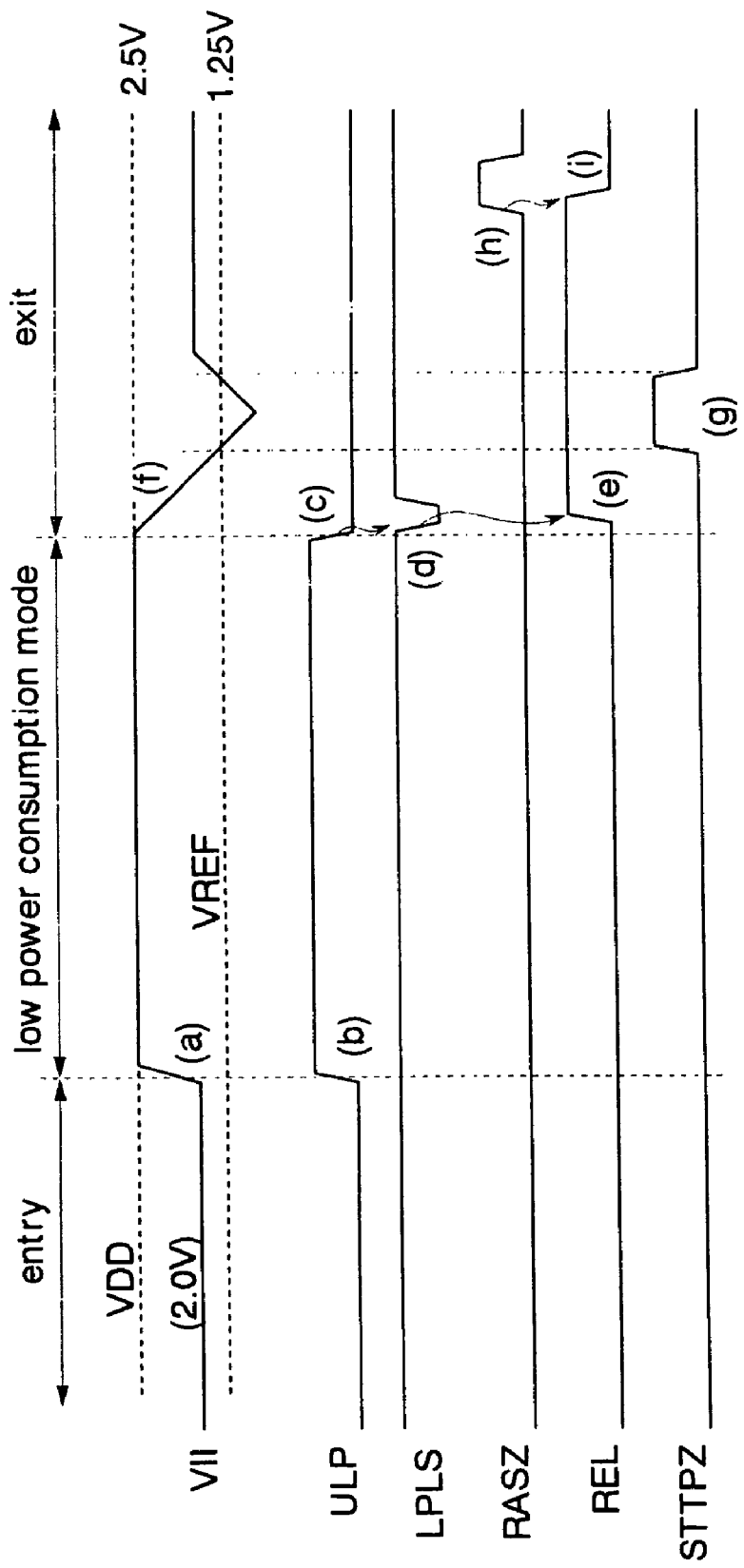
FIG. 17 is a timing chart showing operations at the entry to and the exit from a low power consumption mode in the fourth embodiment.

FIG. 17 shows the operation timings of the above-described DRAM at the time of entry to and exit from the low power consumption mode.

Firstly, when the CE2 signal (not shown) is turned to low level, the DRAM enters the low power consumption mode by a low power entry circuit 14 shown in FIG. 3 and a generator for the internal power supply voltage VII terminates its operation. The internal power supply voltage VII (for example, 2.0V in a normal operation) becomes equal to the power supply voltage VDD (for example, 2.5V)(FIG. 17(a)) and an ULP signal turns to high level(FIG. 17(b)).

Subsequently, the CE2 signal being turned to high level, the DRAM is released from the low power consumption mode and the ULP signal turns to low level(FIG. 17(c)). In other words, the DRAM is released from the low power consumption mode in accordance with the level of the CE2 signal received during the low power consumption mode. The exit from the low power consumption mode is controlled by the low power entry circuit 14 shown in FIG. 3.

Receiving the falling edge of the ULP signal, the detecting circuit 72*a* in FIG. 15 turns an LPLS signal to low level (pulse)(FIG. 17(*d*)). Receiving the low level of the LPLS signal, the flip-flop 72*c* in FIG. 15 turns the REL signal to high level (FIG. 17(*e*)).

Due to the exit from the low power consumption mode, a power supply line of the internal power supply voltage VII and that of the power supply voltage VDD are disconnected and simultaneously the generator for the internal power supply voltage VII initiates its operation. The internal power supply voltage VII goes low for some time from the initiation of the generator(FIG. 17(*f*)). The differential amplifier 74*a* in FIG. 16 outputs low level to the inverter row 74*b* when the internal power supply voltage VII is lower than the reference voltage VREF(for example, 1.25V). The inverter row 74*b*, upon receiving the low level of the differential amplifier 74*a*, outputs the high level of the STTPZ signal(FIG. 17(*g*)). The OR circuit 78, upon receiving the high level of the STTPZ signal, turns a start signal STTVII to high level. The start signal STTVII functions as a reset signal and a predetermined internal circuit of the main circuit unit 20 shown in FIG. 3 is initialized.

After the exit from the low power consumption mode, by issuing an operation command to the DRAM, the RASZ signal is turned to high level(FIG. 17(*h*)) and the REL signal to low level(FIG. 17(*i*)). The differential amplifier 74*a* is inactivated due to the low level of the REL signal.

As described above, at the time of the exit from the low power consumption mode, the initialization of the internal circuit prevents it from malfunctioning when the operation of the internal circuit supplied with the internal power supply voltage VII cannot be ensured because of the internal power supply voltage VII lower than a predetermined voltage (reference voltage VREF).

In this embodiment above, when the state of the CE2 signal received during the low power consumption mode indicates exit of the low power consumption mode, the low power consumption mode is released. This allows the easy exit of a chip from the low power consumption mode by the control signal from the exterior.

At the exit from the low power consumption mode, the start signal STTVII which is a reset signal for initializing an internal circuit is activated during a period where the internal power supply voltage VII is lower than the reference voltage VREF. This makes it possible to securely reset the internal circuit and prevent the malfunction of the internal circuit when the low power consumption mode shifts to the normal operating mode.

One control signal(CE2 signal) enables the entry of a chip to the low power consumption mode and the exit of a chip from the low power consumption mode.

Figure 18:
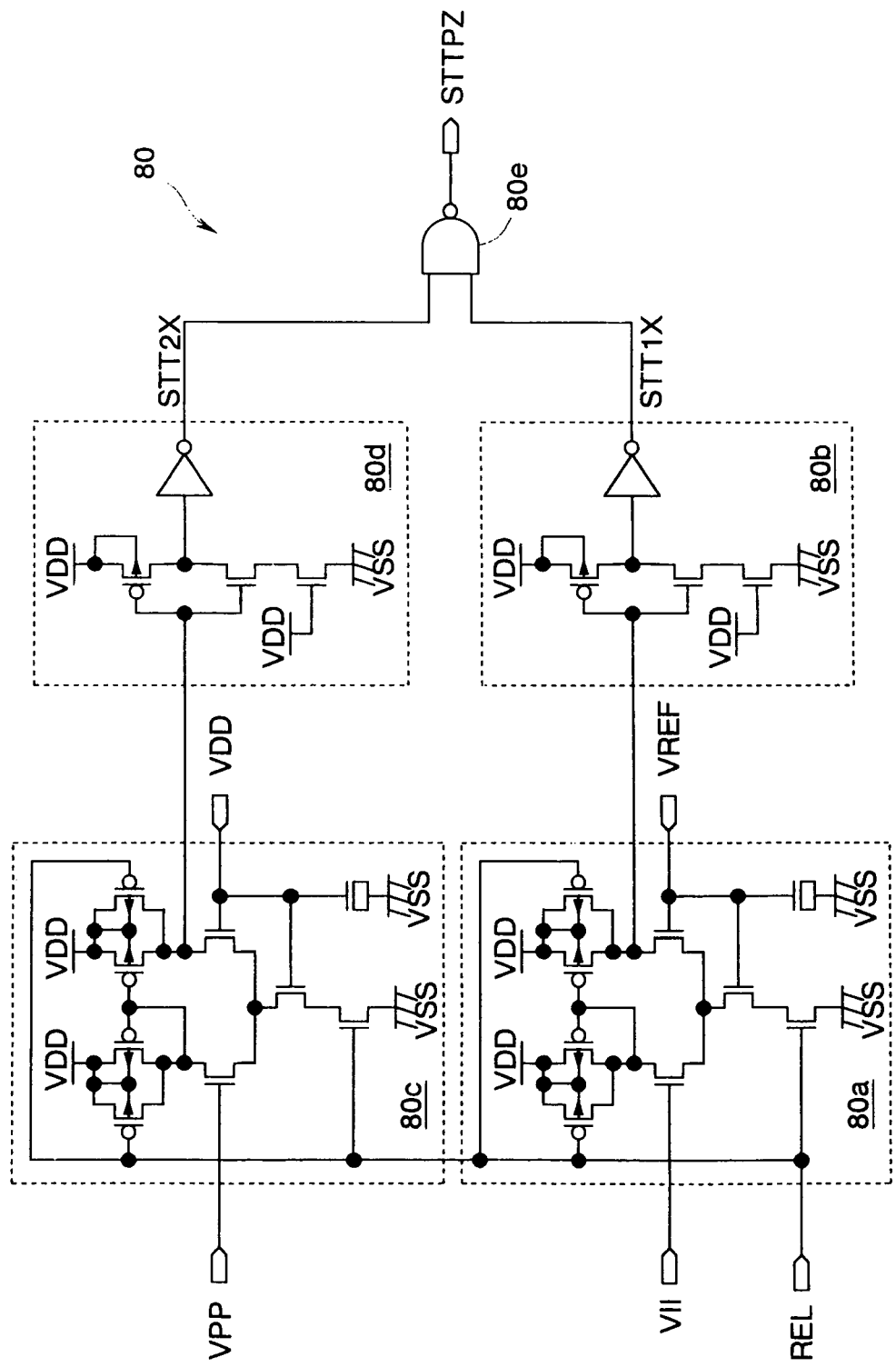
FIG. 18 is a circuit diagram showing a level detecting circuit in a fifth embodiment.

FIG. 18 shows a level detecting circuit 80 in a fifth embodiment of the semiconductor memory device and its control method of a fourth embodiment of the present invention. The same circuits as those described in the first and forth embodiments are designated by the common reference numerals, and their detailed description will be omitted.

In this embodiment, a level detecting circuit 80 is formed in replace of the level detecting circuit 74 described in the forth embodiment. The other configuration is identical to that in the forth embodiment.

The level detecting circuit 80 comprises: a differential amplifier 80 for comparing the internal power supply voltage VII with the reference voltage VREF; an inverter row 80*b* including an even number of inverters; a differential amplifier 80*c* for comparing a boost voltage VPP of a word line (not shown) with the power supply voltage VDD from the exterior; an inverter row 80*d* including an even number of inverters; and an NAND gate 80*e*. The boost voltage VPP generated by a booster is formed inside of the chip. The differential amplifiers 80*a* and 80*c* are identical to the differential amplifier 74*a* in FIG. 16 and are activated upon receipt of the high level of the REL signal. The inverter rows 80*b* and 80*d* are constructed of the inverter in the initial stage and the inverter in the second stage of the inverter row 74*b* in FIG. 16. The inverter row 80*b* receives the output of the differential amplifier 80*a* and outputs the received logic level to a NAND gate 80*e* as a start signal STT1X. The inverter row 80*d* receives the output of the differential amplifier 80*c* and outputs the received logic level to the NAND gate 80*e* as a start, signal STT2X. The NAND gate 80*e* operates as an OR circuit of negative logic and outputs a start signal STTPZ.

Figure 19:
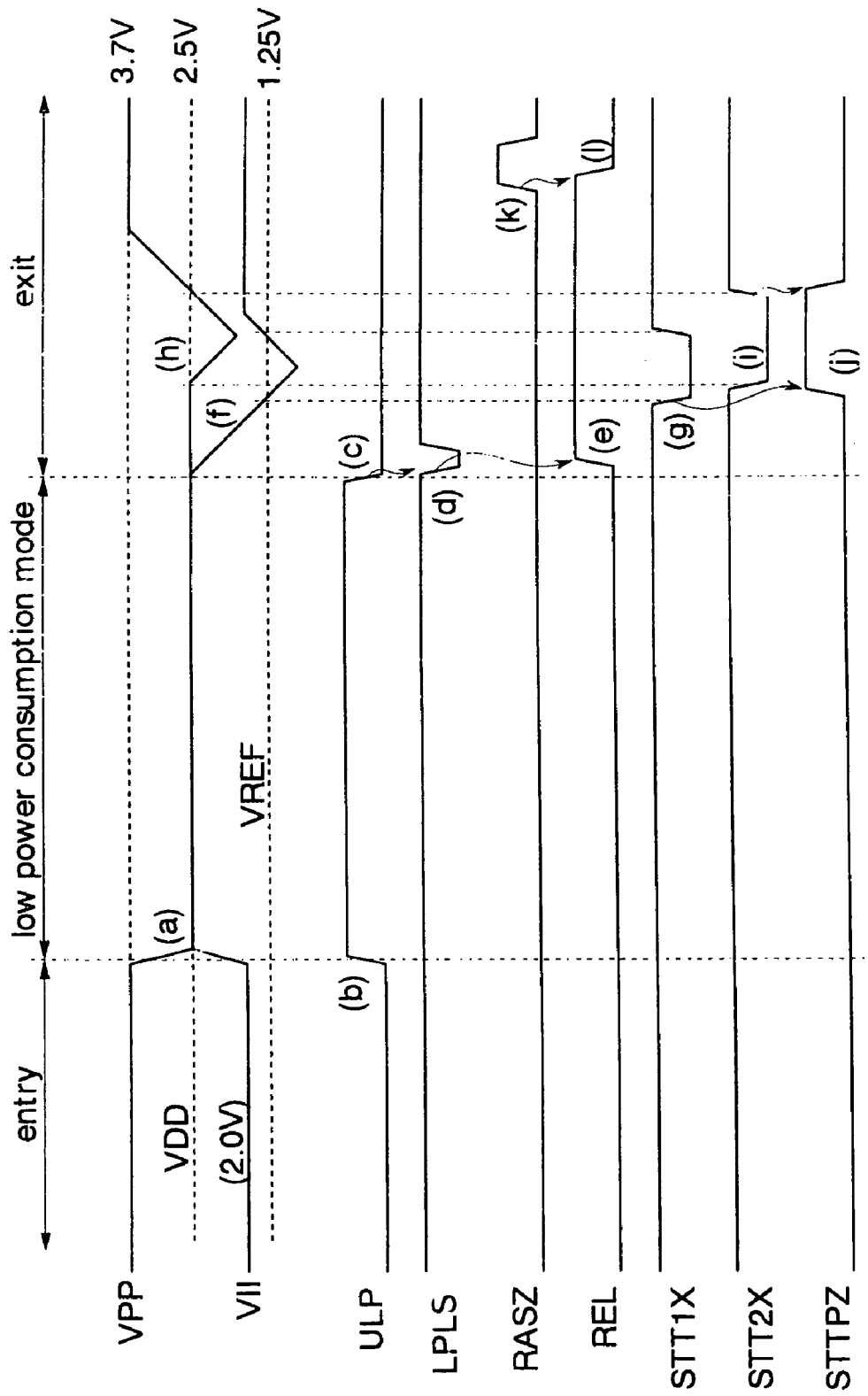
FIG. 19 is a timing chart showing operations at the entry to and the exit from a low power consumption mode in the fifth embodiment.

FIG. 19 shows the operation timings of the above-described DRAM at the time of entry to and exit from a low power consumption mode.

Firstly, when the CE2 signal(not shown) is turned to low level, the DRAM enters the low power consumption mode and a generator for the internal power supply voltage VII and a generator for the boost voltage VPP terminate their operation. The internal power supply voltage VII (for example, 2.0V in the normal operation) and the boost voltage VPP (for example, 3.7V in the normal operation) become equal to the power supply voltage VDD (for example, 2.5V)(FIG. 19(*a*)) and an ULP signal turns to high level (FIG. 18(*b*)).

Subsequently, the CE2 signal being turned to high level, the DRAM is released from the low power consumption mode and the ULP signal turns to low level (FIG. 19(*c*)). The LPLS signal is turned to low level (pulse) as well as in FIG. 17 (FIG. 19(*d*)) and the REL signal is turned to high level (FIG. 19(*e*)).

Due to the exit from the low power consumption mode, the power supply line of the internal power supply voltage VII and the power supply line of the power supply voltage VDD are disconnected and the generator for the internal power supply voltage VII initiates its operation. The internal power supply voltage VII goes low for some time from the initiation of the generator(FIG. 19(*f*)). The low level of the STT1X signal is output during a period where the internal power supply voltage VII is lower than the reference voltage VREF (for example, 1.25V) (FIG. 19(*g*)). Similarly, the connection between the power supply line of the boost voltage VPP and that of the power supply voltage VDD is disconnected and the generator for the boost voltage VPP initiates its operation. The boost voltage VPP goes low for some time from the initiation of the generator (FIG. 19(*h*)). The low level of the STT2X signal is output during a period where the boost voltage VPP is lower than the power supply voltage VDD (FIG. 19(*i*)).

The NAND gate 80*e* in FIG. 18 outputs the high level of the STTPZ signal during a period where the STT1X signal or the STT2X signal is at low level (FIG. 19(*j*)). During the high level of the STTPZ signal, the start signal STTVII (FIG. 16) is turned to high level. The start signal STTVII functions as a reset signal and initializes a predetermined internal circuit of the main circuit unit 20 shown in FIG. 3.

After the exit from the low power consumption mode, the DRAM initiates its operation, thereby the RASZ signal being turned to high level (FIG. 19(*k*)) and the REL signal to low level(FIG. 19(*l*)) as well as in FIG. 17. The differential amplifier 80*a* and 80*c* are inactivated due to the low level of the REL signal.

This embodiment can also achieve effects similar to those of the foregoing fourth embodiment. In this embodiment, moreover, at the time of the exit from the low power consumption mode a start signal STTVII for initializing an internal circuit is activated during a period where the boost voltage VPP internally generated is lower than the power supply voltage VDD from the exterior. Specifically, at the time of the exit from the low power consumption mode, the start signal STTVII for initializing an internal circuit is activated during a period where at least one of the internal power supply voltage VII and is/are respectively lower than the reference voltage VREF and the power supply voltage VDD. This makes it possible to securely reset the internal circuit and prevent the malfunction of the internal circuit when the low power consumption mode shifts to the normal operating mode.

Figure 20:
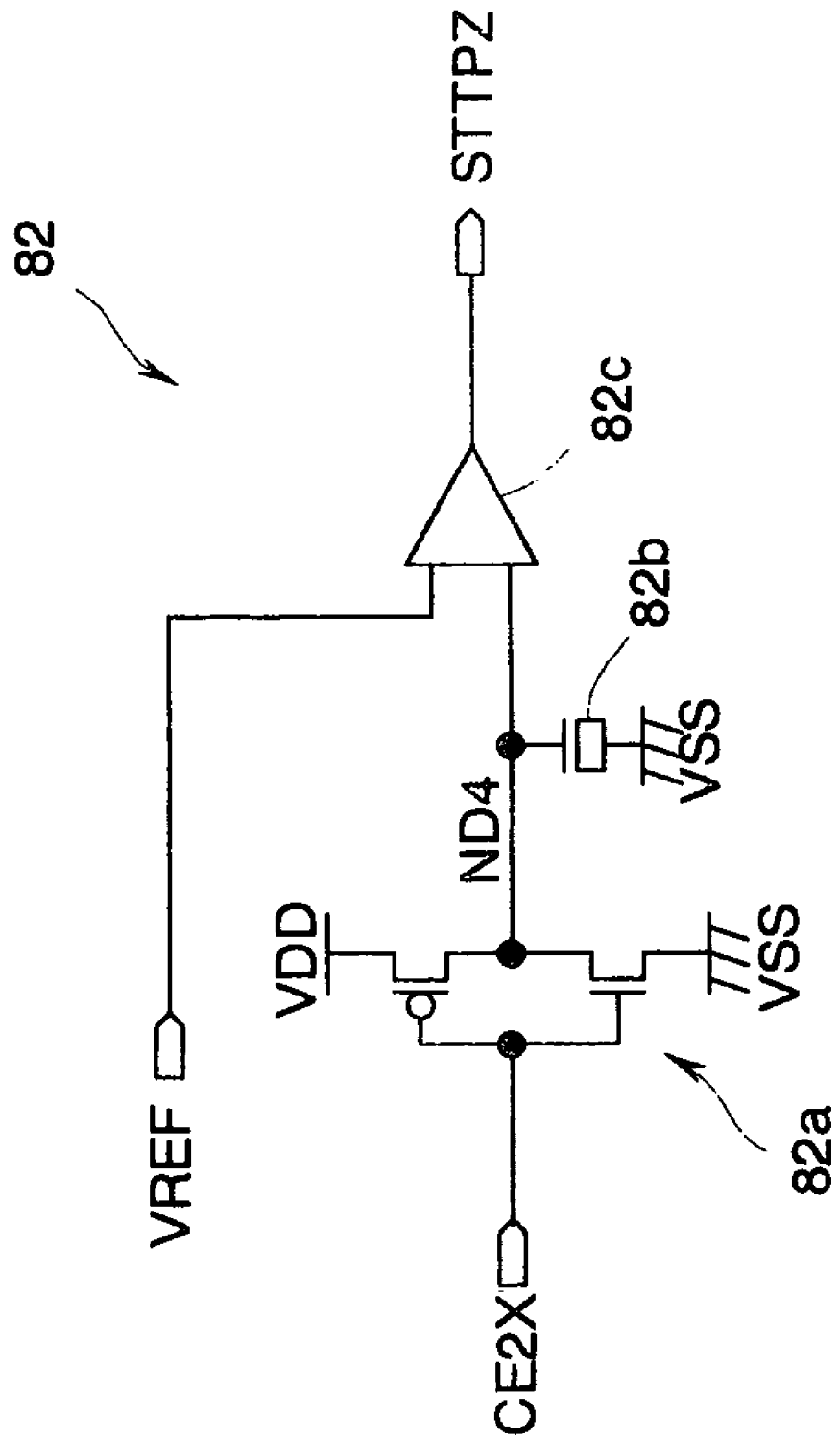
FIG. 20 is a circuit diagram showing a start signal generator in a sixth embodiment.

FIG. 20 shows a start signal generator of the semiconductor memory device in a sixth embodiment and its control method of a fifth embodiment of the present invention. The same circuits as those described in the first and forth embodiments are designated by the common reference numerals, and their detailed description will be omitted.

In the DRAM of this embodiment, a start signal generator 82 is formed in replace of the release detecting circuit 72 and the level detecting circuit 74 described in the forth embodiment. The other configuration is identical to that in FIG. 3 (the first embodiment).

The start signal generator 82 are constructed of a CMOS inverter 82a for receiving a CE2X signal (internal signal) which is an inverted CE2 signal, a MOS capacitor 82b connected with the output of the CMOS inverter 82a, and a differential amplifier 82c for receiving the input of the CMOS inverter 82a and the reference voltage VREF. The differential amplifier 82c comprising a current mirror circuit, turns a start signal STTPZ to high level when the voltage of a node ND4 is lower than the reference voltage VREF.

The pMOS of the CMOS inverter 82a has a long channel length to have high on-resistance. A CR time constant circuit is constructed of the pMOS of the CMOS inverter 82a and the MOS capacitor 82b. Utilizing the on-resistance of a transistor to construct the CR time constant circuit allows the layout to be reduced in size than the case of utilizing diffused resistance.

Figure 21:
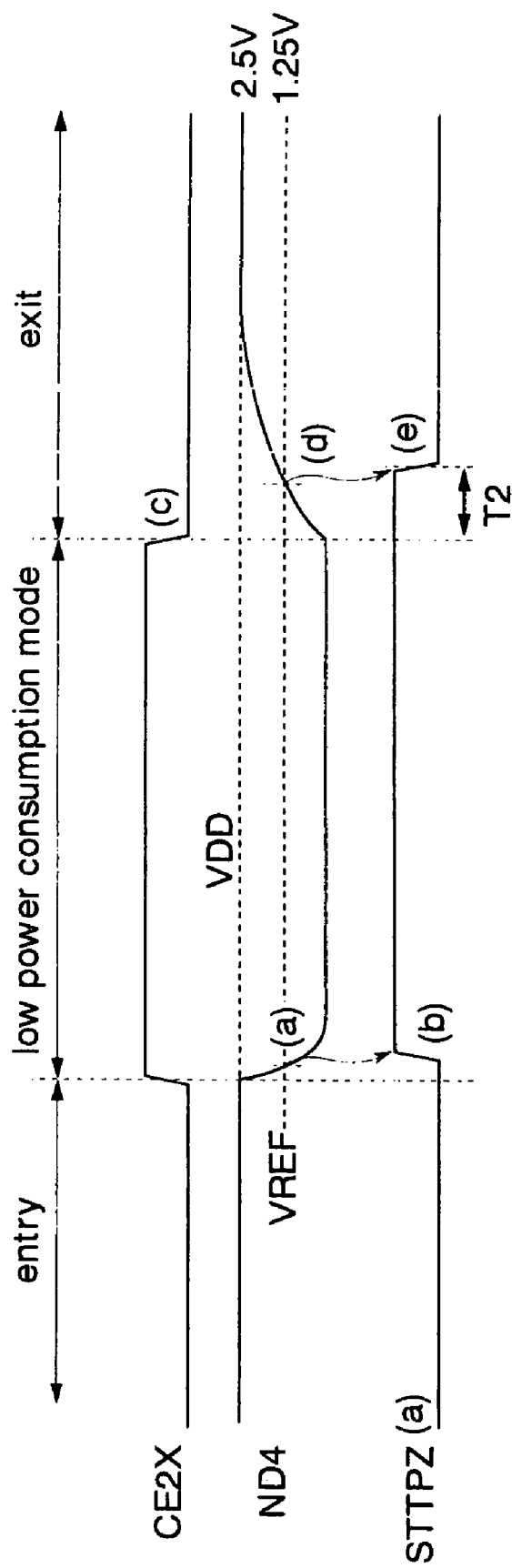
FIG. 21 is a timing chart showing operations at the entry to and the exit from a low power consumption mode in the sixth embodiment.

FIG. 21 shows the operation timings of the above-described DRAM at the time of entry to and exit from the low power consumption mode.

Firstly, when the CE2 signal (not shown) is turned to low level, the CE2X signal is turned to high level and the DRAM enters the low power consumption mode. A generator for the internal power supply voltage VII and a generator for the boost voltage VPP terminate their operation. The CMOS inverter 82a in FIG. 20 upon receiving the high level of the CE2X signal, turns the nMOS on and a node ND4 to low level (FIG. 21(a)). The differential amplifier 82c turns a STTPZ signal to high level when the voltage of the node ND4 is lower than the reference voltage VREF (FIG. 21(b)).

Subsequently, the CE2 signal being turned to high level and the CE2X signal to low level, the DRAM is released from the low power consumption mode (FIG. 21(c)). The CMOS inverter 82 in FIG. 20 upon receiving the low level of the CE2X signal, turns the pMOS on and the node ND4 to high level (FIG. 21(d)). At this time the voltage of the node ND4 gradually rises in accordance with the time constant determined by the on-resistance of the pMOS and the CMOS capacitor. The differential amplifier 82c turns the STTPZ signal to low level when the voltage of the node ND4 is higher than the reference voltage VREF (FIG. 21(e)).

Consequently, the STTPZ signal(reset signal) is activated (high level) and the internal circuit is initialized during a period T2 from the exit from the low power consumption mode. The period T2 is set after the exit from the low power consumption mode in correspondence with a period where the internal power supply voltage VII is lower than a predetermined voltage so that the operation of the internal circuit supplied with the internal power supply voltage VII can not be ensured. In other words, the start signal generator 82 operates as a timer for determining the length of the period T2.

This embodiment can also achieve effects similar to those of the foregoing fourth embodiment. In this embodiment, moreover, at the time of the exit from the low power consumption mode the start signal generator 82 is operated as a timer to generate the STTPZ signal and the internal circuit is initialized during the period T2 after the exit from the low power consumption mode. This makes it possible to reliably reset the internal circuit and prevent the malfunction of the internal circuit when the low power consumption mode shifts to the normal operating mode.

Since the start signal generator 82 is operated as a CR time constant circuit, it is possible to set the period T2 based on the propagation delay time of a signal propagated to the CR time constant circuit. This makes it possible to set a period necessary for resetting the internal circuit by a simple circuit.

The on-resistance of the pMOS is utilized to form the CR time constant circuit so that the layout of the start signal generator 82 can be reduced in size.

Figure 22:
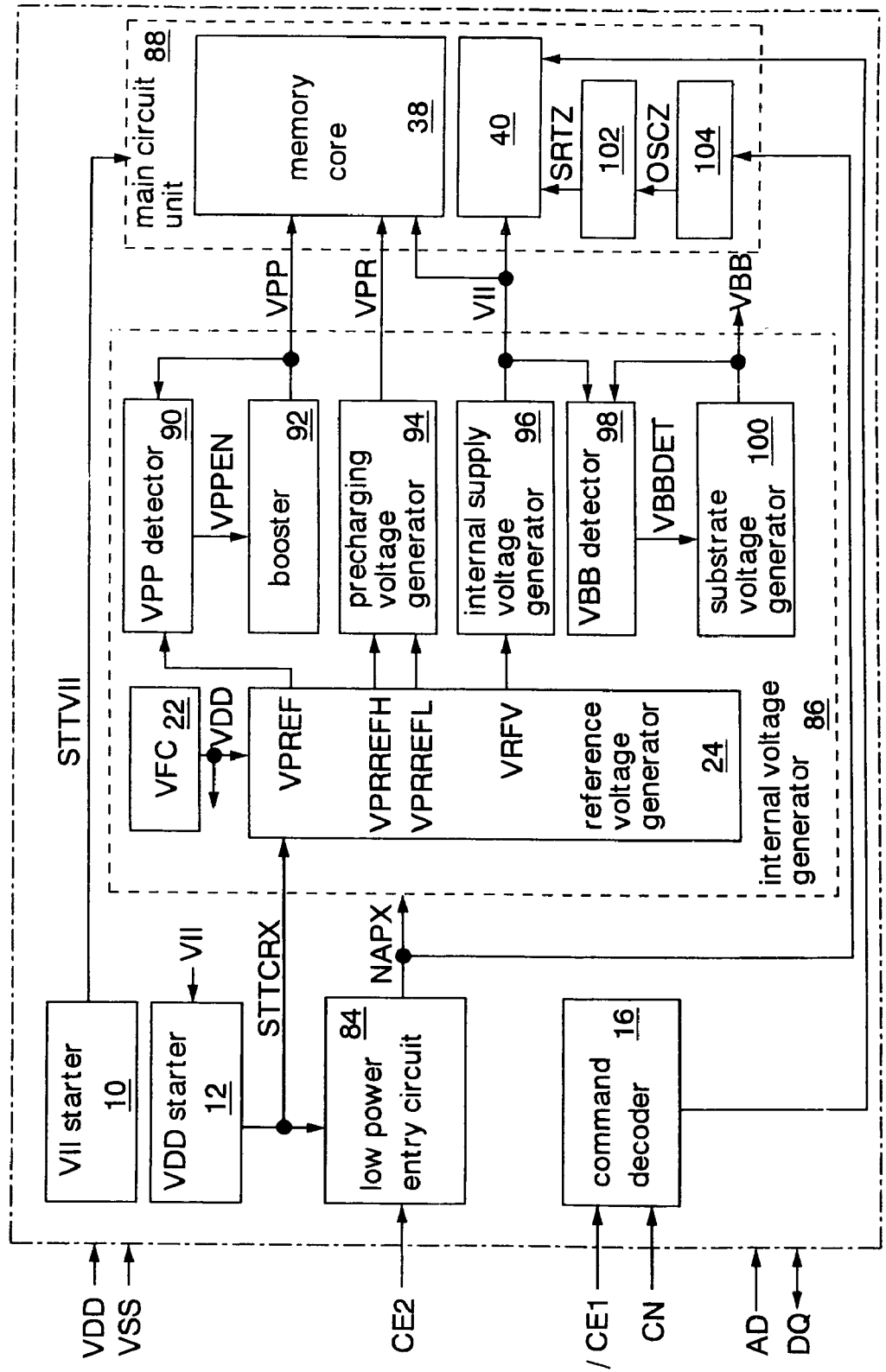
FIG. 22 is a block diagram showing a seventh embodiment.

FIG. 22 shows a seventh embodiment of a semiconductor memory device and a method of controlling the same in the present invention. Here, the same circuits as those described in the first embodiment will not be described in detail by designating them by the common reference numerals.

In this embodiment, the DRAM includes the VII starter 10, the VDD starter 12, a low power entry circuit 84, the command decoder 16, an internal voltage generator 86 and a main circuit unit 88. The internal voltage generator 86 has the low-pass filter 22, the reference voltage generator 24, a VPP detector 90, a booster 92, a precharging voltage generator 94, an internal supply voltage generator 96, a VBB detector 98 and a substrate voltage generator 100. The main circuit unit 88 has the memory core 38, the peripheral circuit 40, a frequency divider 102 and an oscillator 104. These frequency divider 102 and oscillator 104 are control circuits for generating timing signals to execute the refresh operations automatically in the self-refresh mode.

Figure 23:
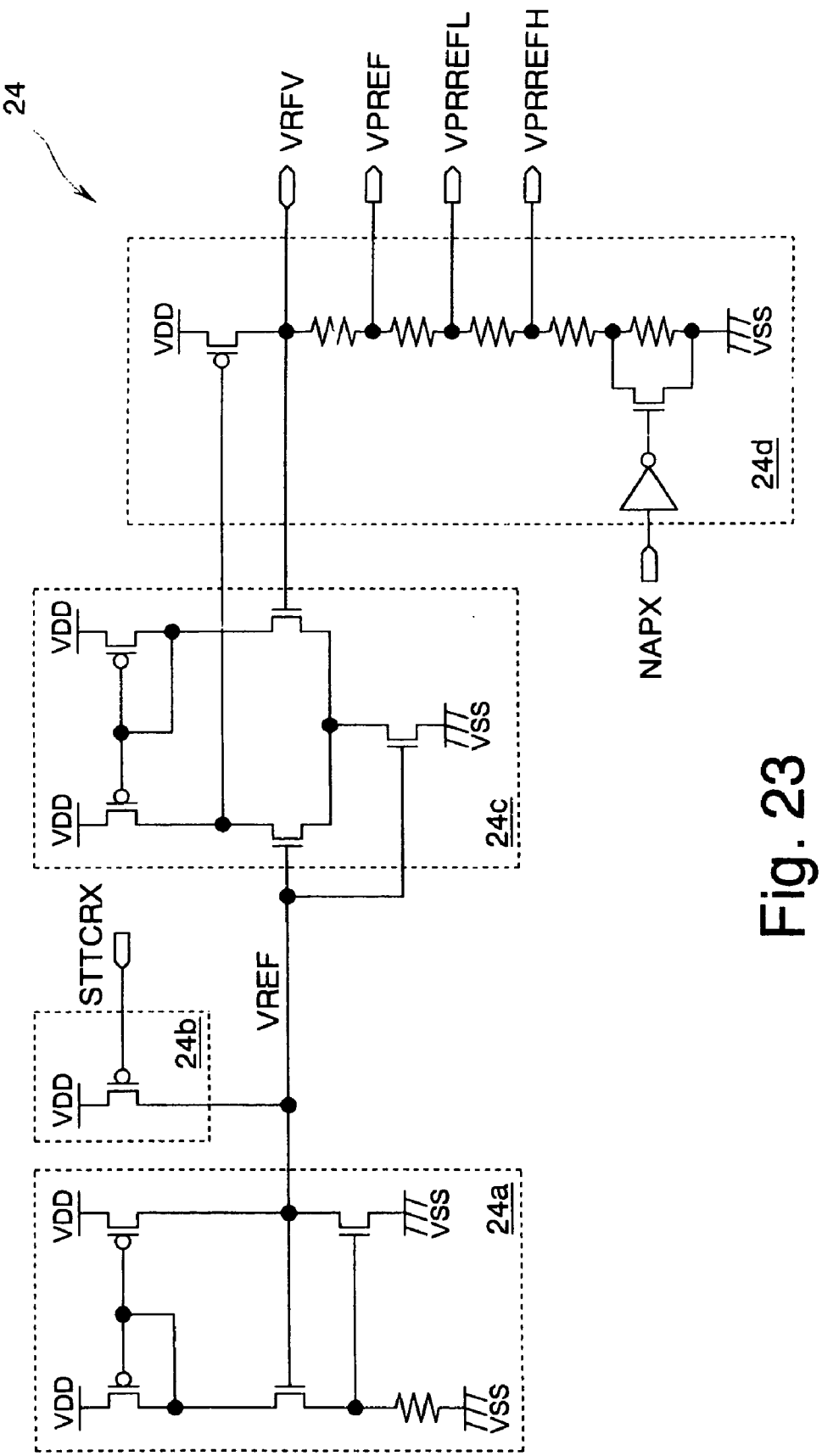
FIG. 23 is a circuit diagram showing the detail of a reference voltage generator of FIG. 22.

FIG. 23 shows the detail of the reference voltage generator 24.

The reference voltage generator 24 is provided with a reference voltage generator 24a for generating a reference voltage VREF, a starter 24b consisting of pMOS, a differential amplifier 24c, and a regulator 24d.

The reference voltage generator 24a has a current mirror circuit made of a pMOS, two nMOSes connected individually in series with the current mirror circuit, and a register connected between the source of one of the nMOSes and the ground line VSS. The output of the reference voltage generator 24a is connected with the gate of one nMOS and the drain of the other nMOS, from which the reference voltage VREF is generated. The gate of the other nMOS is connected with the source of the one nMOS.

The starter 24b raises the reference voltage VREF to the high level while the start signal STTCRX is activated after the power-on.

The differential amplifier 24c has a current mirror part made of pMOSes, a differential input part made of nMOSes and an nMOS supplying the gate with reference voltage and connecting the differential input part with the ground line VSS. The one nMOS of the differential input part is supplied at its gate with the reference voltage VREF, and the other nMOS is supplied at its gate with the reference voltage VRFV.

The regulator 24d is constructed by connecting a pMOS and five resistors in series between the power supply line VDD and the ground line VSS. From the connection nodes of the individual elements, there are individually outputted reference voltages VRFV, VPREF, VPRREFL and VPRREFH. With the two terminals of the resistor connected with the ground line VSS, there are connected the source and drain of the nMOS which is controlled by a low power signal NAPX. The resistor, as connected with the ground line VSS, is bypassed when the low power signal NAPX is activated (to a low level). During the low power consumption mode, therefore, the levels (absolute values) of the reference voltages VRFV, VPREF, VPRREFL, and VPRREFH vary, thereby lowering the voltages, compared with the normal operation mode.

Figure 24:
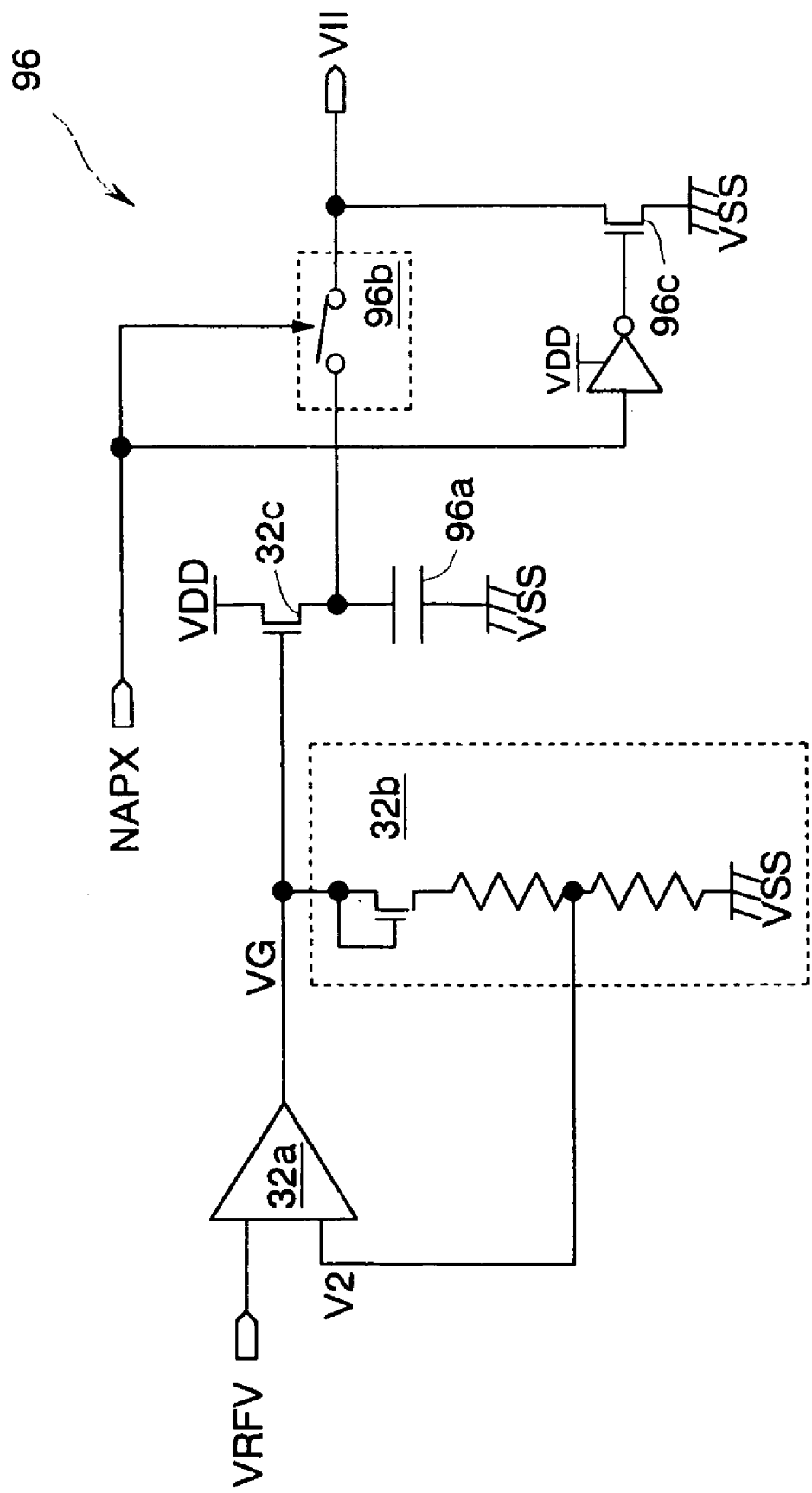
FIG. 24 is a circuit diagram showing the detail of an internal supply voltage generator of FIG. 22.

FIG. 24 shows the detail of the internal supply voltage generator 96.

This internal supply voltage generator 96 is constructed by eliminating the switch circuit 32e and the nMOS 32d from the VII internal supply voltage generator 32 of the first embodiment shown in FIG. 5 and by adding a stabilized capacitor 96a, a switch 96b, and an nMOS 96c. The stabilized capacitor 96a stores a portion of the electric charge supplied to the internal power supply line VII to reduce the shift of the power supply voltage VII, as might otherwise be caused by the power supply noise. The switch 96b is formed of a CMOS transmission gate, for example. The nMOS 96c, as arranged between the internal power supply line VII and the ground line VSS, is supplied at its gate with the inverted logic of the low power signal NAPX through an inverter.

The switch 96b is turned off, when the low power signal NAPX is activated, to disconnect the regulator 32c and the internal circuit. At this time, the nMOS 96c is turned off so that the internal power supply line VII drops to the ground voltage (0V). The power supply voltage VII is not supplied to the internal circuit so that the leakage current of the transistor or the like in the internal circuit does not occur during the power consumption mode. Specifically, the power consumption of the internal circuit can be lowered to zero. At this time, the connection between the regulator 32c and the stabilized capacitor 96a is kept so that the stabilized capacitor 96a stores the electric charge as in the normal operation.

After the low consumption mode is released, the switch 96b is turned on when the low power signal NAPX is inactivated. Simultaneously with this, the nMOS 96c is turned off to connect the regulator 32c and the internal circuit. At this time, not only the electric charge supplied from the regulator 32c but also the electric charge stored in the stabilized capacitor 96a is supplied to the internal power supply line VII so that this internal power supply voltage VII is raised and supplied to the internal circuit. As a result, this internal circuit can be operated immediately after the low power consumption mode is released.

Figure 25:
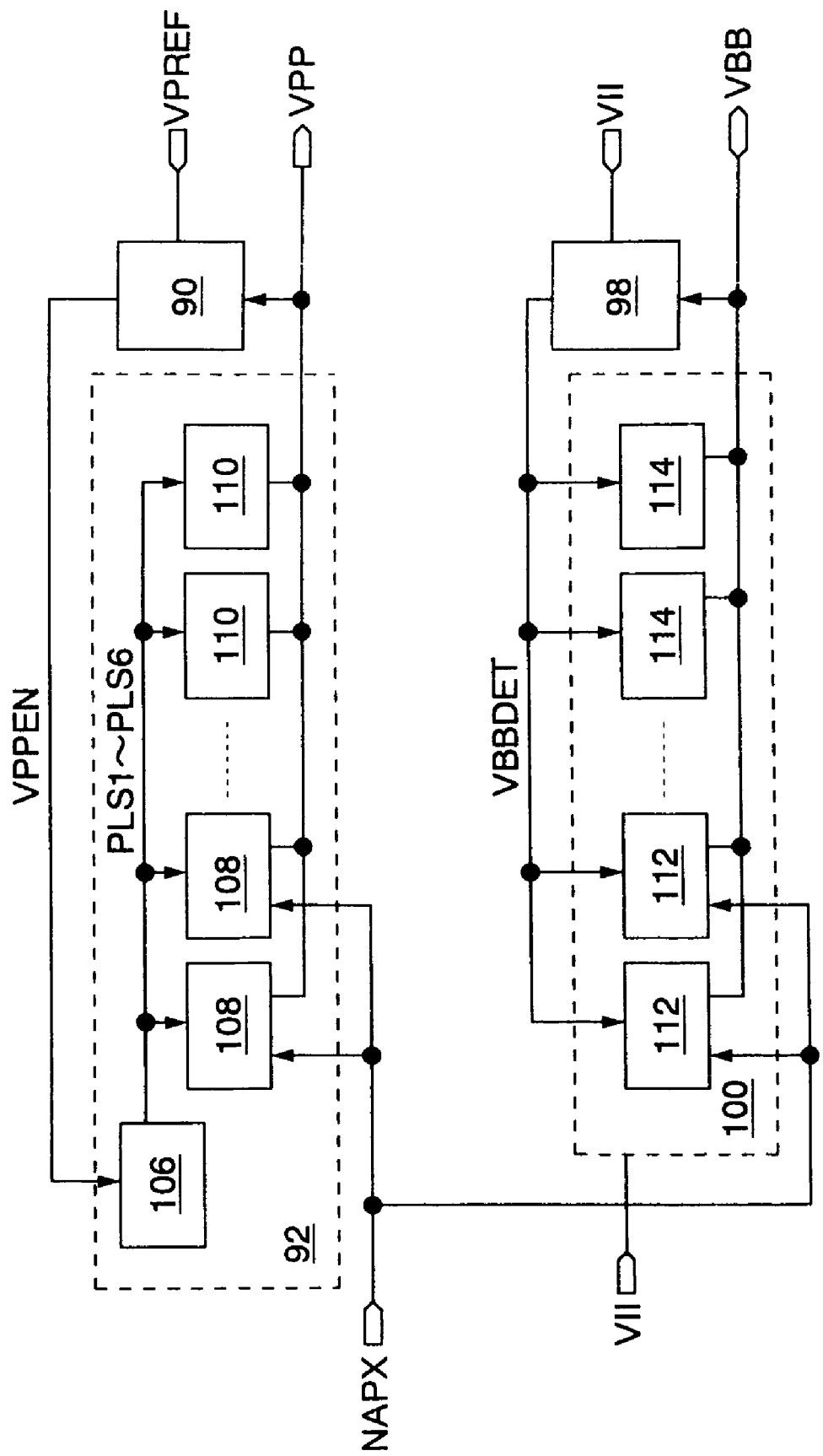
FIG. 25 is a block diagram showing a booster, a VPP detector, a substrate voltage generator and a VBB detector.

FIG. 25 shows the booster 92, the VPP detector 90, the substrate voltage detector 100 and the VBB detector 98.

The booster 92 is provided with an oscillator 106 to be operated when a boost enable signal VPPEN is activated, and a plurality of units 108 and 110. The unit 108 receives pulse signals PLS1-PLS6 from the oscillator 106 to generate the boost voltage VPP when the low power signal NAPX is activated. The unit 110 generates the boost voltage VPP at all times in response to the pulse signals PLS1 -PLS6 from the oscillator 106, irrespective of the low power signal NAPX. On the basis of the activation of the low power signal NAPX, the unit 108 stops its operation so that the power consumption of the booster 92 is lowered during the power consumption mode. In this low power consumption mode, the refreshing operation is not executed so that no problem arises even if the drivability of the booster 92 drops, as will be described hereinafter. The number of the units 110 to be operated at all times irrespective of the operation mode is determined according to the time period (i.e., the timing specification) till the normal operation or the refreshing operation is executed after the return from the low power consumption mode.

The substrate voltage generator 100 is provided with a plurality of units 112 to be operated by activating a substrate voltage detection signal VBBDET and inactivating the low power signal NAPX, and a plurality of units 114 to be operated by activating the substrate voltage detection signal VBBDET. When the operations of the units 12 are stopped on the basis of the activation of the low power signal NAPX, the power consumption of the substrate voltage generator 100 drops during the power consumption mode. The number of the units 114 to be operated at all times irrespective of the operation mode is determined according to the time period (i.e., the timing specification) after the return from the low power consumption mode to the execution of the normal operation or the refreshing operation.

Figure 26:
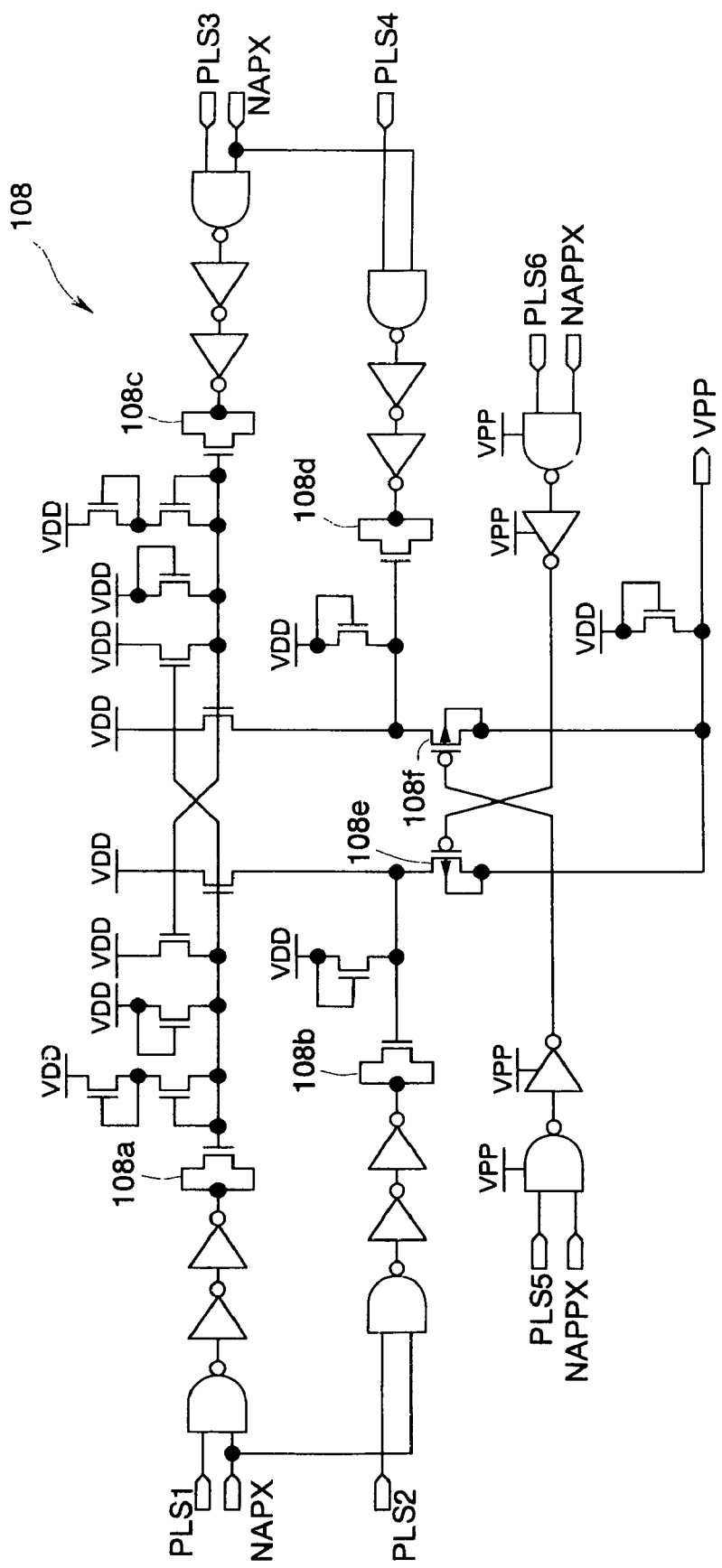
FIG. 26 is a circuit diagram showing the detail of a unit of the booster of FIG. 25.

FIG. 26 shows the detail of the unit 108 of the booster 92.

This unit 108 has four capacitors 108a, 108b, 108c and 108d each made of an nMOS, and pMOSes 108e and 108f to operate as switches. The capacitors 108a, 108b, 108c and 108d receive the inverted logics of pulse signals PLS1, PLS2, PLS3 and PLS4, respectively, at their one-side terminals when the low power signal NAPX is inactivated. The other terminals of the capacitors 108a-108d are connected with the power supply line VDD through a plurality of diode-connected nMOSes. The gates of the pMOSes 108e and 108f receive pulse signals PLS5 and PLS6, respectively, at their gates through the logic gates when the low power signal NAPPX is inactivated.

The pulse signals PLS1, PLS2 and PLS5 and the pulse signals PLS3, PLS4 and PLS6 are in opposite phases to each other. The high-level voltages of the low power signal NAPX and the pulse signals PLS5 and PLS6 are so equalized to the boost voltage VPP as to turn off the pMOSes 108e and 108f reliably.

The capacitors 108a and 108b, and 108c and 108d are alternately charged and discharged in response to the pulse signals PLS1, PLS2, PLS3 and PLS4 inputted. The pMOSes 108e and 108f are alternately turned on in synchronization with the pumping operations of the capacitors 108a and 108b, and the capacitors 108c and 108d. By these pumping operations, moreover, the power supply voltage VDD is boosted to the boost voltage VPP. The unit 108 stops its operation when the low power signal NAPX is activated.

Figure 27:
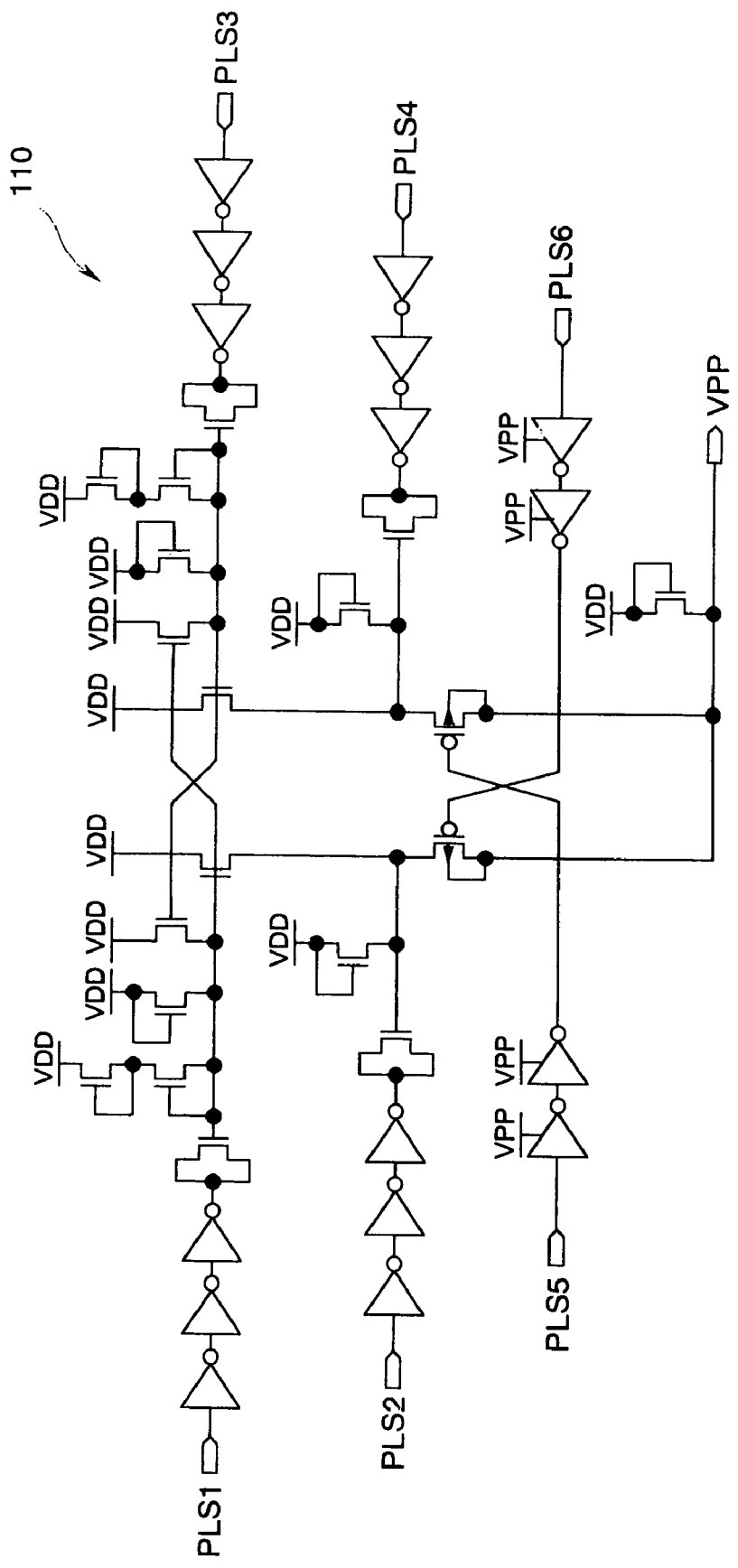
FIG. 27 is a circuit diagram showing the detail of the unit of the booster of FIG. 25.

FIG. 27 shows the detail of the unit 110 of the booster 92.

This unit 110 is a circuit which is made by eliminating the logics of the low power signals NAPX and NAPPX from the unit 108. In other words, the unit 110 operates at all times after the power supply on to generate the boost voltage VPP.

Figure 28:
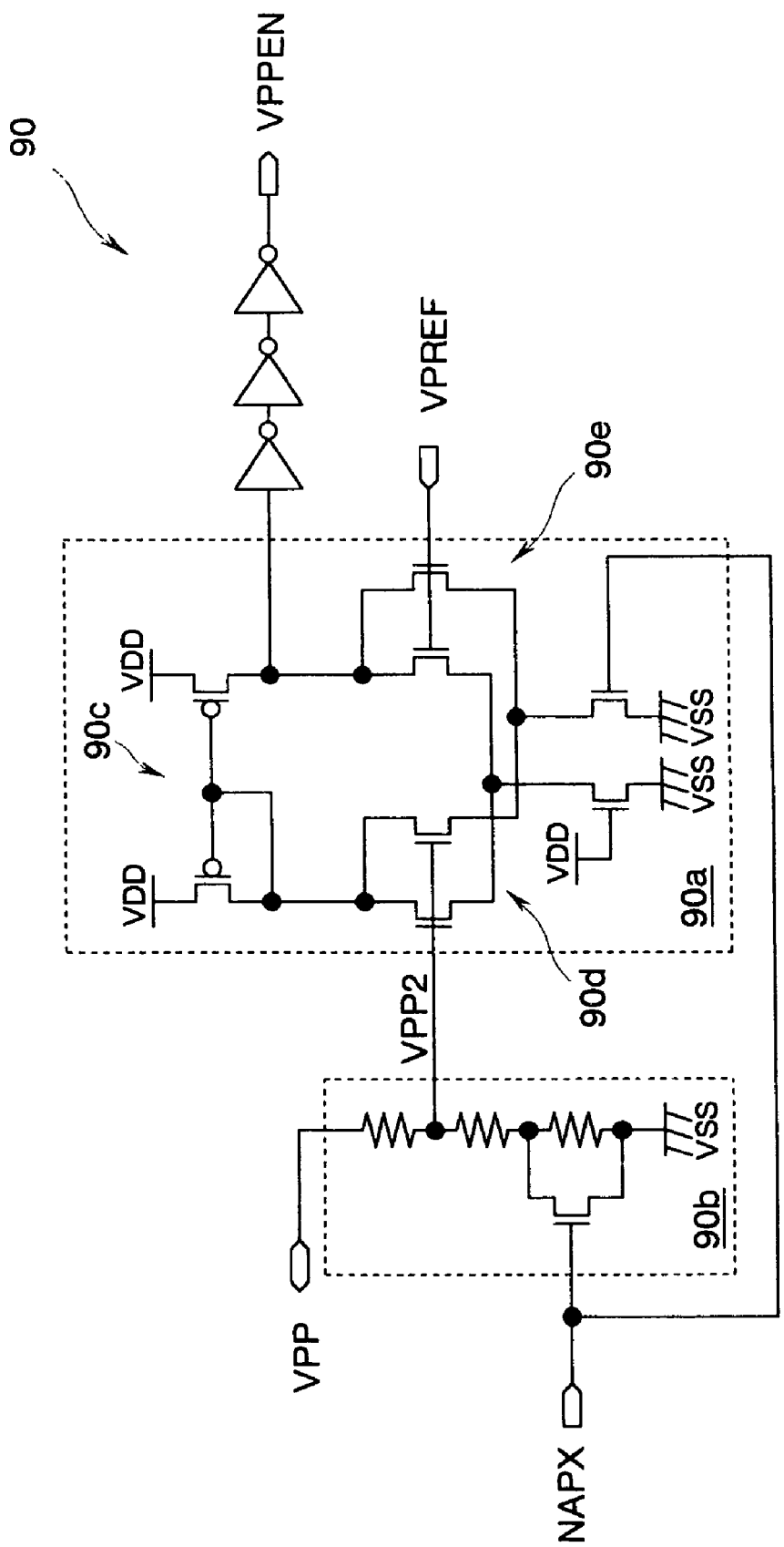
FIG. 28 is a circuit diagram showing the detail of the VPP detector of FIG. 22.

FIG. 28 shows the detail of the VPP detector 90.

This VPP detector 90 is provided with a differential amplifier 90a and a voltage generator 90b for supplying its voltage to one input of the differential amplifier 90a.

This differential amplifier 90a has a current mirror part 90c composed of pMOSes, and a pair of differential input parts 90d and 90e composed of nMOSes. Both the inputs of the differential input parts 90d and 90e receive the reference voltage VPREF and a control voltage VPP2 which is generated by shifting the level of the boost voltage VPP from the voltage generator 90b. The differential input part 90d is connected with the ground line VSS through the nMOS which is always on, and the differential input part 90e is connected with the ground line VSS through the nMOS which is turned on when the low power signal NAPX is inactivated.

In short, the differential input part 90d operates at all times, and the differential input part 90e operates only when the low power signal NAPX is inactivated. During the low power consumption mode, the differential input part 90e stops its operation so that the power consumption is reduced. The differential amplifier 90a activates the boost enable signal (to the high level) when the control voltage VPP2 is lower than the reference voltage VPREF.

The voltage generator 90b is constructed by connecting three resistors in series between the node for generating the boost voltage VPP and the ground line VSS. The control voltage VPP2 is outputted from the other terminal of the resistor on the side of the node for supplying the boost voltage VPP. With the two terminals of the resistor connected with the ground line VSS, there are individually connected the source and the drain of the nMOS which is controlled with the low power signal NAPX. The resistor connected with the ground line VSS is bypassed when the low power signal NAPX is activated. During the low power consumption mode, therefore, the level of the control voltage VPP2 drops.

Figure 29:
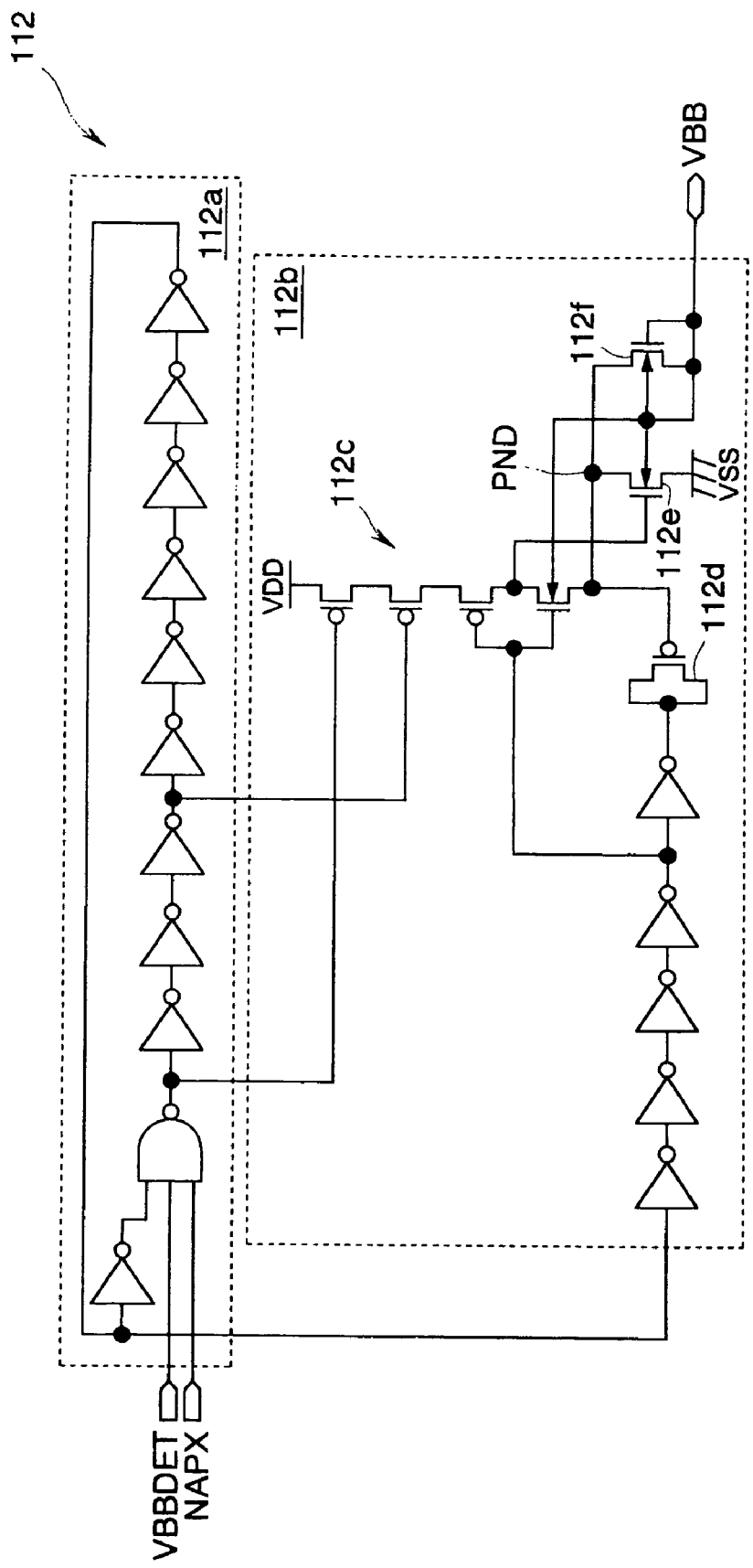
FIG. 29 is a circuit diagram showing the detail of a unit of the substrate voltage generator of FIG. 25.

FIG. 29 shows the detail of the unit 112 of the substrate voltage generator 100.

This unit 112 is provided with an oscillator 112a and a pumping circuit 112b.

The oscillator 112a is constructed as a ring oscillator composed of odd stages of logic gates. The oscillator 112a operates when the substrate voltage detection signal VBBDET is activated but when the low power signal NAPX is inactivated.

The pumping circuit 112b includes a voltage supplying part 112c having three pMOSes and one nMOS connected in series between the power supply line VDD and the pumping node PND, a capacitor 112d composed of a pMOS connected at its gate with the pumping node PND, an nMOS 112e for connecting the pumping node PND and the ground line VSS when the pumping node PND is at the high level, and a diode-connected nMOS 112f for connecting the pumping node PND and the substrate node VBB.

In the pumping circuit 112b, the pumping node PND interchangeably has the ground voltage and a negative voltage when the pMOSes and nMOS of the voltage supplying part 112c and the capacitor 112d receive the clock signal from the oscillator 112a. When the pumping node PND has a negative voltage, moreover, the electric charge of the substrate node VBB is pumped out to set the substrate node VBB to a negative voltage. The unit 112 stops its operation during the power consumption mode (while the low power signal NAPX is active).

Figure 30:
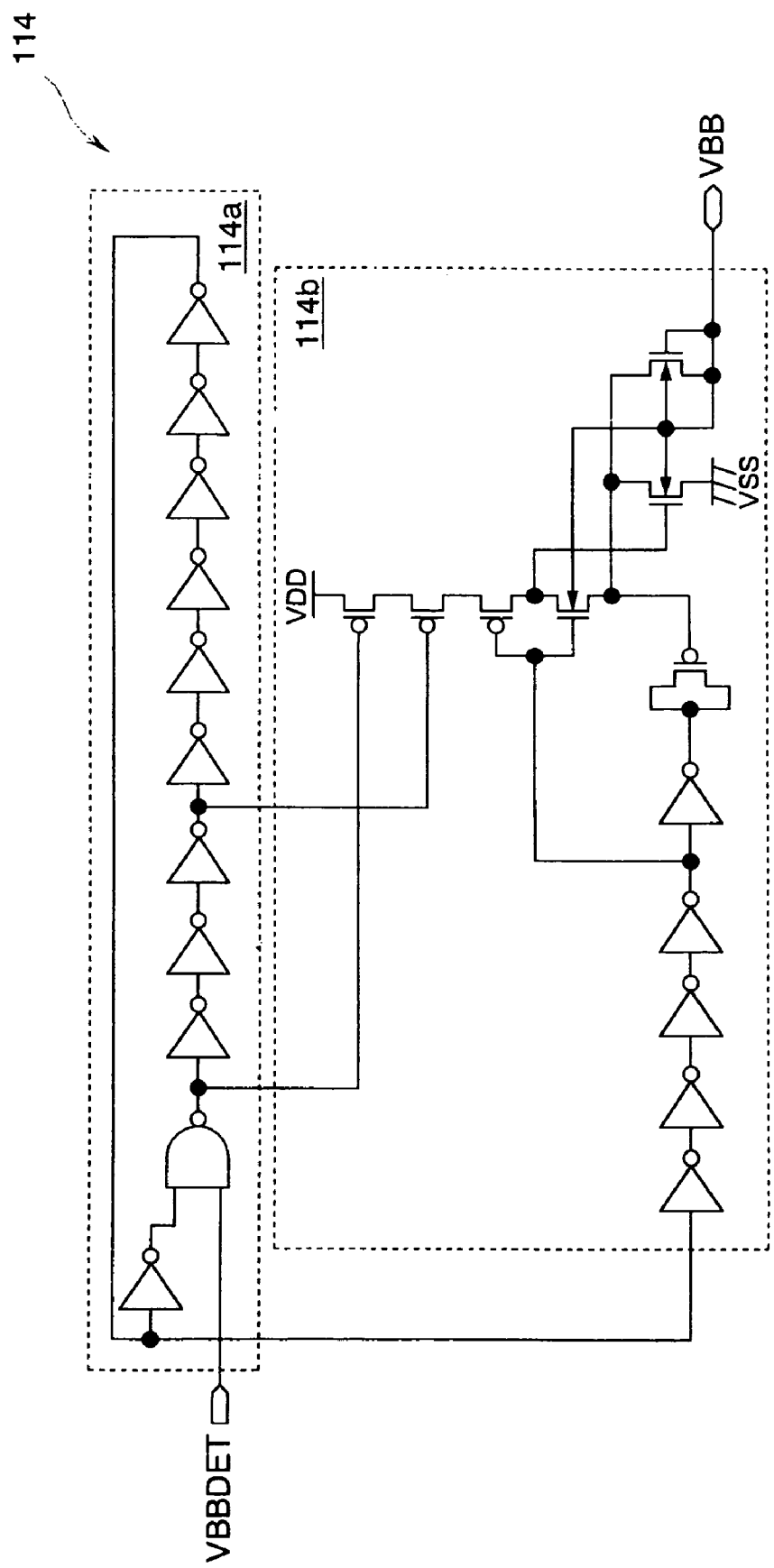
FIG. 30 is a circuit diagram showing the detail of the unit of the substrate voltage generator of FIG. 25.

FIG. 30 shows the detail of the unit 114 of the substrate voltage generator 100.

This unit 114 is provided with an oscillator 114a and a pumping circuit 114b.

The oscillator 114a is a circuit which is made by eliminating the logic of the low power signal NAPX from the oscillator 112a of the unit 112. In short, the oscillator 114a operates in response to the substrate voltage detection signal VBBDET even during the power consumption mode to generate the substrate voltage VBB. The pumping circuit 114b is a circuit identical to the pumping circuit 112b of the unit 112.

Figure 31:
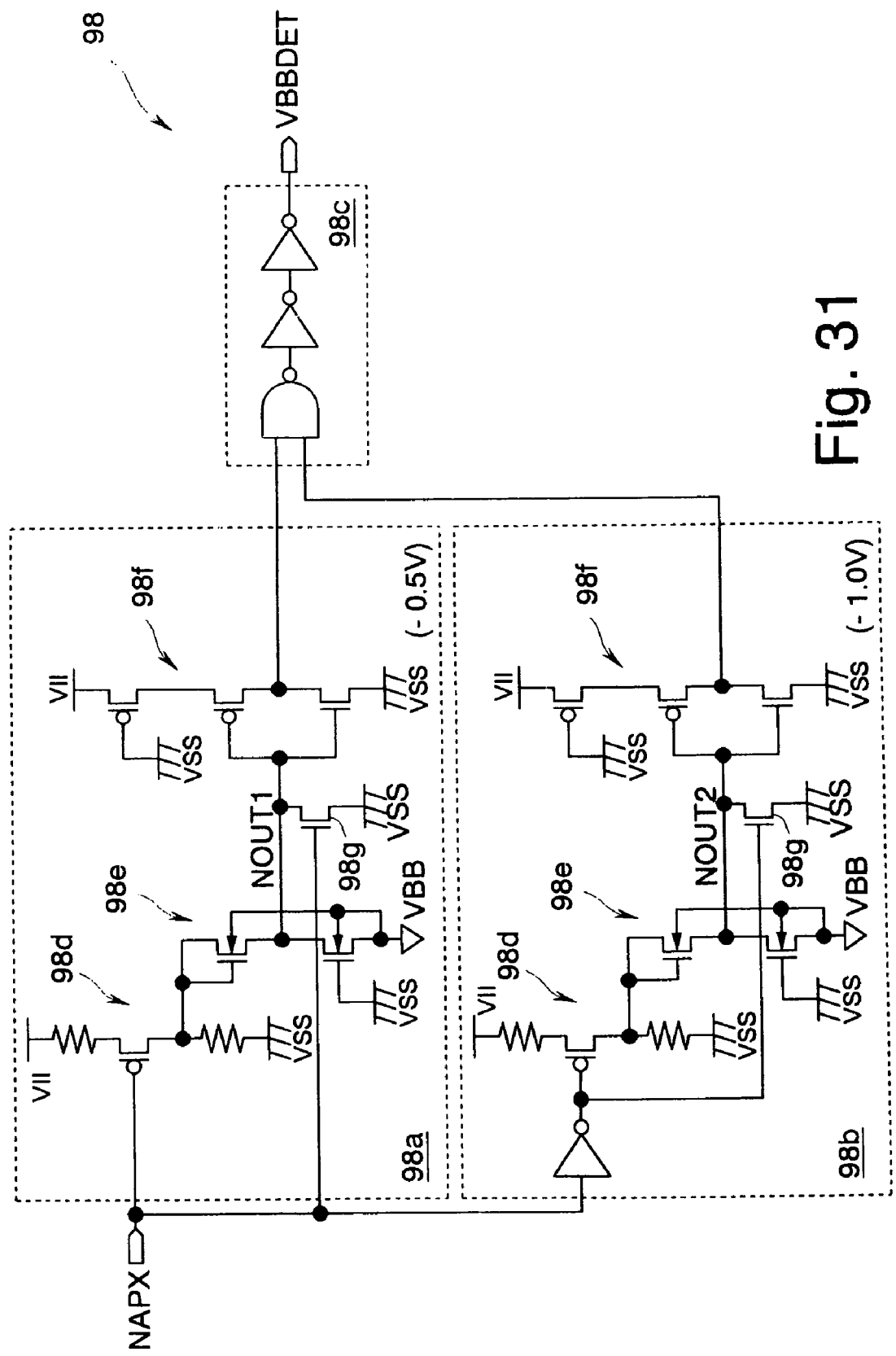
FIG. 31 is a circuit diagram showing the detail of the VBB detector of FIG. 22.

FIG. 31 shows the detail of the VBB detector 98.

This VBB detector 98 is provided with two detection units 98a and 98b, and an OR circuit 98c for outputting the OR logic of the detection results of those units 98a and 98b as the substrate voltage detection signal VBBDET.

The detection unit 98a includes: a reference voltage generating part 98d having a resistor; a pMOS and a resistor connected in series between the internal power supply line VII and the ground line VSS; a level detecting part 98e having two nMOSes connected in series; a CMOS inverter 98f having a pMOS connected with the power supply line VII through a pMOS load circuit; and an nMOS 98g for connecting the output node NOUT1 of the level detecting part 98f with the ground line VSS. The gate of the pMOS of the reference voltage generating part 98d and the gate of the nMOS 98g receive the low power signal NAPX. Therefore, the detection unit 98a is inactivated in the normal operation mode but is activated during the power consumption mode. The voltage of the output node NOUT1 of the level detecting part 98e rises, when activated, with the rise of the substrate voltage VBB. In this embodiment, the CMOS inverter 98f outputs the low level in response to the detection result (i.e., the voltage of the output node NOUT1) at the level detecting part 98d when the substrate voltage VBB is boosted to −0.5 V. The OR circuit 98c activates the substrate voltage detection signal VBBDET when it receives the low level from the CMOS inverter 98f.

In the detection unit 98b, the gate of the pMOS of the reference voltage generating part 98d and the gate of the nMOS 98g are supplied with the inverted logic of the low power signal NAPX. The remaining constructions are identical to those of the detection unit 98a. In this embodiment, the CMOS inverter 98f outputs the low level in response to the detection result at the level detecting part 98e (i.e., the voltage of the output node NOUT1) when the substrate voltage VBB rises to −1.0 V in the normal operation mode. The output of the reference voltage generating part 98d of the detection unit 98b has the ground voltage VSS (at 0 V) when the low power signal NAPX is at the low level (during the power consumption mode). Therefore, the output node NOUT2 of the level detecting part 98e has the low level at all times. In short, the detection unit 98b is inactivated during the power consumption mode.

Therefore, the VBB detector 98 uses only the detection unit 98b in the normal operation mode and activates the substrate voltage detection signal VBBDET when the substrate voltage VBB rises to −1.0 V. When the substrate voltage detection signal VBBDET is activated, the units 112 and 114 of the substrate voltage generating circuit 100, as shown in FIGS. 29 and 30, operate so that the substrate voltage VBB drops.

During the low power consumption mode, on the other hand, the VBB detector 98 activates the detection unit 98a but inactivates the detection unit 98b when the low power signal NAPX is activated. As a result, the power consumption of the VBB detector 98 is reduced. The level of the substrate voltage VBB is detected during the power consumption mode only by the detection unit 98a so that the substrate voltage detection signal VBBDET is activated when the substrate voltage VBB rises to −0.5 V. The detection level (in an absolute value) of the substrate voltage VBB becomes low so that the absolute value of the substrate voltage VBB to be generated by the substrate voltage generator 100 is reduced. In other words, the operation of the substrate voltage generator 100 is further suppressed during the power consumption mode than during the normal operation mode. As a result, the power consumption can be reduced. The difference between the substrate voltage VBB and the ground voltage VSS is decreased, thereby reducing the substrate leakage. Therefore, the occurrence frequency of the substrate voltage detection signal VBBDET is lowered to decrease the operation frequency of the substrate voltage generator 100. As a result, the power consumption can be further reduced.

Figure 32:
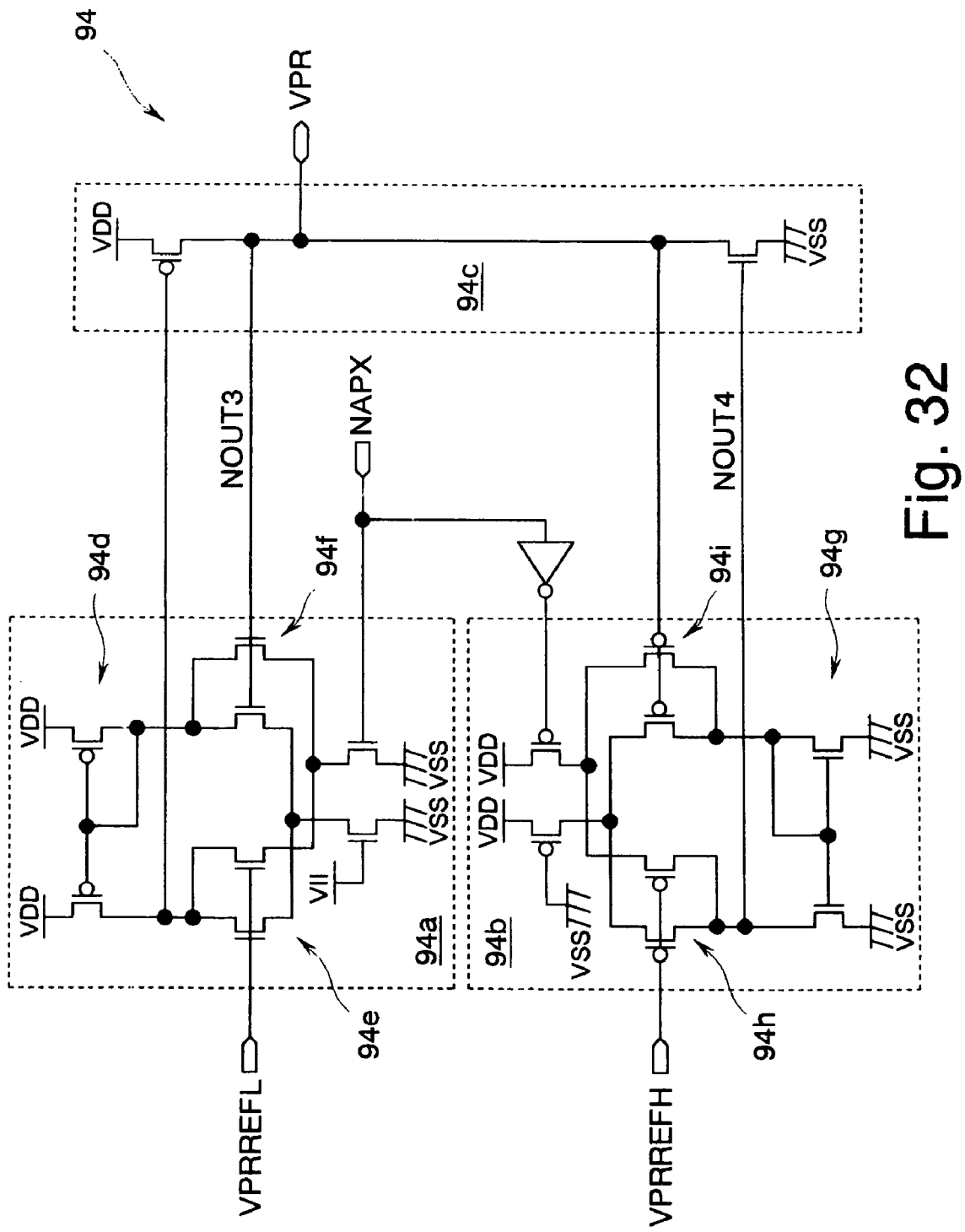
FIG. 32 is a circuit diagram showing the detail of a precharging voltage generator of FIG. 22.

FIG. 32 shows the detail of the precharging voltage generator 94.

This precharging voltage generator 94 is provided with differential amplifiers 94a and 94b and a VPR generator 94c.

The differential amplifier 94a has a current mirror part 94d composed of pMOSes, and a pair of differential input parts 94e and 94f composed of nMOSes. Both the inputs of the differential input parts 94e and 94f receive the reference voltage VPRREFL and the precharging voltage VPR. The differential input part 94e is connected with the ground line VSS through the always on nMOS, and the differential input part 94f is connected with the ground line VSS through the nMOS which is turned on when the low power signal NAPX is inactivated.

In short, the differential input part 94e operates at all times, but the differential input part 94f operates only when the low power signal NAPX is inactivated. The differential input part 94f stops its operation during the power consumption mode so that the power consumption is reduced. The differential amplifier 94a sets the output node NOUT3 to the low level when the reference voltage VPRREFL is higher than the precharging voltage VPR.

The differential amplifier 94b has a current mirror part 94g composed of nMOSes, and a pair of differential input parts 94h and 94i composed of pMOSes. Both the inputs of the differential input parts 94h and 94i receive the reference voltage VPRREFH and the precharging voltage VPR. The differential input part 94g is connected with the power supply line VDD through the always on pMOS, and the differential input part 94i is connected with the power supply line VDD through the pMOS which is turned on when the low power signal NAPX is inactivated.

The differential input part 94h operates at all times, but the differential input part 94i operates only when the low power signal NAPX is inactivated. During the low power consumption mode, the differential input part 94i stops its operation so that the power consumption is reduced. The differential amplifier 94b sets the output node NOUT4 to the low level when the reference voltage VPRREFH is lower than the precharging voltage VPR.

The VPR generator 94c has a pMOS and an nMOS connected in series between the power supply line VDD and the ground line VSS. The gate of the pMOS connects the output node NOUT3. The gate of the nMOS connects the output node NOUT4. From the drains of the pMOS and the nMOS, there is outputted the precharging voltage VPR. This precharging voltage VPR is used as the equalizing voltage of the paired bit lines and the plate voltage of the memory cells in the memory core 38.

The inactivation of the differential input parts 94f and 94i during the power consumption mode deteriorates the response of the precharging voltage generator 94 to a shift in the precharging voltage. As will be described hereinafter, however, the reading operation and the refreshing operation are not executed during the power consumption mode so that no problem arises even if the response of the precharging voltage generator 94 is lowered.

Figure 33:
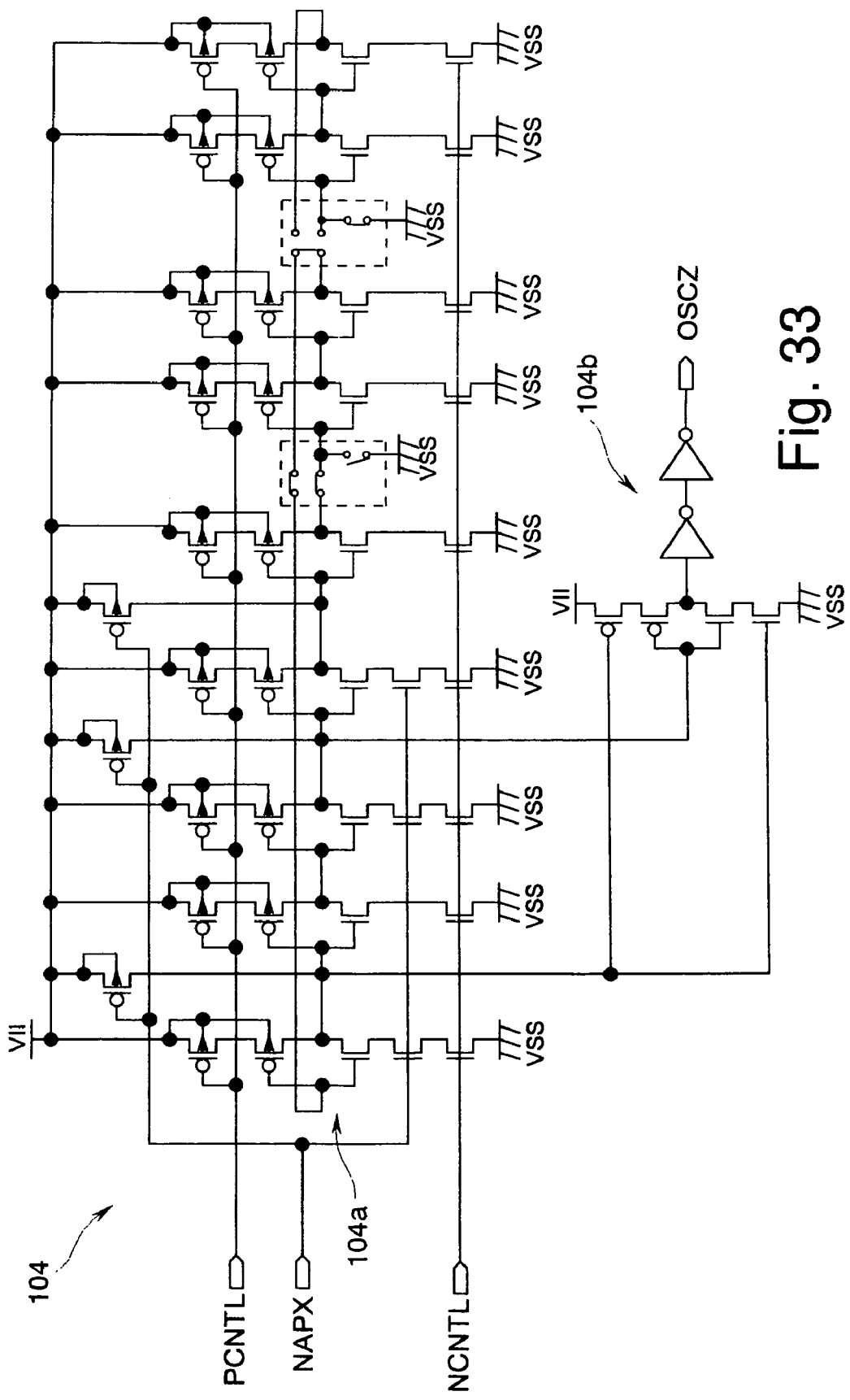
FIG. 33 is a circuit diagram showing the detail of an oscillator of FIG. 22.

FIG. 33 shows the detail of the oscillator 104.

This oscillator 104 is provided with a ring oscillator 104a having odd stages of CMOS inverters connected in cascade, and a buffer 104b for extracting an oscillating signal OSCZ from the ring oscillator 104a. Frames of broken lines in FIG. 33 are switches for adjusting the stage number (corresponding to the self-refreshing period) of the ring oscillator 104a. The on/off of these switches are set by the blow of the poly-silicon fuse or by the layout pattern of the photomask of the wiring layer. In this example, the stage number of the ring oscillator 104a is set to "7". The sources of the pMOSes and the nMOSes of the CMOS inverters are connected with the internal power supply line VII and the ground line VSS, respectively, through the pMOS loads and the nMOS loads. The gates of the pMOS loads and the nMOS loads are controlled with the control voltages PCNTL and NCNTL, respectively. The oscillator 104 has pMOSes and nMOSes for receiving the control of the low power signal NAPX. When the low power signal NAPX is activated, those pMOSes are turned on to fix the predetermined node of the ring oscillator 104a to the high level, but the connections between the nMOSes of the CMOS inverters and the ground line VSS are broken when those nMOSes are turned off. As a result, the oscillator 104 stops its operation during the power consumption mode.

Figure 34:
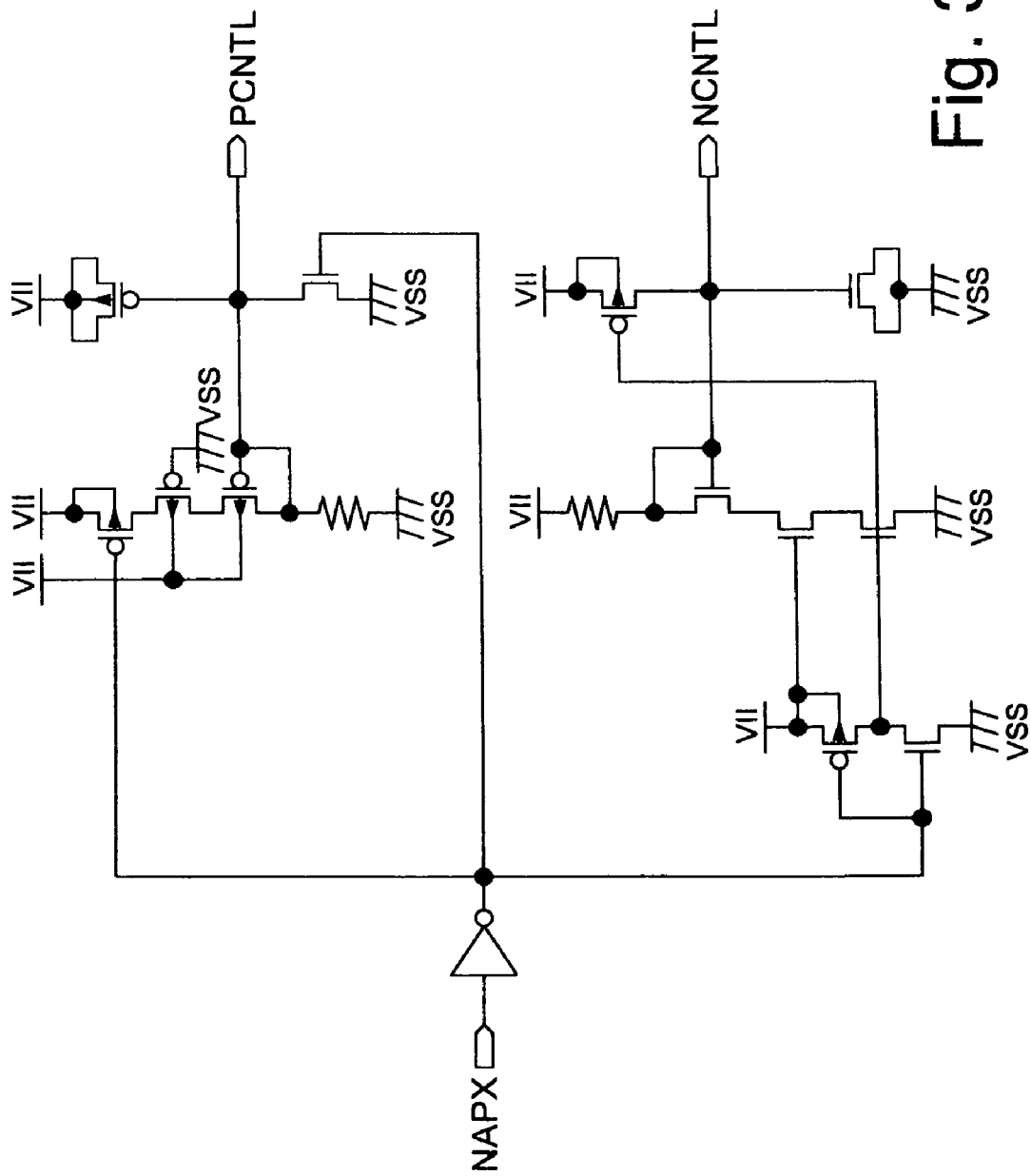
FIG. 34 is a circuit diagram showing the detail of a generator of FIG. 23.

FIG. 34 shows a generator 116 formed in the oscillator 104 for generating the control voltages PCNTL and NCNTL.

This generator 116 is provided with: a pMOS, a pMOS diode and a resistor connected in series between the internal power supply line VII and the ground line VSS; a resistor, an nMOS diode and an nMOS connected in series between the internal power supply line VII and the ground line VSS; a MOS capacitor arranged between a node for generating the control voltage PCNTL and the internal power supply line VII; and a MOS capacitor arranged between a node for generating the control voltage NCNTL and the ground line VSS.

The control voltage PCNTL is generated from the connection node between the pMOS diode and the resistor, and varies with the shift of the internal power supply voltage VII. The control voltage NCNTL is generated from the connection node between the nMOS diode and the resistor, and varies with the shift of the ground voltage VSS. Therefore, the gate-to-source voltage of the pMOS and the nMOS of the CMOS inverter shown in FIG. 33 is always constant so that the oscillation period of the ring oscillator 104a is constant irrespective of the shift of the internal power supply voltage VII. The MOS capacitor prevents the high-frequency noises to occur on the internal power supply line VII and the ground line VSS from influencing the control voltage PCNTL and the control voltage NCNTL. As a result, the shifts of the internal power supply voltage VII and the ground voltage VSS are canceled so that the oscillating signal OSCZ is generated always for a predetermined period while the oscillating circuit 104 is active (in the self-refreshing mode).

The pMOS and the nMOS are turned off when the low power signal NAPX is active. In other words, the generator 116 is inactivated during the power consumption mode. At this time, the control voltages PCNTL and NCNTL turns to the low level and the high level, respectively.

In the DRAM thus far described, like the first embodiment, the low power entry circuit 84 shown in FIG. 22 activates the low power signal NAPX (to the low level) to enter the chip to the low power consumption mode when it receives the chip enable signal CE2 at the low level from the exterior.

When the low power signal NAPX is activated, the reference voltage generator 24 shown in FIG. 23 lowers the levels of the reference voltages VRFV, VPREF, VPREFL and VPREFH. The VPP detector 90 shown in FIG. 28 inactivates the differential input part 90e and simultaneously lowers the level of the control voltage VPP2 to be supplied to the differential input part 90d. The unit 108 of the booster 92, as shown in FIG. 25, and the unit 112 of the substrate voltage generator 100 stop their operations. The VBB detector 98 shown in FIG. 31 inactivates the detection unit 98b but activates the detection unit 98a to raise the detection level of the substrate voltage VBB. Specifically, the substrate voltage detection signal VBBDET is activated when the substrate voltage VBB rises to −0.5 V. The differential amplifiers 94*a* and 94*b* of the precharging voltage generator 94 shown in FIG. 32 inactivate the differential input parts 94*f* and 94*i*, respectively. The oscillator 104 shown in FIG. 33 stops its operation. The generator 116 shown in FIG. 34 is inactivated.

Figure 35:
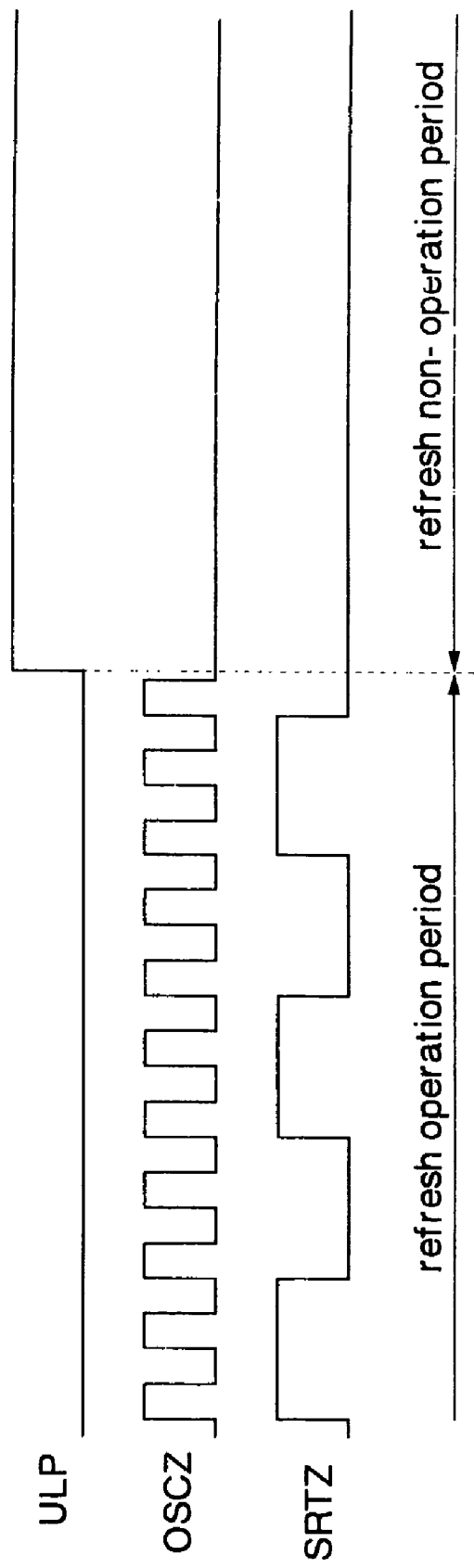
FIG. 35 is a timing chart showing the operations of the oscillator and a frequency divider in the seventh embodiment.

FIG. 35 shows the operations of the oscillator 104 and the frequency divider 102.

When the low power signal NAPX is activated, the oscillator 104 sets the oscillating signal OSCZ to the low level. Since the oscillating signal OSCZ stops its oscillation, the frequency division by the frequency divider 102 stops so that the self-refreshing timer signal SRTZ turns to the low level. Therefore, the power consumption of the frequency divider 102 is substantially zero.

Thus, the plurality of control circuits suspends their operations or lower detection capability of signal level, thereby substantially reducing the power consumption during the low power consumption mode, compared to the conventional art. Some of the control circuits continue their operations in the low detection state so that the normal operation can be started immediately after the release from the low power consumption mode.

In this embodiment, the oscillator 104 for self-refresh is stopped during the power consumption mode to stop operations performed in the self-refreshing mode, as has been described above. As a result, the power consumption during the power consumption mode can be reduced.

Since the refreshing operation is not executed, the internal voltage generator 86 may be operated with a power enough to compensate the electric power (the leakage current) to be consumed by the peripheral circuit 40. As a result, the power consumption during the power consumption mode can be reduced.

The internal voltages VPP, VBB and VPR are supplied to the internal circuit (including the peripheral circuit 40, the memory core 38, and the like) even during the power consumption mode. Therefore, the peripheral circuit 40, the memory core 38, and the like can be operated just after the release from the low power consumption mode.

During the low power consumption mode, the operations of the unit 108 of the booster 92 and the unit 112 of the substrate voltage generator 100 are stopped so that the power consumption during the power consumption mode can be further reduced.

During the low power consumption mode, the connection between the internal power supply line VII and the stabilized capacitor 96*a* is kept, and the connection between the internal power supply line VII and the internal circuit (the peripheral circuit 40 and the memory core 38) is broken. The power supply to the peripheral circuit 40 is stopped so that the leakage current to the peripheral circuit 40 can disappear to reduce the power consumption to zero. When the internal power supply line VII and the internal circuit are connected after the release from the low power consumption mode, the voltage corresponding to the electric charge stored in the stabilized capacitor 96*a* is supplied to the internal circuit through the internal power supply line VII. Before the internal supply voltage generator 96 generates a predetermined internal power supply voltage VII after the release from the low power consumption mode, therefore, the voltage corresponding to the electric charge stored in the stabilized capacitor 96*a* can be applied to the internal circuit. As a result, the internal circuit can operate immediately after the release from the low power consumption mode.

During the low power consumption mode, the differential input part 90*e* in the differential amplifier 90*a* of the VPP detector 90 and the differential input parts 94*f* and 94*i* in the differential amplifiers 94*a* and 94*b* of the precharging voltage generator 94 are inactivated so that the power consumption of the differential amplifiers 90*a*, 94*a*, and 94*b* can be reduced.

During the low power consumption mode, the operations of the unit 108 of the booster 92 and the unit 112 of the substrate voltage generator 100 are stopped, so that the transient dispersions of the boost voltage VPP and the substrate voltage VBB are suppressed. In other words, the difference between the maximum and the minimum of the boost voltage VPP and the substrate voltage VBB can be decreased to reduce the leakage current.

By lowering the levels of the reference voltages VPREF, VRFV (VII), VPRREFH and VPRREFL to be generated by the reference voltage generator 24, the absolute values of the detection levels of the VPP detector 90, the VBB detector 98 and the precharging voltage generator 94 are reduced, and the levels (in absolute values) of the boost voltage VPP, the substrate voltage VBB and the precharging voltage VPR to be generated by the precharging voltage generator 94 are reduced. Since the voltages are lowered, the leakage current can be reduced to lower the power consumption.

In the embodiment described above, the present invention is applied to the DRAM. However, the present invention is not limited to this embodiment. For example, the present invention may be applied to a semiconductor memory such as SDRAMs (Synchronous DRAMs), DDR SDRAMs (Double Data Rate SDRAMs), or FCRAMs (Fast Cycle RAMs).

A semiconductor fabrication process to which the present invention is applied is not restricted to the CMOS process, but it may well be a Bi-CMOS process.

The foregoing second embodiment has been described on an example in which the low power entry circuit 50 is formed by connecting the plurality of delay circuits 54*c* in series. However, the present invention should not be limited thereto but may form the low power entry circuit by using a latch circuit to be controlled by the STTCRX signal, for example. In this modification, the circuit scale is reduced.

The foregoing third embodiment has been described on the example using the dedicated low power consumption mode signal /LP. This DRAM can be supplied even to the user requiring no low power consumption mode, for example, by pulling up the /LP signal on the chip and providing no terminal for the /LP signal. This /LP signal may be connected with the power supply voltage VDD by bonding or blowing the fuse. Alternatively, the /LP signal may be connected with the power supply voltage VDD by selecting photo masks of a wiring layer.

The foregoing fifth embodiment has been described on an example of the comparison between the boost voltage VPP and the power supply voltage VDD. However, the present invention is not limited to this embodiment, for example, the boost voltage VPP may well be compared with the reference voltage VREF which is generated by stepping down the power supply voltage VDD.

The foregoing sixth embodiment has been described on an example of operating the start signal generator 82 as a timer for determining the length of the period T2 at the exit from the low power consumption mode and activating a STTPZ signal (reset signal) for initializing an internal circuit during the period T2. The present invention is not limited to this embodiment. For example, at the time of the exit from the low power consumption mode, a counter operating in normal operation is operated as a timer so as to count a predetermined number. The reset signal for initializing an internal circuit may well be activated during a period where the counter counts the number. A refresh counter indicating the refresh address of memory cells or the like can be used as the counter.

The invention is not limited to the above embodiments and various modifications may be made without departing from the spirit and the scope of the invention. Any improvement may be made in part or all of the components.

What is claimed is:

1. A method of operating a semiconductor memory including dynamic memory cells, comprising:
    entering a low power consumption mode, in which the dynamic memory cells do not retain data therein by prohibiting refresh operations while a power supply voltage is supplied to the semiconductor memory, in response to a single external control signal supplied from an outside via an external control terminal,
    wherein the power supply voltage continues to be supplied to the semiconductor memory during the low power consumption mode, and
    wherein the semiconductor memory includes a booster, a precharging voltage generator and a substrate voltage generator.

2. The method of operating a semiconductor memory according to claim 1, wherein the semiconductor memory enters the low power consumption mode in response to a voltage change of the single external control signal from a first voltage to a second voltage.

3. The method of operating a semiconductor memory according to claim 2, wherein the low power consumption mode is maintained while the single external control signal keeps the second voltage.

4. The method of operating a semiconductor memory according to claim 2, wherein the semiconductor memory exits the low power consumption mode in response to a reverse voltage change of the single external control signal from the second voltage to the first voltage.

5. A method of controlling a semiconductor memory including dynamic memory cells, comprising:
    outputting a single control signal to an external control terminal of the semiconductor memory so that the semiconductor memory enters a low power consumption mode, in which the dynamic memory cells do not retain data therein by prohibiting refresh operations while a power supply voltage is supplied to the semiconductor memory,
    wherein the power supply voltage continues to be supplied to the semiconductor memory during the low power consumption mode, and
    wherein the semiconductor memory includes a booster, a precharging voltage generator and a substrate voltage generator.

6. The method of controlling the semiconductor memory according to claim 5, further including:
    changing a voltage of the single control signal from a first voltage to a second voltage when outputting the single control signal.

7. The method of controlling the semiconductor memory according to claim 6, further comprising:
    keeping the voltage of the single control signal at the second voltage to maintain the low power consumption mode of the semiconductor memory.

8. The method of controlling the semiconductor memory according to claim 6, further comprising:
    changing the voltage of the single control signal from the second voltage to the first voltage so that the semiconductor memory exits the low power consumption mode.

9. A memory system comprising:
    a first memory including dynamic memory cells, having a low power consumption mode and a data terminal, the low power consumption mode being a mode in which the dynamic memory cells do not retain data therein by prohibiting refresh operations while a power supply voltage is supplied to the first memory, and the mode entered in response to a single external control signal supplied from an outside via an external control terminal; and
    a second memory including flash memory cells, having a data terminal which is connected with the data terminal of the first memory,
    wherein the power supply voltage continues to be supplied to the first memory during the low power consumption mode, and
    wherein the first memory includes a booster, a precharging voltage generator and a substrate voltage generator.

10. The memory system according to claim 9, wherein data stored in the dynamic memory cells in the first memory is transferred to the flash memory cells in the second memory before the first memory enters the low power consumption mode.

11. The memory system according to claim 9, wherein data stored in the flash memory cells in the second memory is transferred to the dynamic memory cells in the first memory after the first memory exits the low power consumption mode.

12. A cellular phone having a service state and a waiting state, comprising:
    a first memory including dynamic memory cells, having a low power consumption mode, a data terminal, and an external control terminal, the low power consumption mode being a mode in which the dynamic memory cells do not retain data therein while a power supply voltage is supplied to the first memory by prohibiting refresh operations, and the external control terminal being for receiving a single external control signal; and
    a second memory including flash memory cells, having a data terminal which is connected with the data terminal of the first memory,
    wherein data stored in the dynamic memory cells in the first memory is transferred to the flash memory cells in the second memory then the first memory enters the low power consumption mode in response to the single external control signal upon shifting from the service state to the waiting state,
    wherein the first memory exits the low power consumption mode in response to the single external control signal, and then data stored in the flash memory cells in the second memory is transferred to the dynamic memory cells in the first memory upon shifting from the waiting state to the service state,
    wherein the power supply voltage continues to be supplied to the first memory during the low power consumption mode, and
    wherein the first memory includes a booster, a precharging voltage generator and a substrate voltage generator.

13. A method of controlling a first memory including dynamic memory cells, having a low power consumption mode, a first data terminal, and an external control terminal, the low power consumption mode being a mode in which the dynamic memory cells do not retain data therein by prohibiting refresh operations while a power supply voltage is supplied to first memory, and the external control terminal being for receiving a single external control signal, and a second memory including flash memory cells and a second data terminal connected with the first data terminal of the first memory, comprising:

transferring data stored in the dynamic memory cells in the first memory to the flash memory cells in the second memory via the first and second data terminals before the first memory enters the low power consumption mode in response to the single external control signal; and transferring data stored in the flash memory cells in the second memory to the dynamic memory cells in the first memory via the second and first data terminals after the first memory exits the low power consumption mode in response to the single external control signal, wherein the power supply voltage continues to be supplied to the first memory during the low power consumption mode, and wherein the first memory includes a booster, a precharging voltage generator and a substrate voltage generator.

* * * * *